(12) United States Patent
Koizumi et al.

(10) Patent No.: US 8,671,557 B2
(45) Date of Patent: Mar. 18, 2014

(54) TRAY IN COMBINATION WITH ELECTRONIC COMPONENT ATTACHING TOOL ATTACHED TO THE TRAY

(75) Inventors: Daisuke Koizumi, Kawasaki (JP);
Shigeyuki Maruyama, Kawasaki (JP);
Kazuhiro Tashiro, Kawasaki (JP);
Naoyuki Watanabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 194 days.

(21) Appl. No.: 13/242,647

(22) Filed: Sep. 23, 2011

(65) Prior Publication Data

US 2012/0005883 A1 Jan. 12, 2012

Related U.S. Application Data

(62) Division of application No. 12/104,038, filed on Apr. 16, 2008, now Pat. No. 8,051,554, which is a division of application No. 11/126,246, filed on May 11, 2005, now Pat. No. 7,430,798, which is a division of application No. 10/655,030, filed on Sep. 5, 2003, now Pat. No. 6,924,174.

(30) Foreign Application Priority Data

Sep. 19, 2002 (JP) .................. 2002-273676

(51) Int. Cl.
*B23P 19/00* (2006.01)
(52) U.S. Cl.
USPC .................. 29/740; 29/739; 29/741; 206/725
(58) Field of Classification Search
USPC ............ 29/729, 739, 740–742; 206/725–728, 206/563; 361/809–810
See application file for complete search history.

(56) References Cited

U.S. PATENT DOCUMENTS

| | | | |
|---|---|---|---|
| 3,538,580 A | 11/1970 | Bruner | |
| 4,461,073 A | 7/1984 | Harringer et al. | |
| 5,103,976 A * | 4/1992 | Murphy | 206/719 |

(Continued)

FOREIGN PATENT DOCUMENTS

| | | |
|---|---|---|
| JP | 3007148 U | 11/1994 |
| JP | 10-097887 A | 4/1998 |
| JP | 2001-264383 A | 9/2001 |

OTHER PUBLICATIONS

Korean Office Action dated May 26, 2009, issued in corresponding Korean patent Application No. 10-2003-0064903.

*Primary Examiner* — Minh Trinh
(74) *Attorney, Agent, or Firm* — Westerman, Hattori, Daniels & Adrian, LLP

(57) ABSTRACT

A tray is provided in combination with an electronic component attaching tool attached to the tray and includes an attachment depression part that includes an inner wall and to which an electronic component is attached, wherein forming of the inner wall of the attachment depression part does not substantially depend on an external shape of the electronic component, and a standard part formed in the inner wall of the attachment depression part and engaging with a first structure part of the electronic component attaching tool to align a position of the electronic component attaching tool to the standard part when a position of the electronic component is aligned to a first position of the tray using the electronic component attaching tool, the standard part having a shape which does not substantially depend on the external shape of the electronic component.

3 Claims, 50 Drawing Sheets

(56) References Cited

U.S. PATENT DOCUMENTS

| | | | |
|---|---|---|---|
| 5,263,583 A * | 11/1993 | Ohashi .......................... 206/725 |
| 5,335,771 A * | 8/1994 | Murphy ......................... 206/725 |
| 5,352,130 A | 10/1994 | Nagumo |
| 5,400,904 A * | 3/1995 | Maston et al. ................. 206/725 |
| 5,481,438 A * | 1/1996 | Nemoto ......................... 361/810 |
| 5,500,605 A | 3/1996 | Chang |
| 5,870,820 A | 2/1999 | Arakawa et al. |
| 6,539,622 B2 | 4/2003 | Hidese et al. |
| 6,710,612 B2 | 3/2004 | Farnworth et al. |
| 6,769,469 B2 | 8/2004 | Yamada |
| 6,842,974 B1 | 1/2005 | Maenishi et al. |
| 6,904,671 B1 | 6/2005 | Farrens et al. |
| 6,924,174 B2 | 8/2005 | Koizumi et al. |
| 7,430,798 B2 | 10/2008 | Koizumi et al. |
| 7,477,063 B1 | 1/2009 | Wu |
| 8,051,554 B2 * | 11/2011 | Koizumi et al. ................ 29/740 |

\* cited by examiner

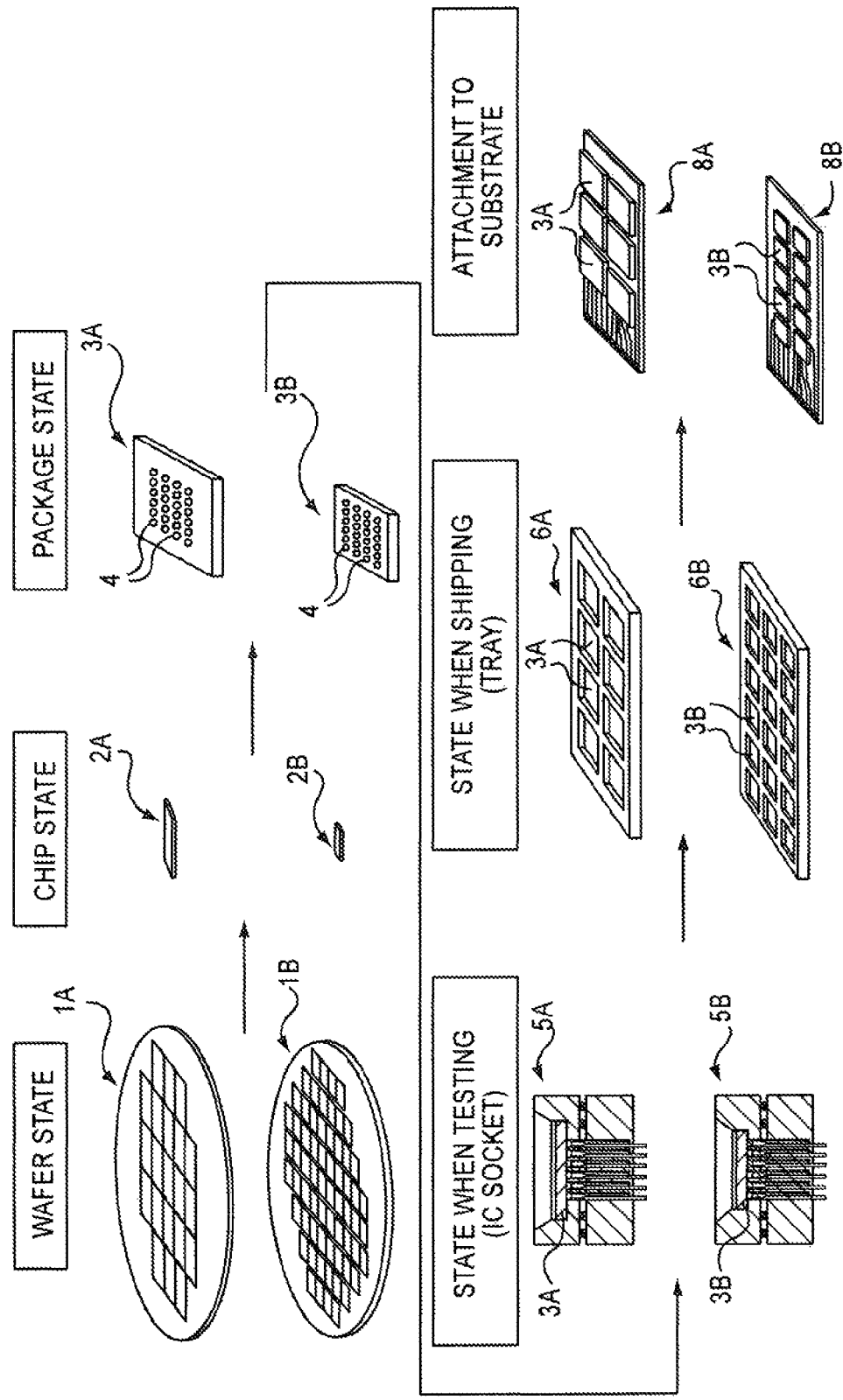

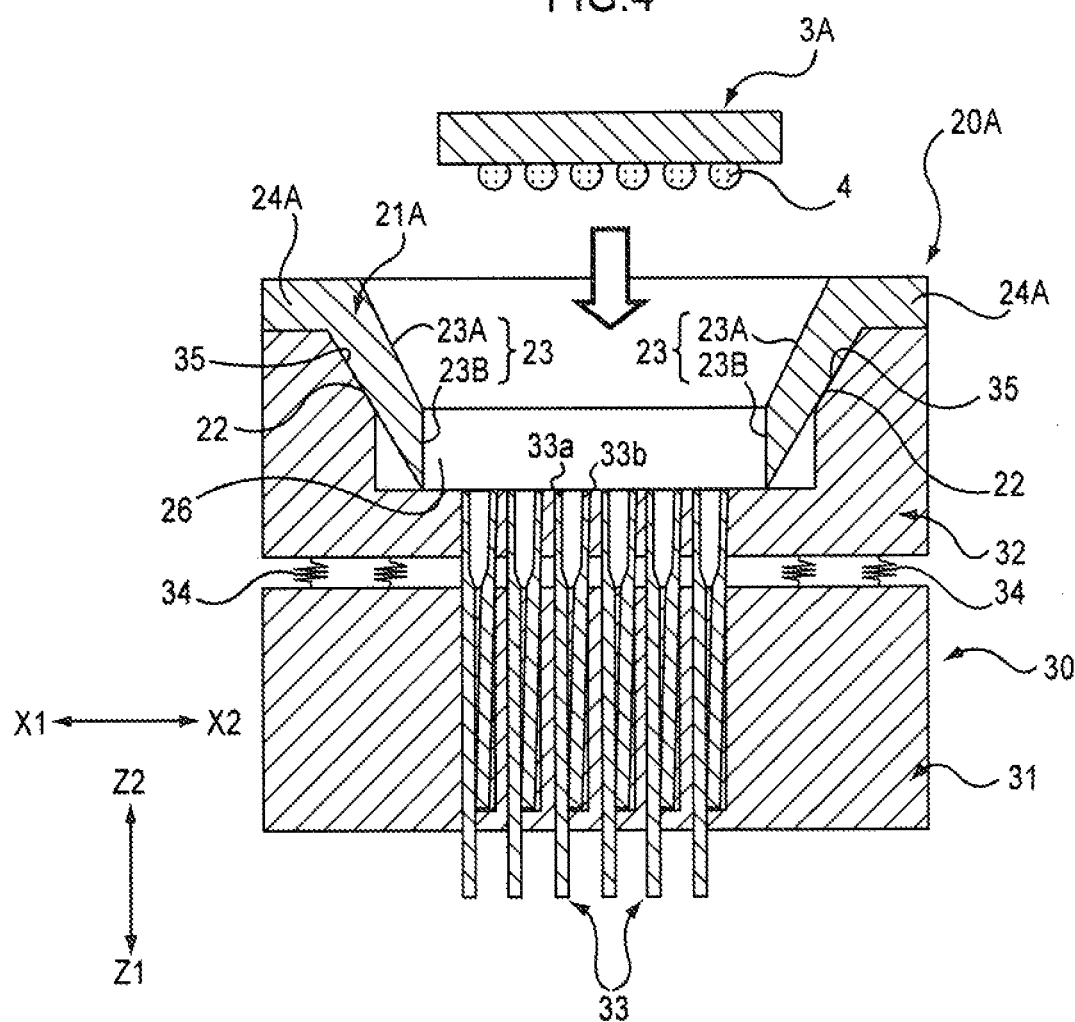

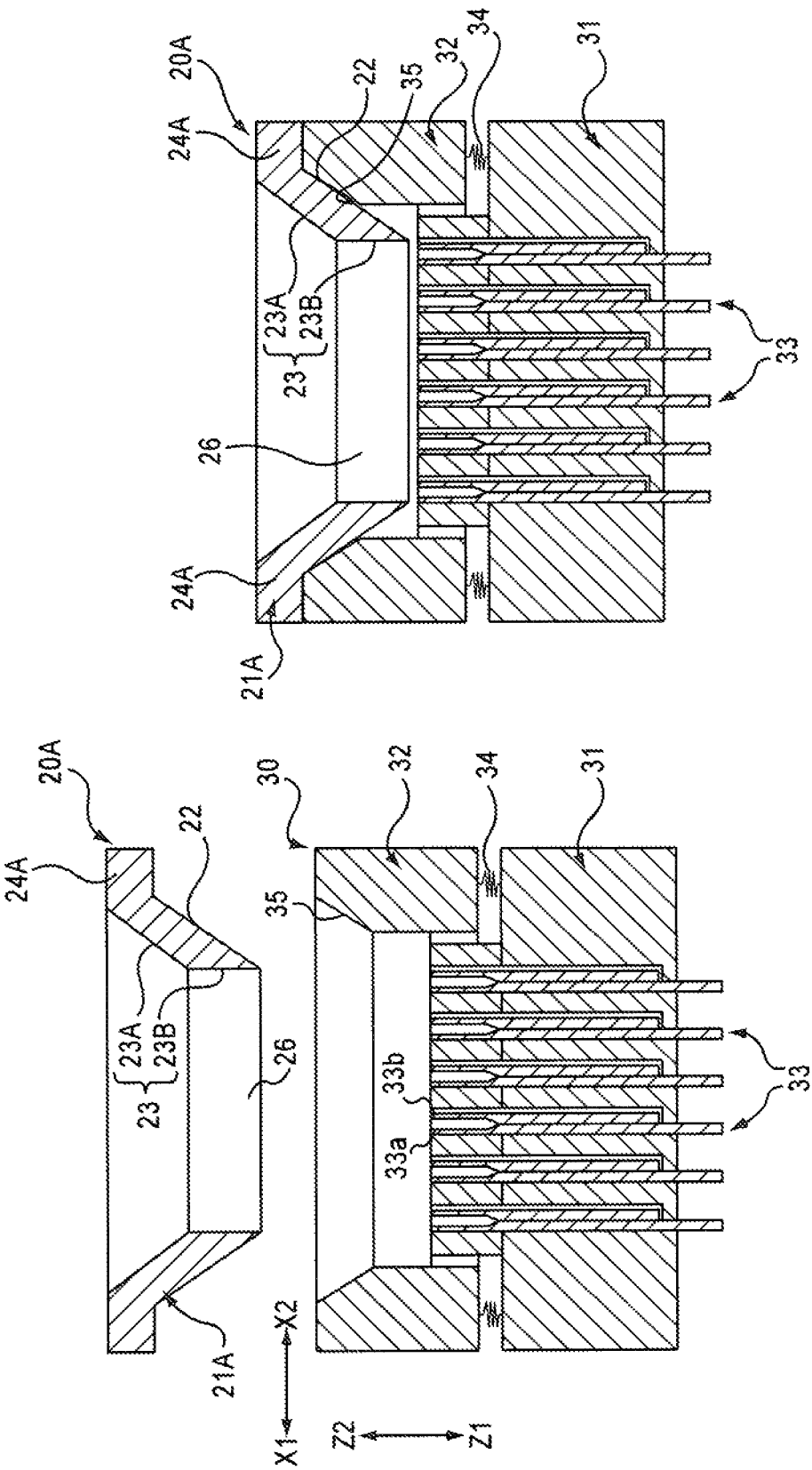

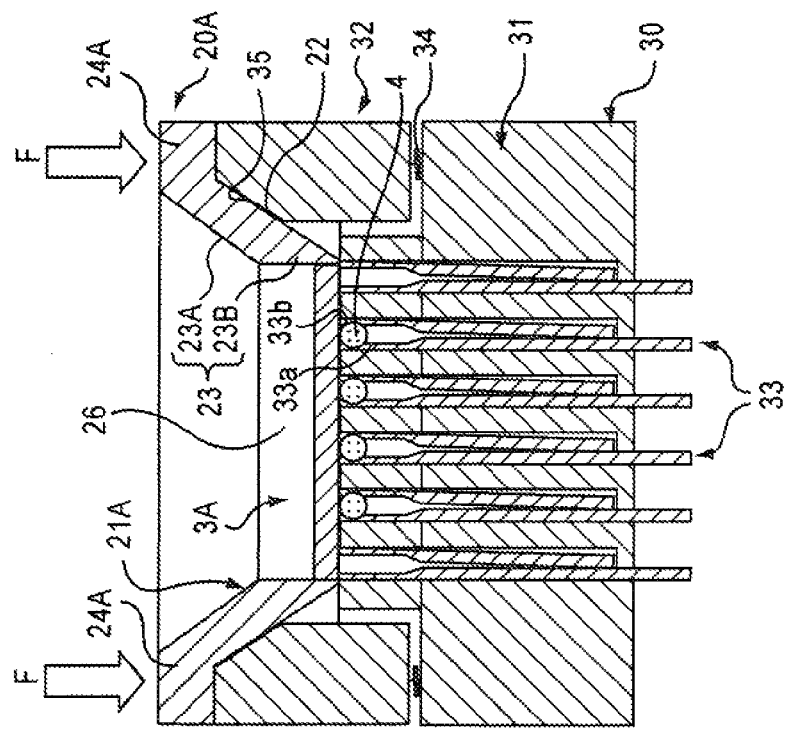
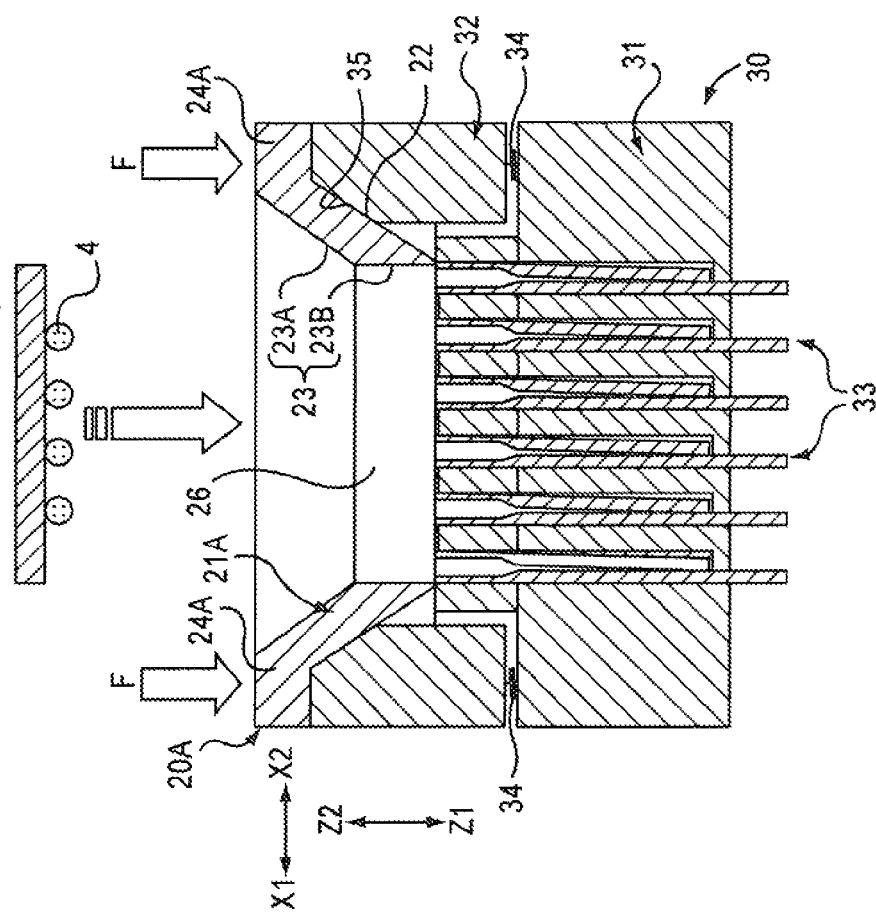

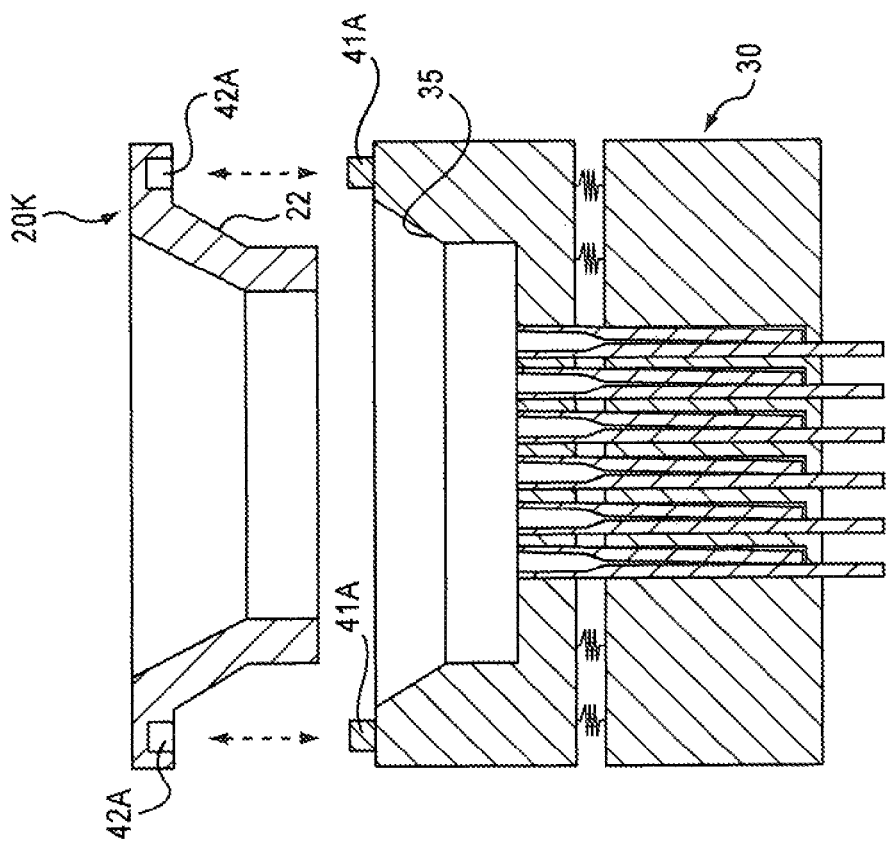
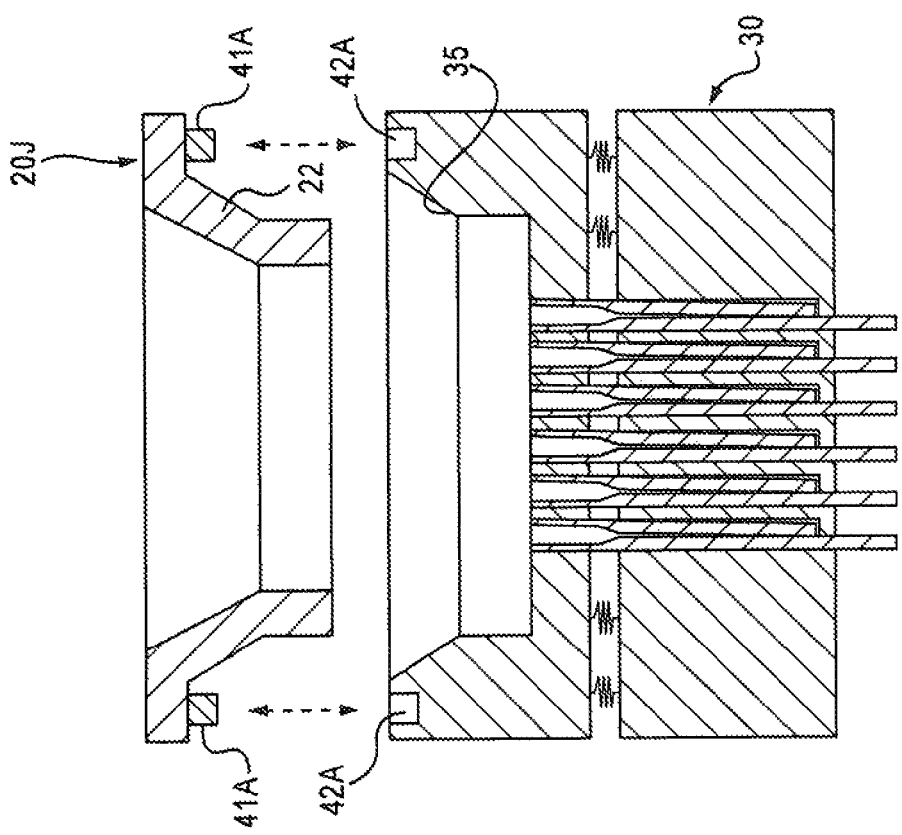

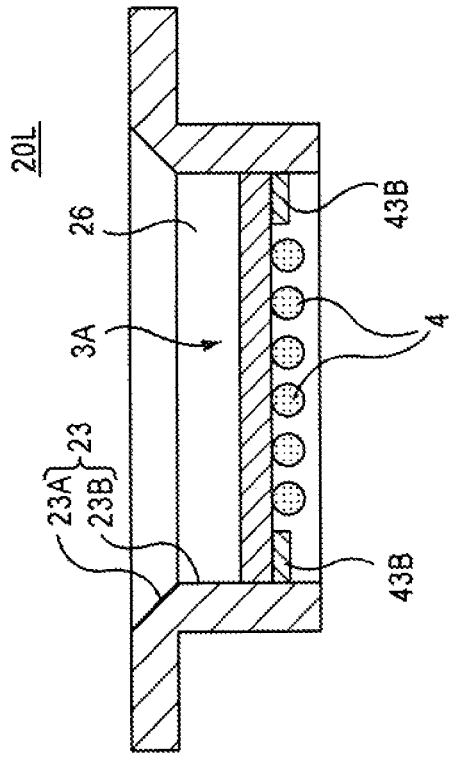
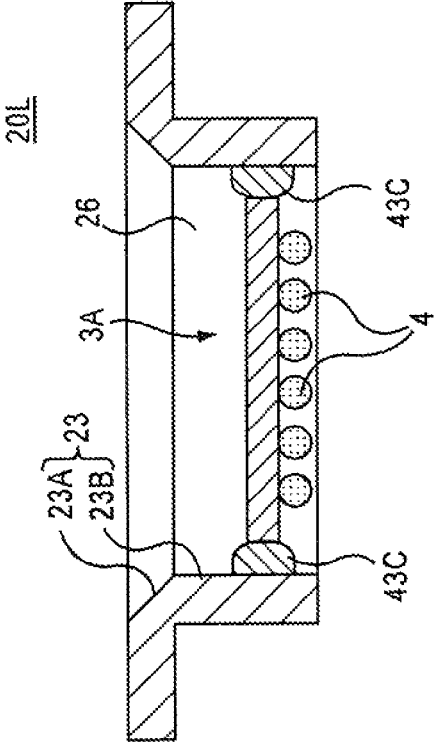
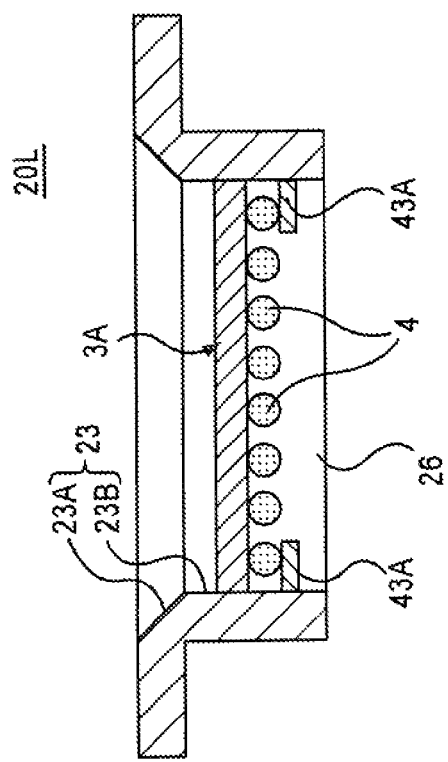

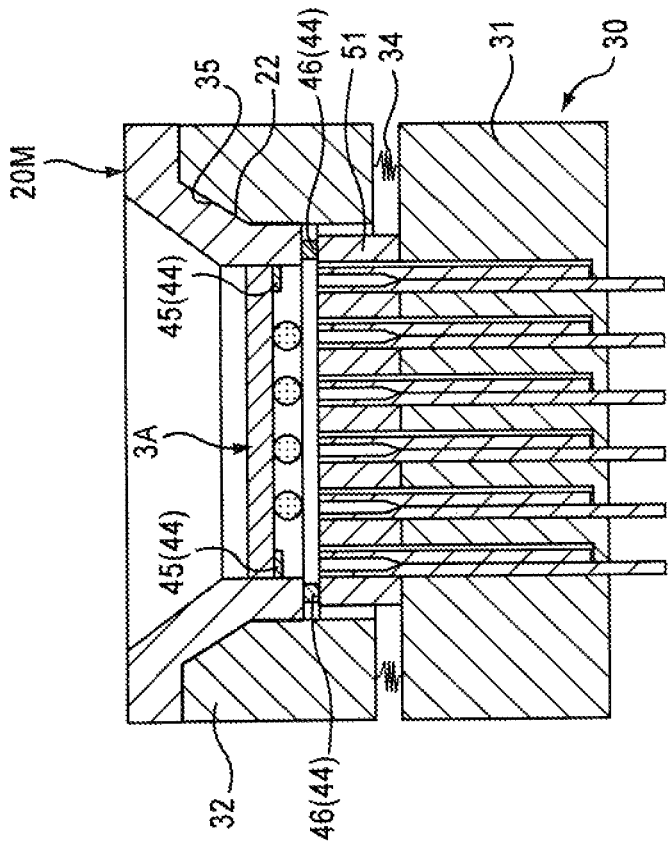
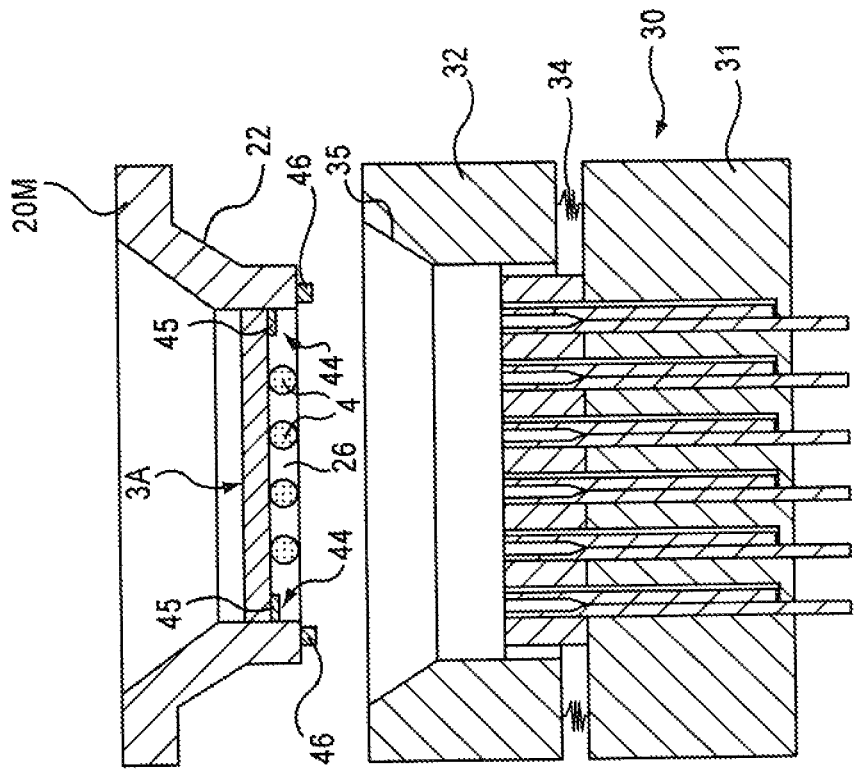
FIG. 26A
FIG. 26B

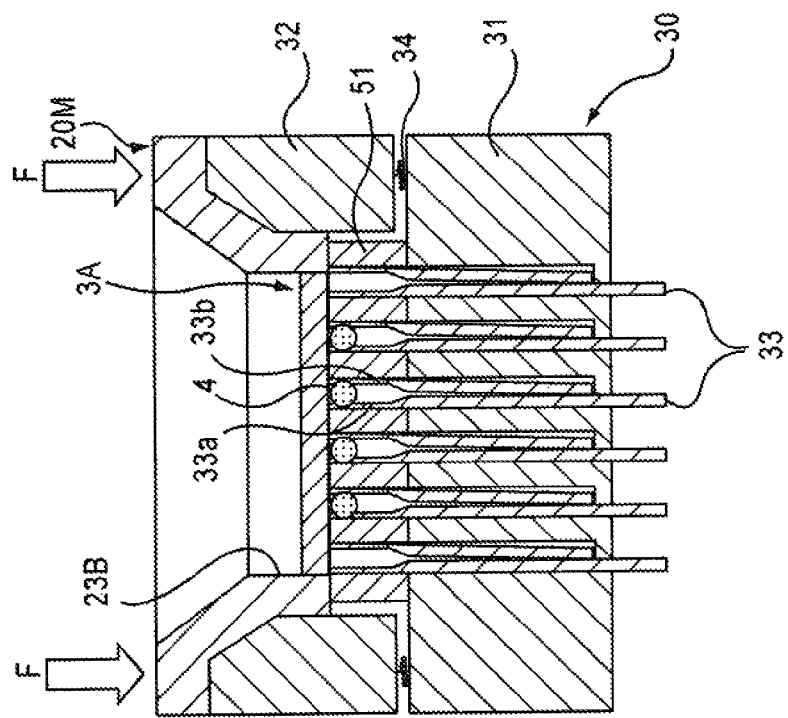
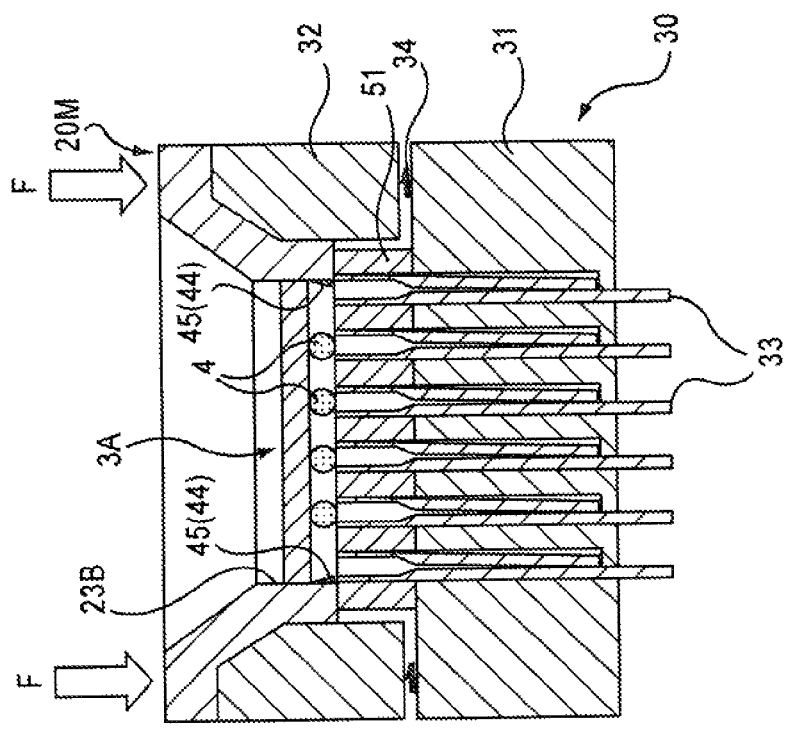

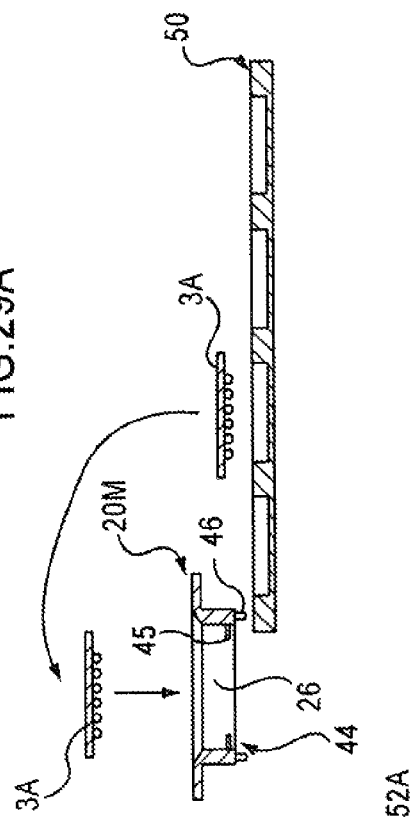
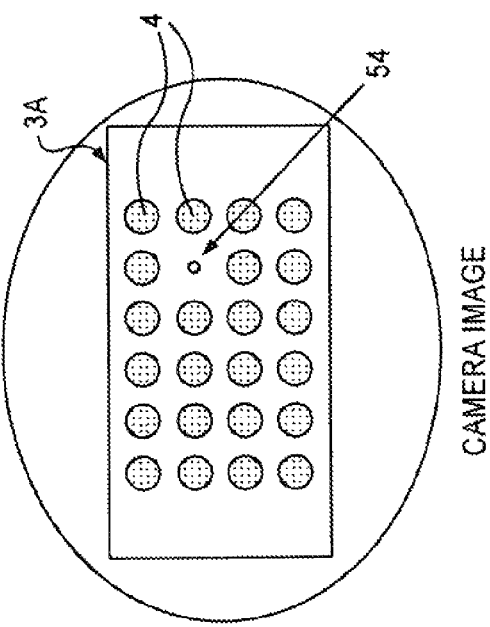
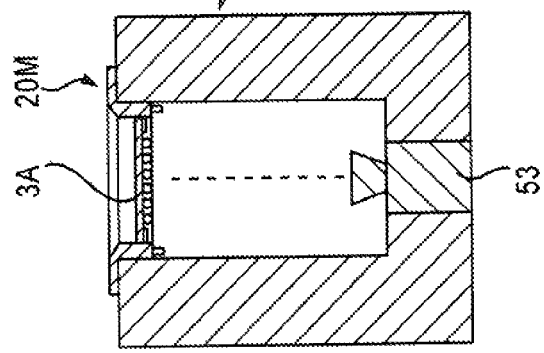
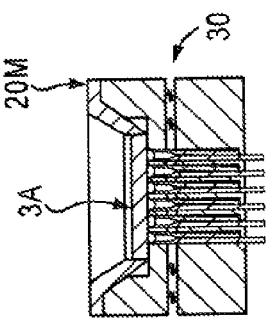

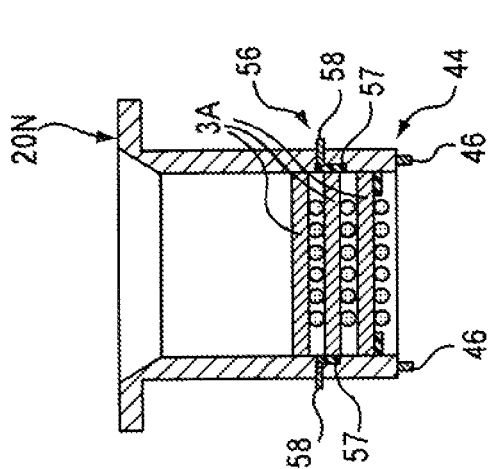
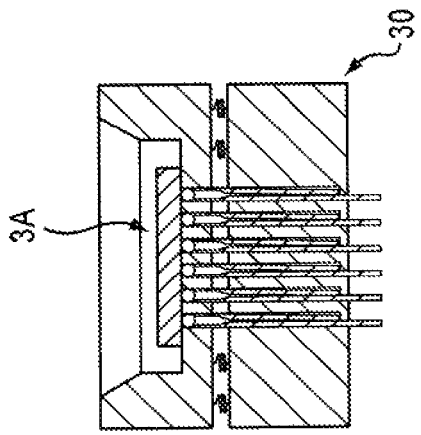
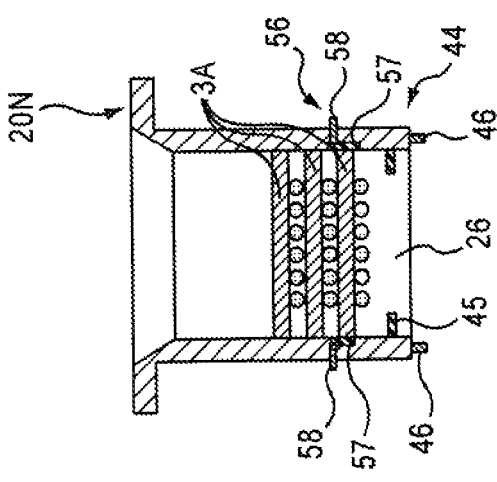
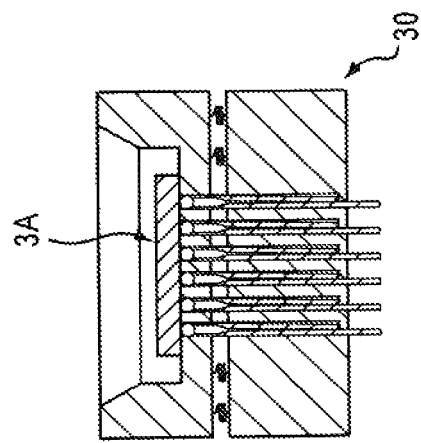
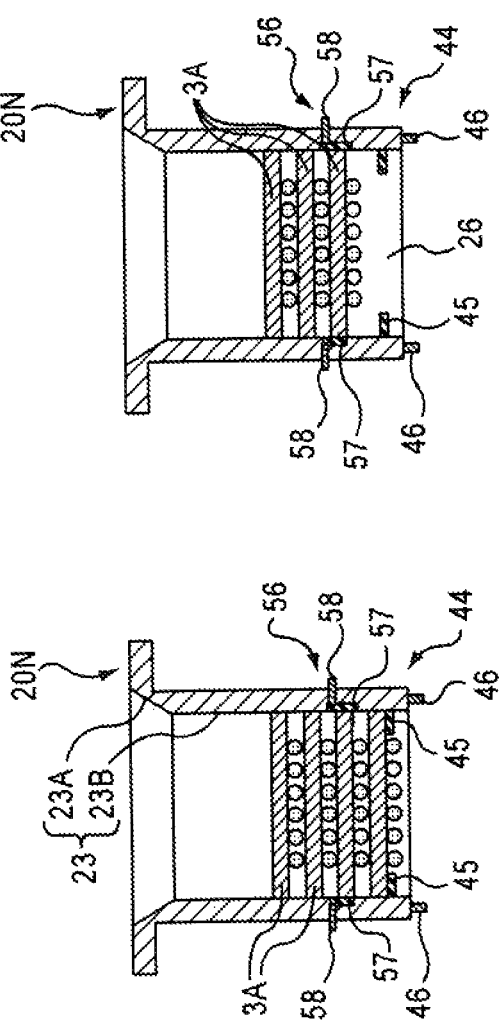
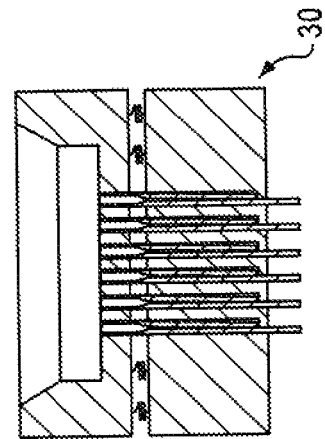

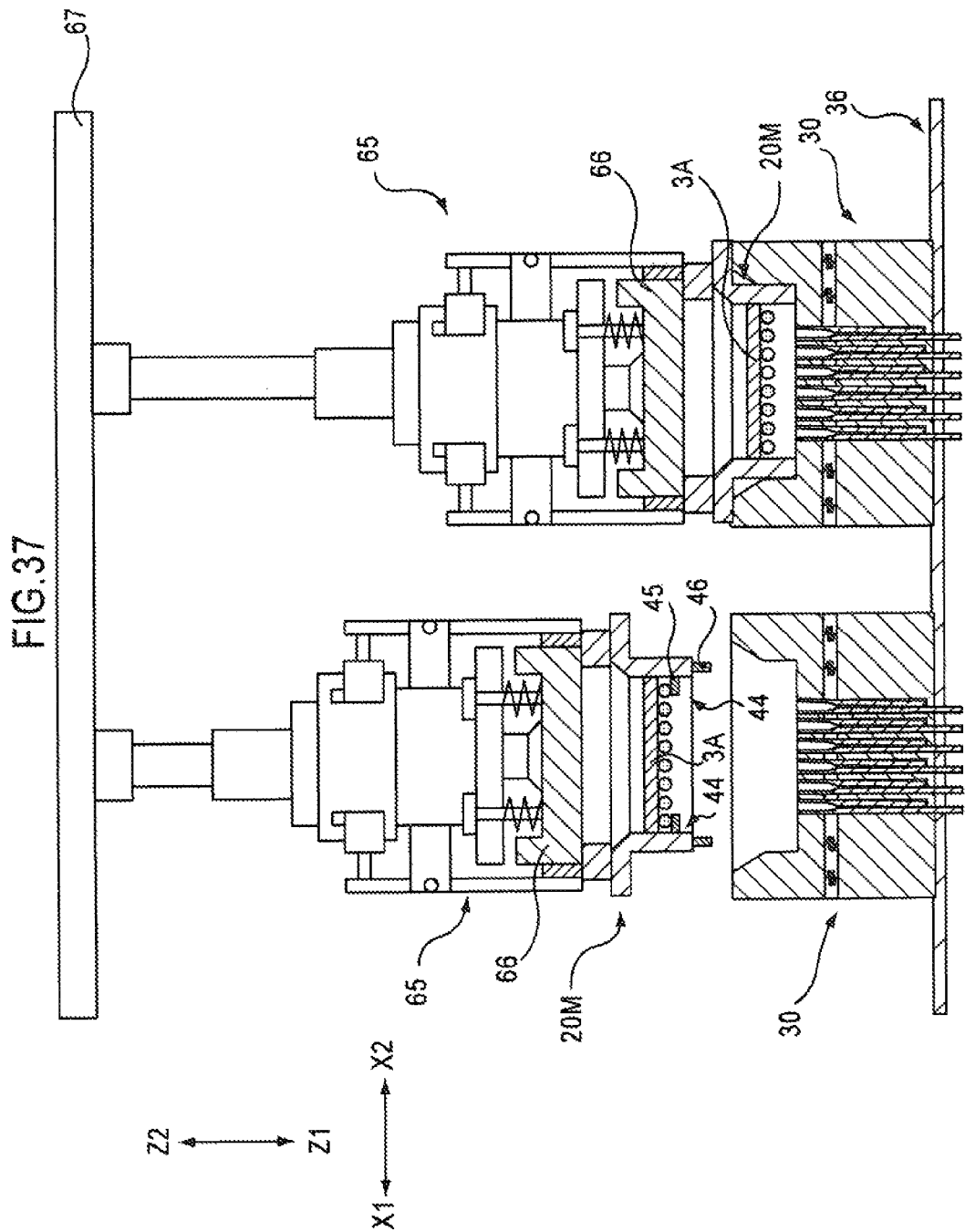

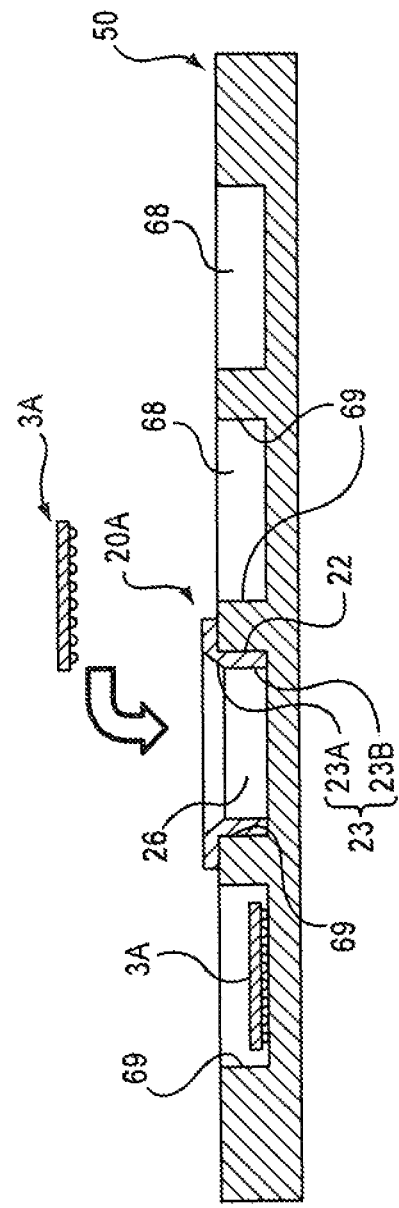

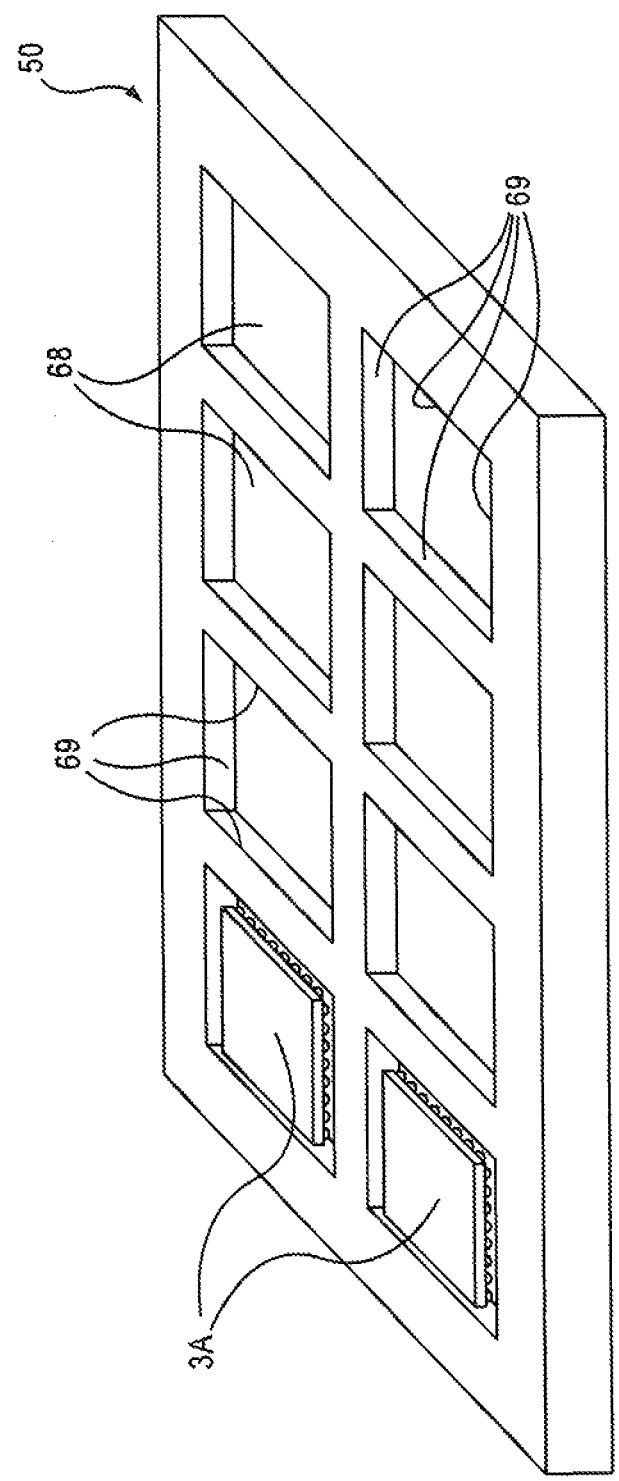

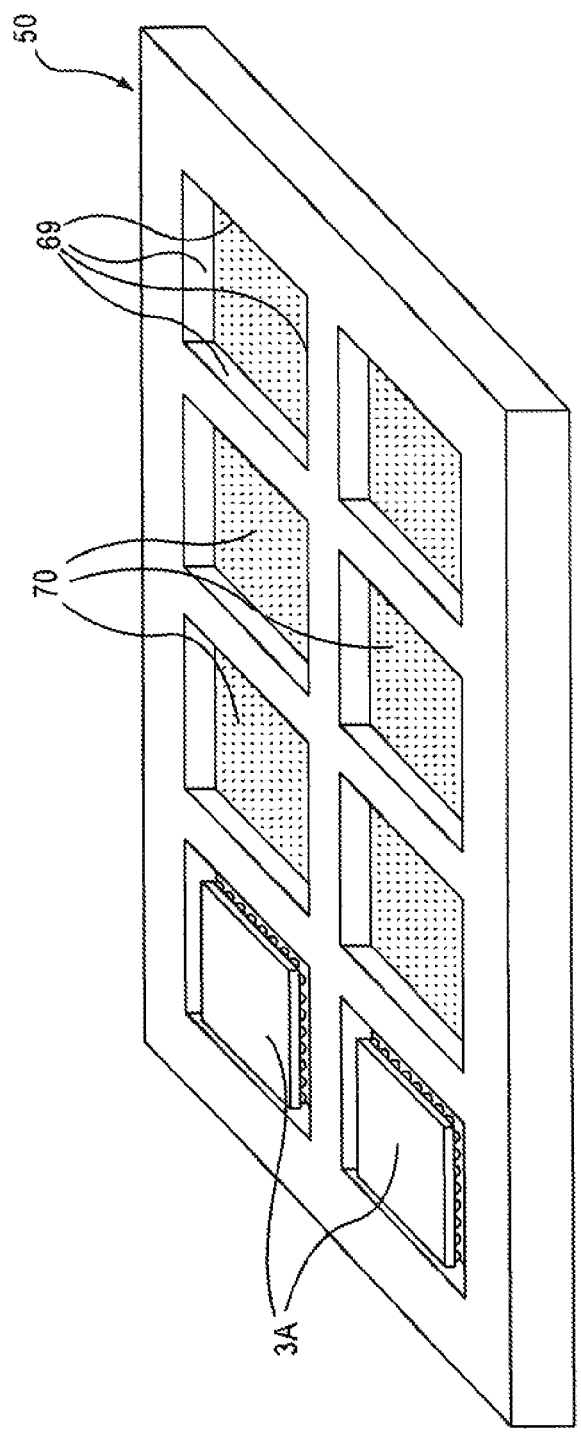
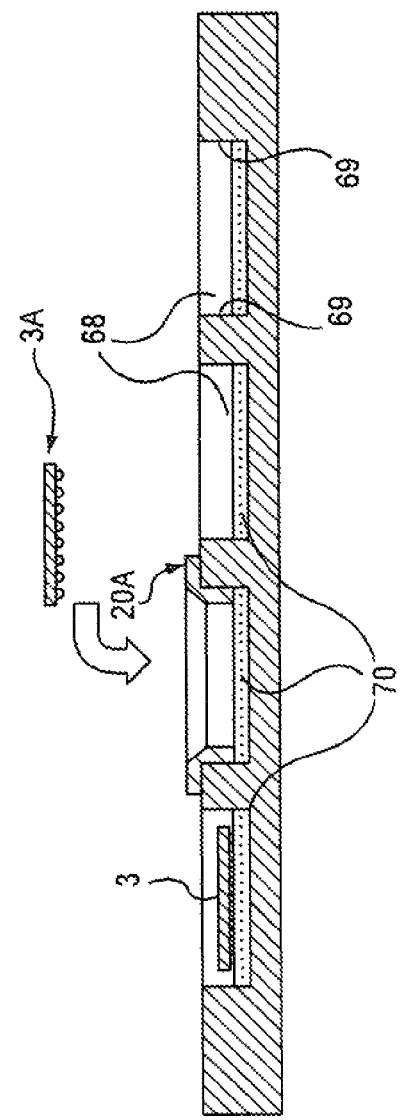
FIG.40A
FIG.40B

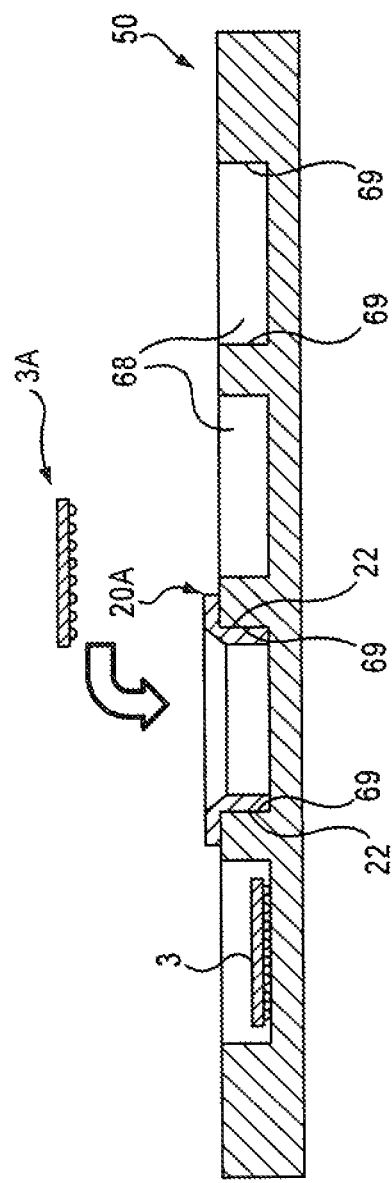
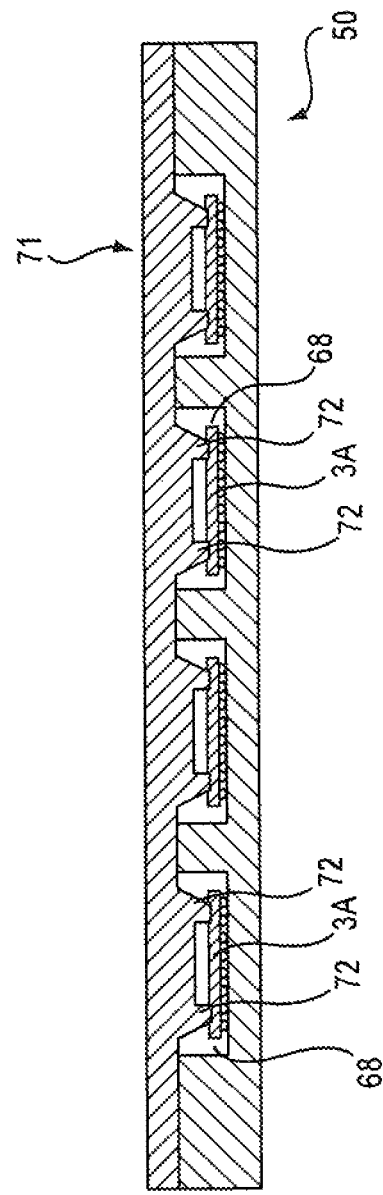
FIG.41A
FIG.41B

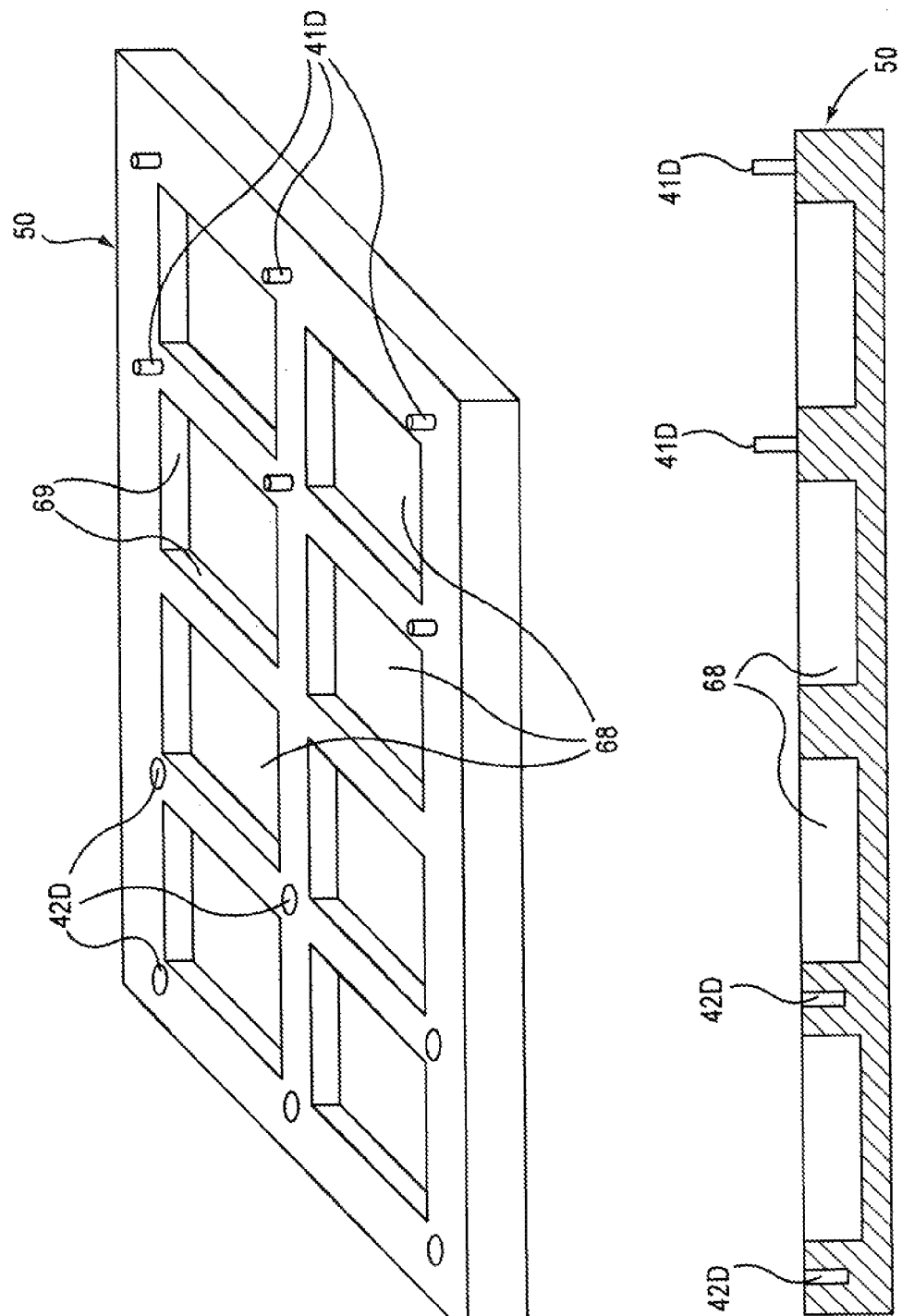

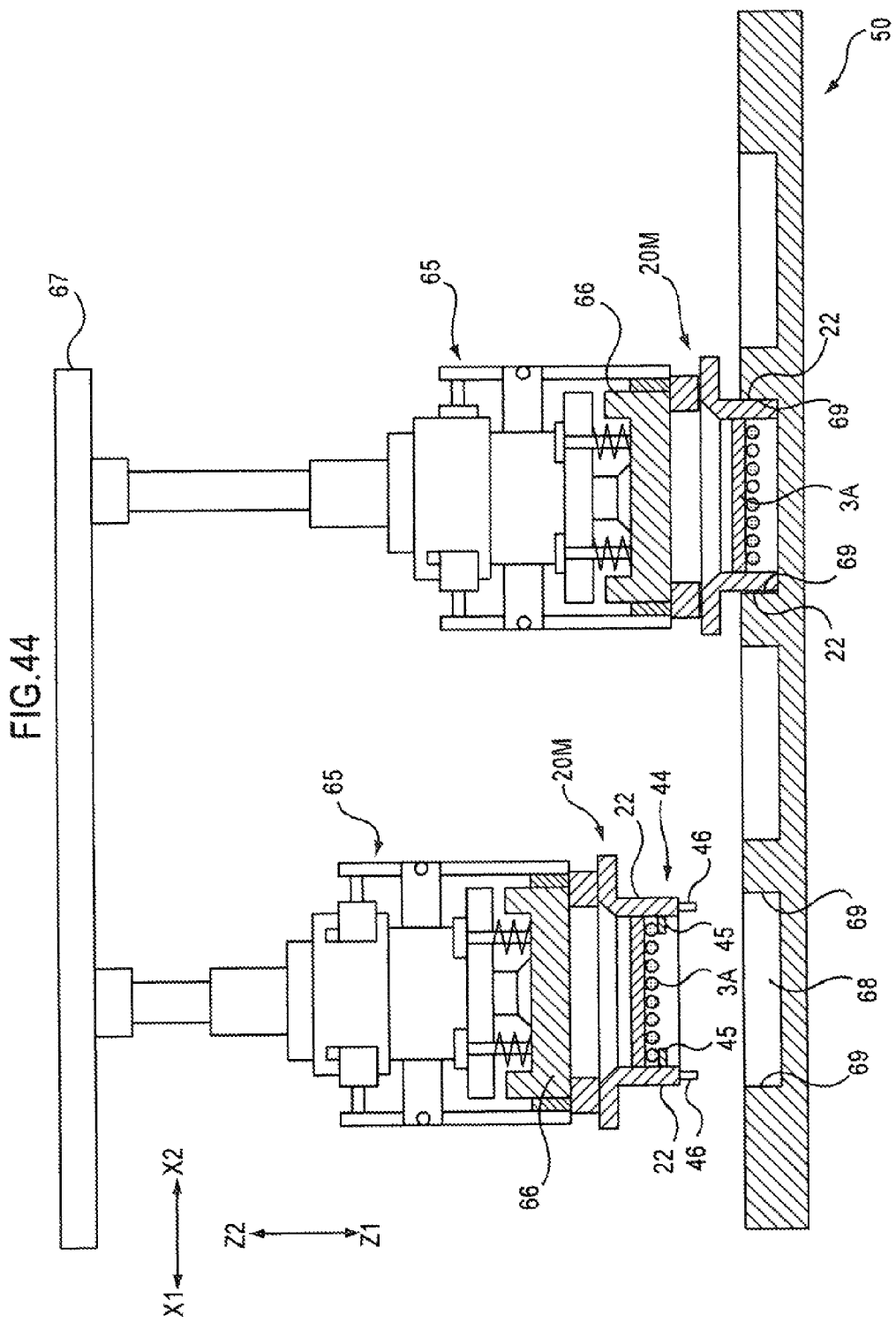

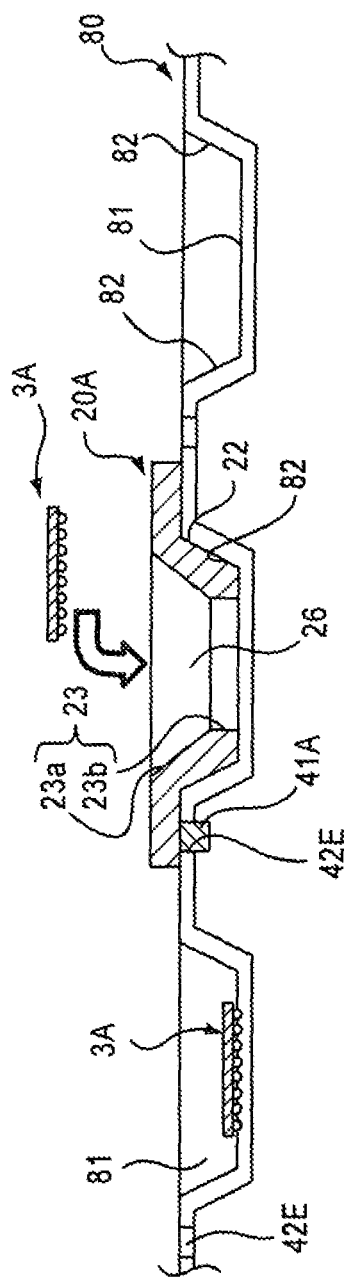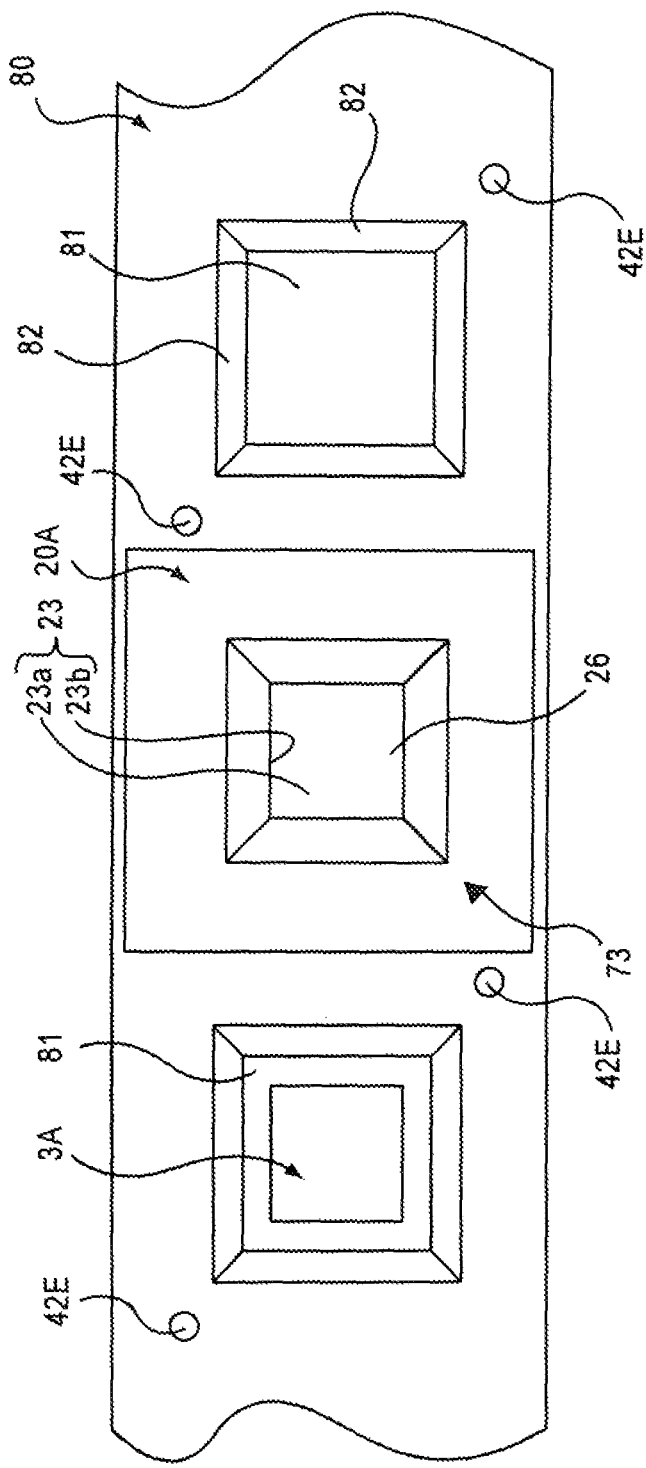
FIG.45A
FIG.45B

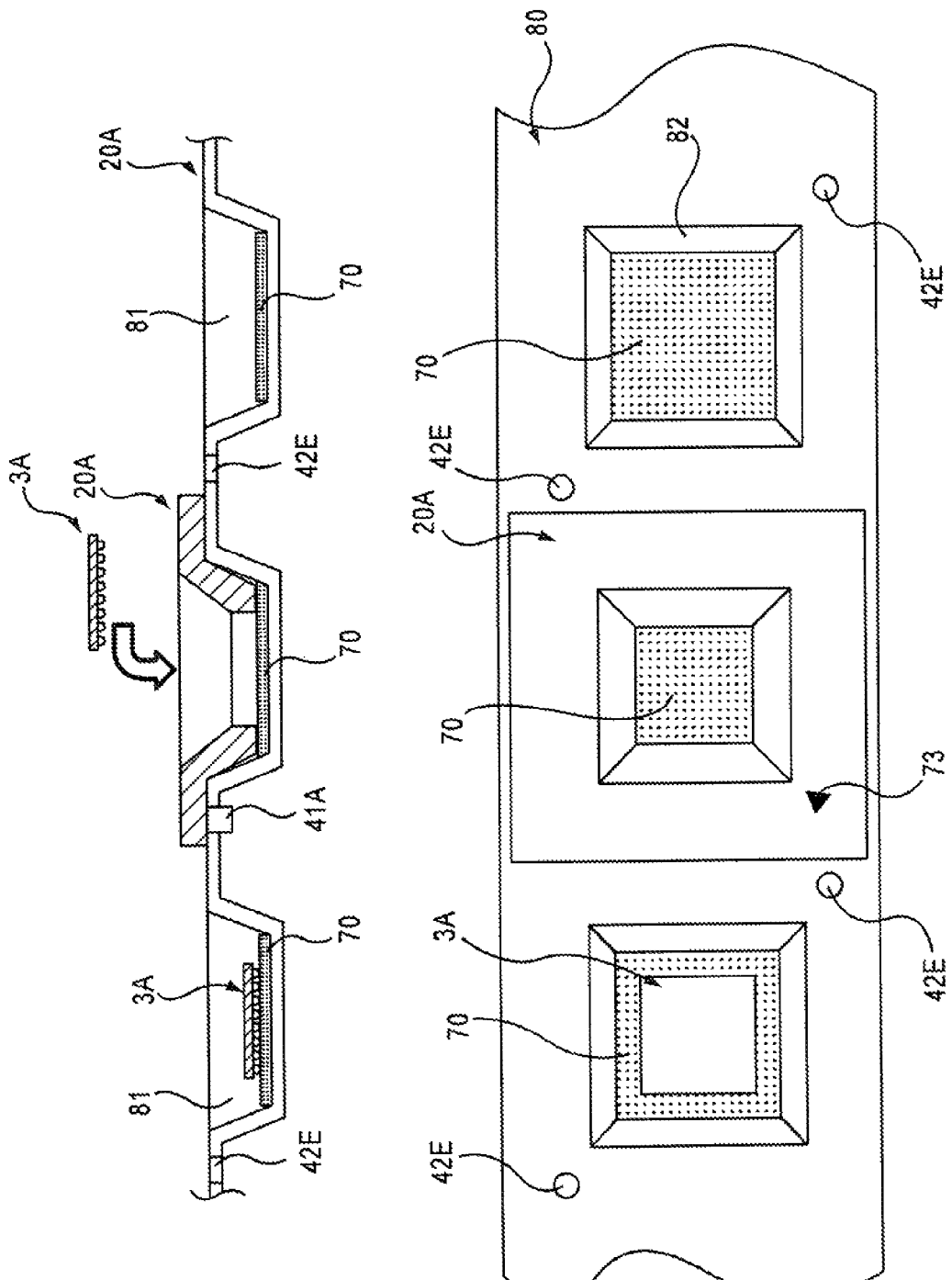

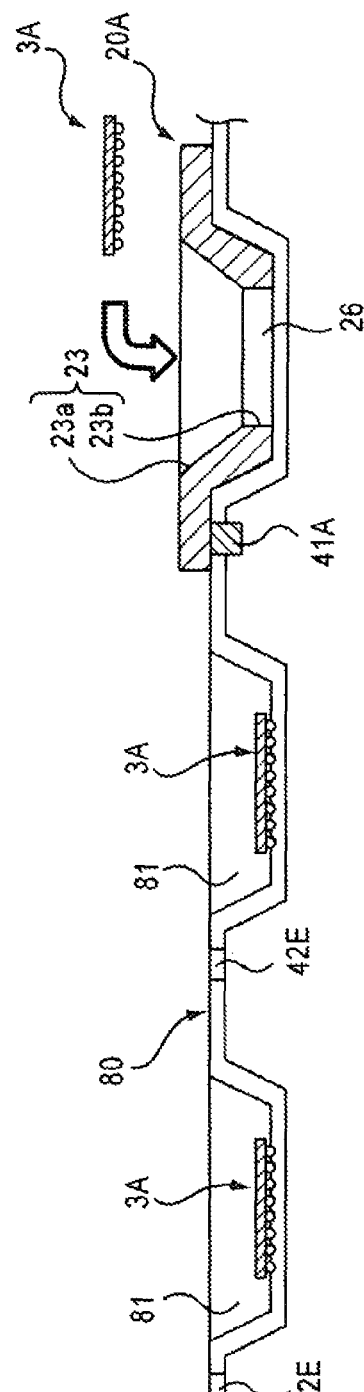
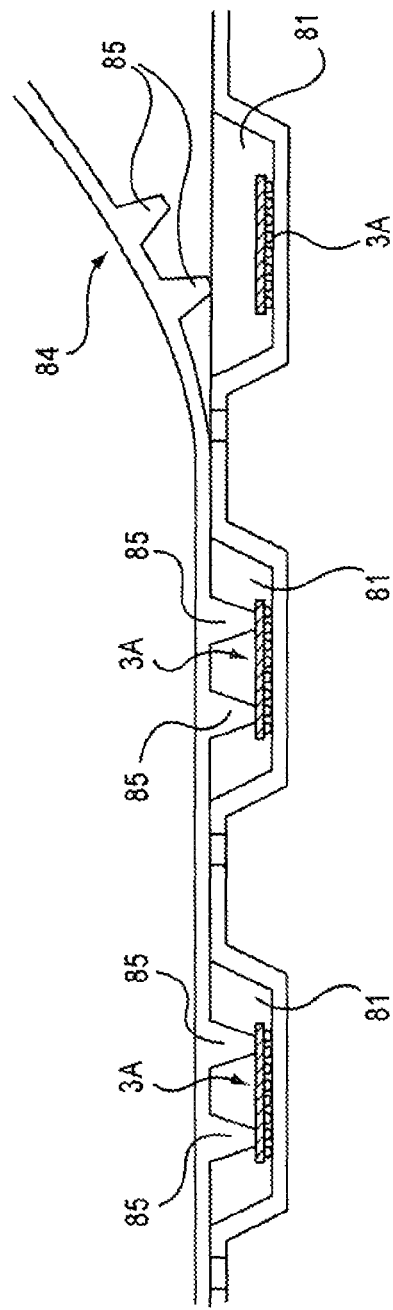
FIG.48A
FIG.48B

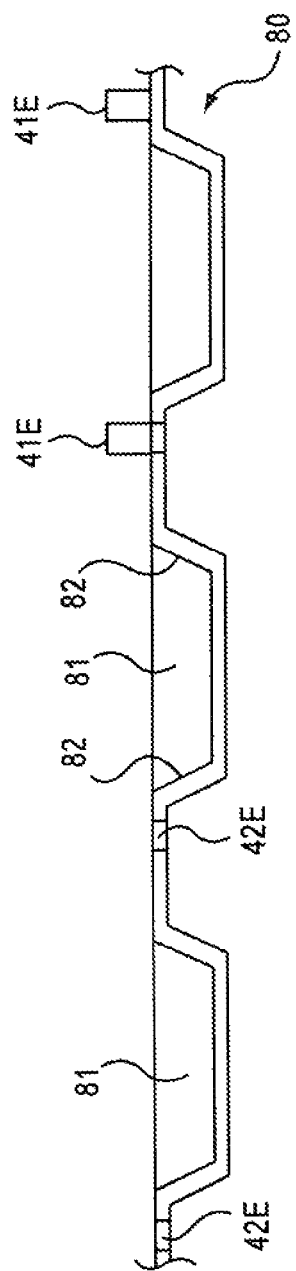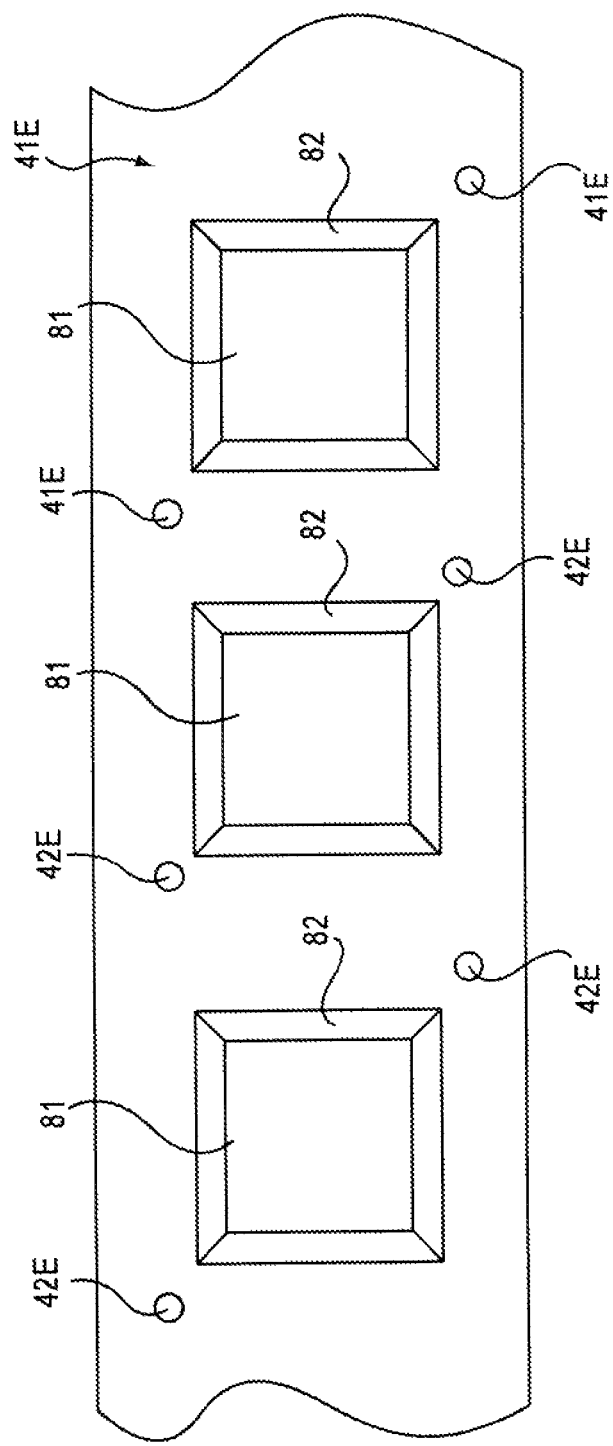
FIG.49A
FIG.49B

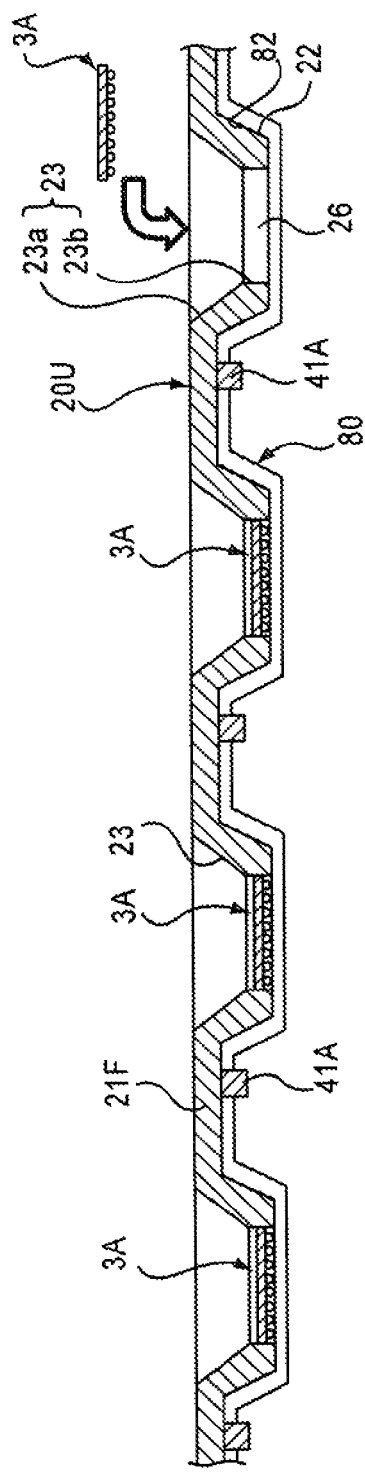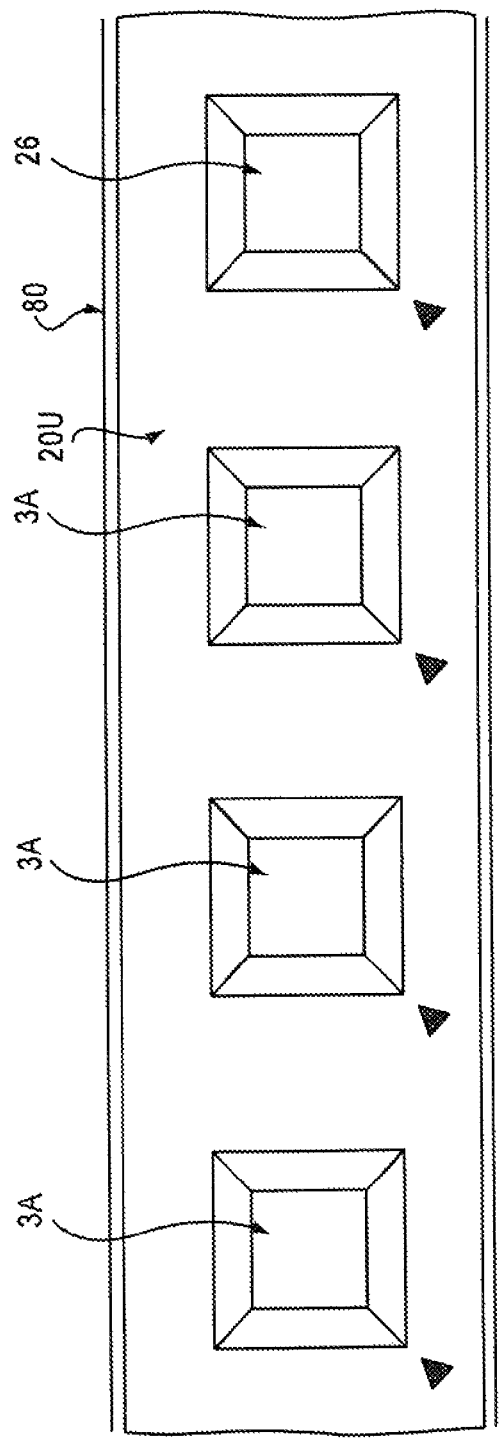

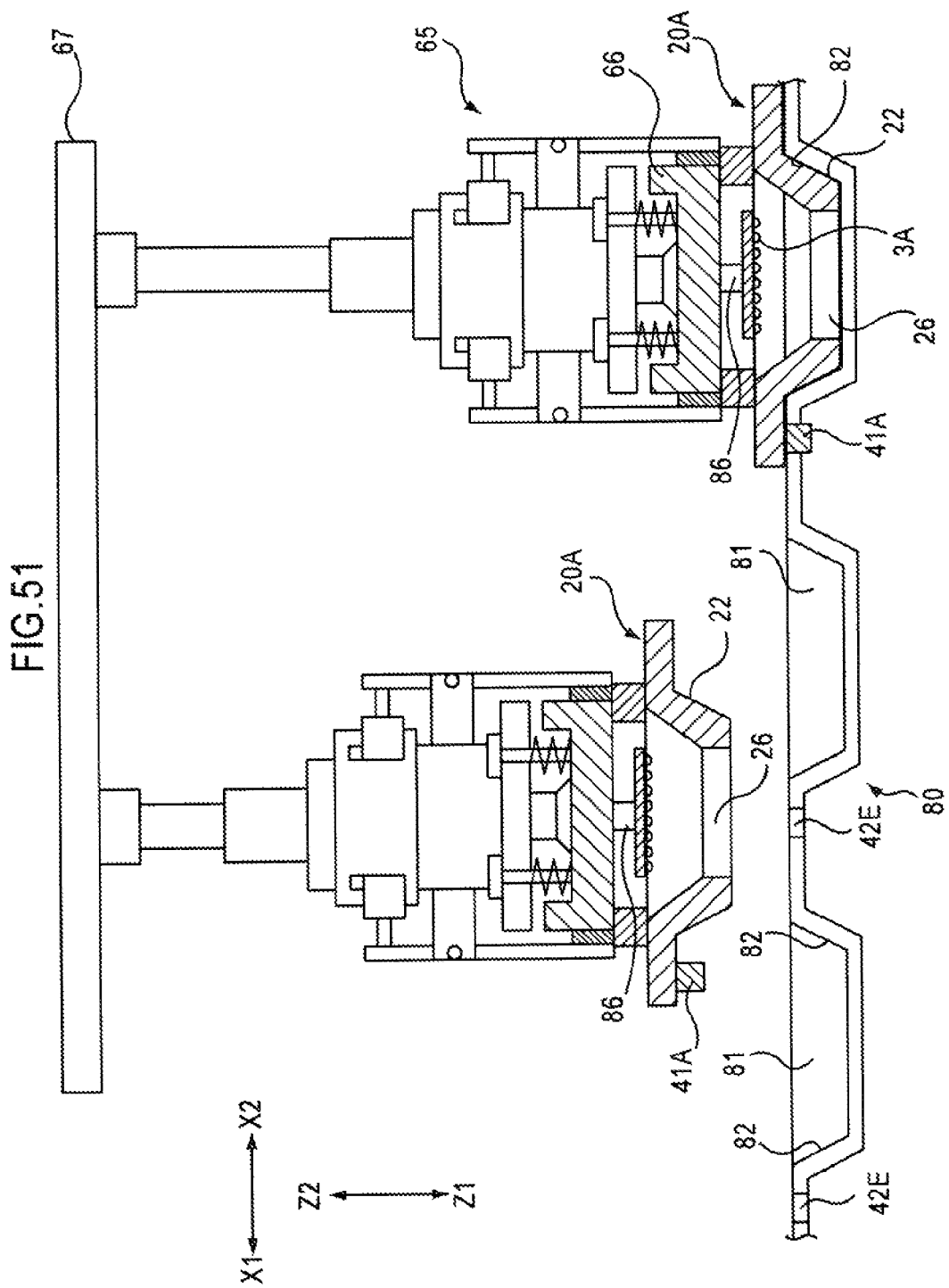

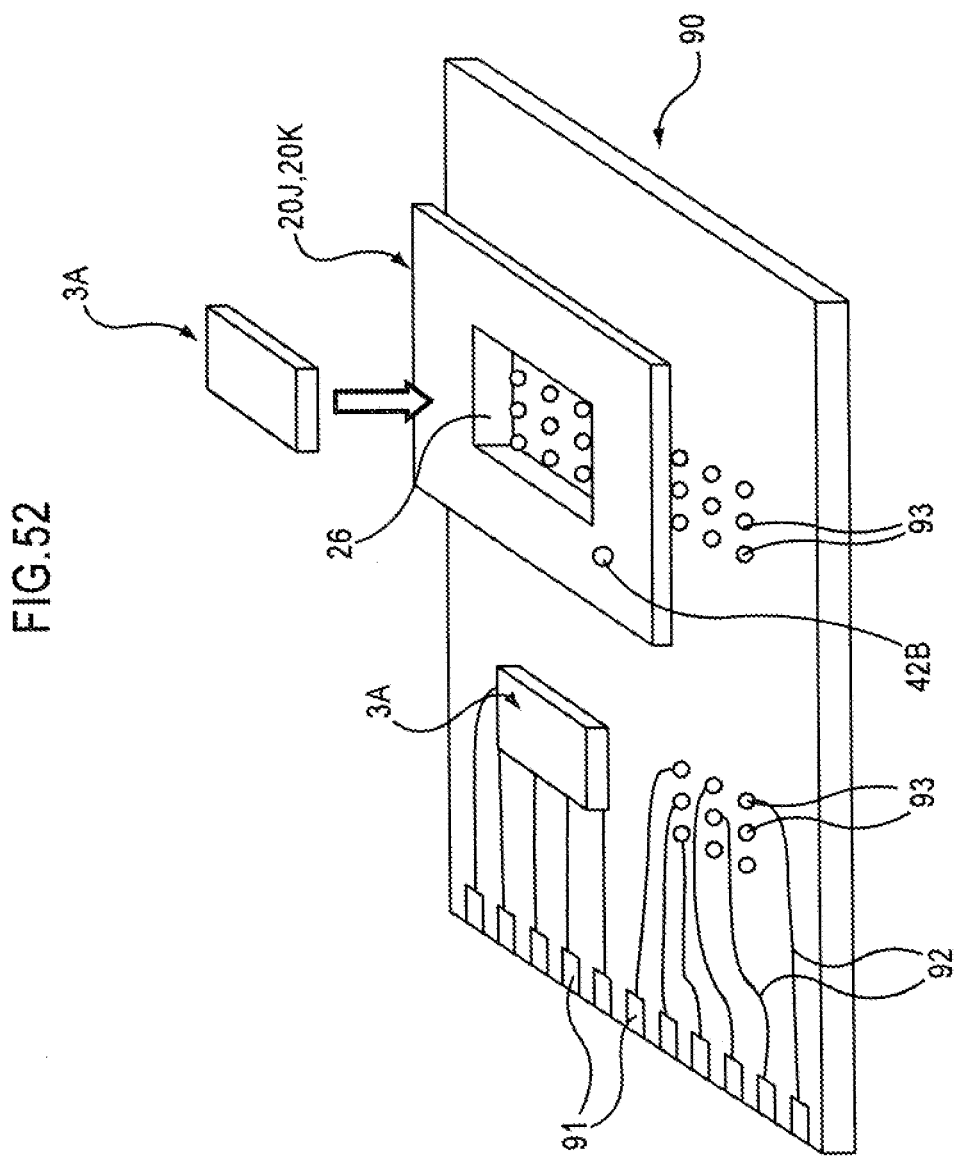

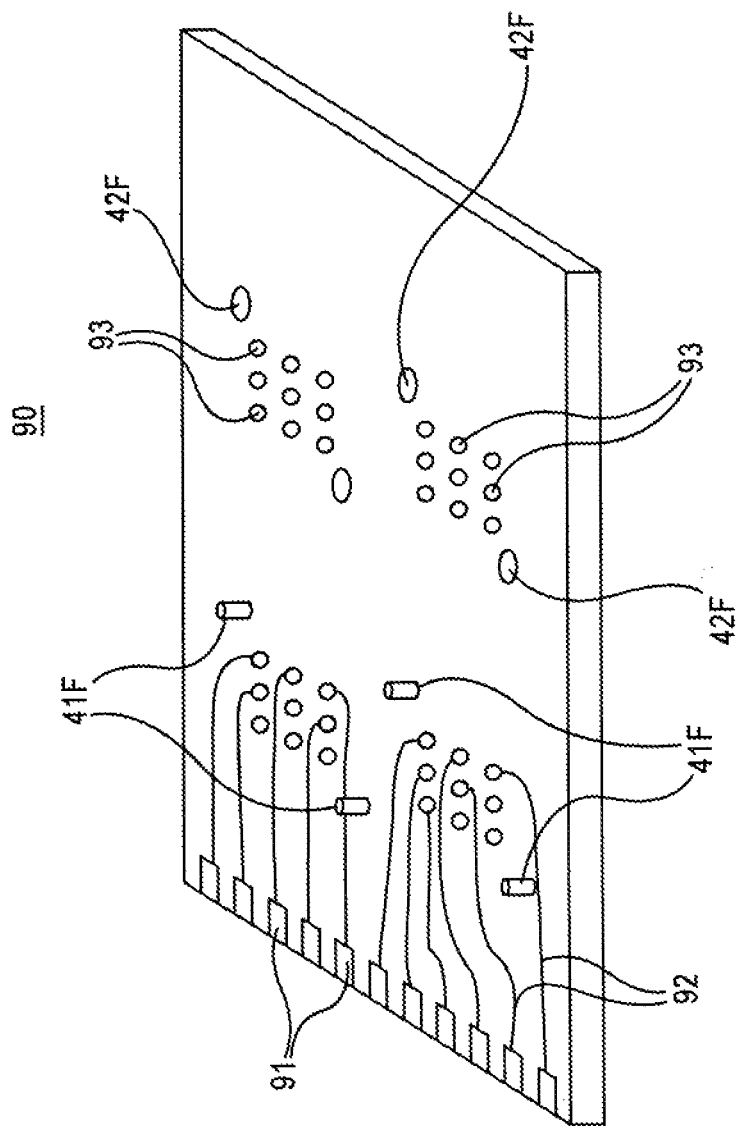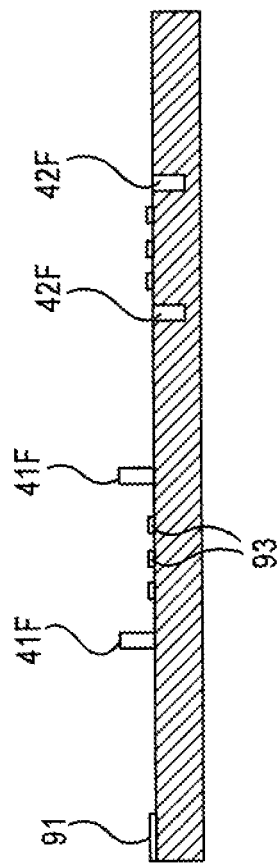
FIG.53A
FIG.53B

TRAY IN COMBINATION WITH ELECTRONIC COMPONENT ATTACHING TOOL ATTACHED TO THE TRAY

This application is a divisional of application Ser. No. 12/104,038, filed Apr. 16, 2008, now U.S. Pat. No. 8,051,554, which is a divisional of application Ser. No. 11/126,246, filed May 11, 2005, now U.S. Pat. No. 7,430,798, which is a divisional of application Ser. No. 10/655,030, filed Sep. 5, 2003, now U.S. Pat. No. 6,924,174.

BACKGROUND OF THE INVENTION

1. Field of the Invention

The present invention generally relates to a method of attaching an electronic component, and an electronic component attaching tool.

Specifically, the present invention relates to a method of attaching an electronic component such as a semiconductor device (whose representative is an LSI) and a ceramic condenser to an attachment object such as an IC socket while the position of the electronic component is aligned to the attachment object, and relates to an electronic component attaching tool used in this method.

2. Description of the Related Art

Recently, an electronic device having installed electronic components, and mainly a portable device such as a portable terminal, a cellular phone, and a digital still camera have rapidly become smaller and lighter.

Accompanying this fact, electronic components (whose representative is a semiconductor device) that are installing components for such a downsized electronic device are greatly demanded to be smaller and lighter.

For this demand, a semiconductor device having a package form (referred to as Chip Size Package CSP has been rapidly introduced. The package size of the semiconductor device is made to be near the chip size. The representatives of the CSP are Fine-pitch Ball Grid Array FBGA, Fine-pitch Land Grid Array FLGA, and so on.

Such a semiconductor device is made to be downsized, so that an external terminal of the semiconductor device is also made to have a minute size. Accordingly, when testing is performed on the semiconductor device, when the semiconductor device is attached on a tray or the like, or when the semiconductor device is attached on a substrate or the like, the semiconductor device is aligned with high accuracy to the attachment object such as an IC socket, an IC tray, and an attachment substrate to which the semiconductor device is attached.

Before the CSP was realized, a Small Out-line J-Leaded Package SOJ, a Thin Small Out-line Package TSOP and the like were generally used as the package form of the downsized semiconductor device. Even when the chip size of the semiconductor chip that was attached in the package was changed, the external shape of the package that encloses the semiconductor device was set to the same, that is, not changed. For this reason, the largest size of the semiconductor devices to be attached in the package was used as a standard when the package was designed. Accordingly, the external shape of the semiconductor device package was conventionally larger than the size of the semiconductor device attached in the package.

On the other hand, the semiconductor device needs to be attached at the predetermined position on the attachment object such as the IC socket, the tray, and the attachment substrate with high accuracy. According to Japanese Laid-Open Patent Application No. 10-97887, the attachment object has a position alignment structure for positioning the semiconductor device at a predetermined position.

This position alignment structure uses the external shape of the semiconductor devices (electronic components) to be generally attached in the package form. The position alignment using the external shape of the electronic components was applied in order to simplify the position alignment structure, facilitate the position alignment, and improve the accuracy of the position alignment.

Conventionally, the packages of the semiconductor devices have the common external shape, so that one position alignment structure suitable for the common package external shape can cope with various semiconductor devices.

However, in the case of the CSP whose size is made to be near the smaller chip size, when the chip size is changed, the package size is inevitably changed. Furthermore. in the case of a memory device, the chip size shrinks every about six months even for the same type memory device. Accompanying this chip size change, the package size of the memory device is also changed.

Accordingly, one position alignment structure of the attachment object such as the IC socket, the tray, and the attachment substrate no longer can cope with the downsized devices. For this reason, position alignment structures that correspond to package sizes of the respective CSPs were developed and manufactured so as to be incorporated in the attachment object each time the package size is changed.

FIGS. 1 through 3 show how the conventionally used attachment object copes with the change in the electronic component size. In FIGS. 1 through 3, the CPSs are shown as an example of an electronic component.

For example, it is assumed that before the chip size is changed, a semiconductor chip 2A is cut out from a wafer 1A, and the semiconductor chip 2A is packaged to form a semiconductor device 3A (CSP). As shown in FIG. 2A, the side length of the semiconductor device 3A is "A", and the pitch of bumps 4 of the semiconductor device 3A is "a".

The thus-manufactured semiconductor device 3A is attached to the attachment object at the time of the testing, the shipment, the substrate attachment, and the like. FIG. 1 shows the state where the semiconductor device 3A is attached to the IC socket 5A as the attachment object for the testing, the state where the semiconductor device 3A is attached to the tray 6A as the attachment object for the shipment, and the state where the semiconductor device 3A is attached to the attachment substrate 8A. FIG. 2B shows the detailed state where the semiconductor device 3A is attached to the IC socket 5A.

When the chip size shrinks, and a semiconductor chip 2B that is smaller than the semiconductor chip 2A is cut out from a wafer 1B, a semiconductor device 3B that is smaller than the semiconductor device 3A is used for enclosing the semiconductor chip 2B. FIGS. 3A and 3B are enlarged views showing the semiconductor devices 3B and 3A. As shown in FIG. 3A, the side length of the semiconductor device is "B" (B<A). The pitch "b" of bumps of the semiconductor device 3B is equal to the pitch of the bumps 4 of the semiconductor device 3A (b=a).

As described above, conventionally, when the package size is changed from the semiconductor device 3A to the semiconductor device 3B, all of the attachment objects were changed to be suitable ones for the semiconductor devices 3B. In other words, the position alignment structures of the IC socket 5A, the tray 6A, the attachment substrate 8A that are the attachment objects are made based on the external shape of the semiconductor device 3A. Accordingly, these attachment objects for the semiconductor device 3A cannot be used for the semiconductor device 3B whose shape is different from the shape of the semiconductor device 3A.

For this reason; conventionally, when the package size is changed from the semiconductor device 3A to the semiconductor device 3B, the IC socket 5A is replaced with an IC socket 5B suitable for the semiconductor device 3B, the tray 6A is replaced with a tray 6B suitable for the semiconductor device 3B, and the attachment substrate 8A is replaced with an attachment substrate 8B suitable for the semiconductor device 3B.

Thus, when the package size is changed, the attachment object, and the position alignment structure of the attachment object need to be entirely changed, resulting in a large cost. Furthermore, a process of changing the position alignment structure requires much time, and the serviceability ratio of the attachment objects are lowered.

In addition, when the package size is changed, and a period for changing and developing the position alignment structure is long, a service period of the developed position alignment structure becomes short because the life cycle of the semiconductor device is short. As a result, an equipment cost generated by the package size change cannot be recovered.

SUMMARY OF THE INVENTION

In view of the foregoing, it is an object of the present invention to provide an electronic component attaching method and an electronic component attaching tool in which even when the size of the electronic component is changed, position alignment of electronic components having various sizes can be performed without changing an attachment object to which the electronic components are attached.

According to one aspect of the present invention, there is provided a method of attaching to a predetermined attachment position of an attachment object a first electronic component and a second electronic component, an external size of the first electronic component being different from an external size of the second electronic component, comprising the steps of:

preparing a first electronic component attaching tool for the first electronic component, wherein the first electronic component attaching tool has a function of aligning the first electronic component to the predetermined attachment position of the attachment object;

preparing a second electronic component attaching tool for the second electronic component, wherein the second electronic component attaching tool has a function of aligning the second electronic component to the predetermined position of the attachment object;

attaching the first electronic component attaching tool or the second electronic component attaching tool to a standard part formed on the attachment object in accordance with a first case where the first electronic component is attached to the predetermined attachment position or a second case where the second electronic component is attached to the predetermined attachment position, wherein the forming of the standard part does not substantially depend on the external sizes of the first and second electronic components;

in the first case, by using the first electronic component attaching tool, attaching the first electronic component to the attachment object with the position of the first electronic component being aligned to the predetermined attachment position;

removing the first electronic component attaching tool from the attachment object;

in the second case, by using the second electronic component attaching tool, attaching the second electronic component to the attachment object with the position of the second electronic component being aligned to the predetermined attachment position; and removing the second electronic component attaching tool from the attachment object.

According to another aspect of the present invention, there is provided an electronic component attaching tool for attaching an electronic component to a predetermined attachment position of an attachment object, comprising:

a main body;

a first structure part that is formed on the main body, wherein a position of the first structure part is aligned to a standard part formed on the attachment object; and the forming of the standard part does not substantially depend on an external shape of the electronic component; and a second structure part that is formed in accordance with the external shape of the electronic component so as to have a function of aligning a position of the electronic component to the predetermined position of the attachment object in a state where the first structure part is aligned and attached to the standard part.

With this method and tool, when the electronic components having different sizes are attached to the attachment object, it is not necessary to prepare different attachment objects for the respective different electronic components. In other words, only by selectively attaching the different electronic component attaching tools to the standard part formed on attachment object, it is possible to align and attach the electronic components having the different sizes to the attachment object.

Furthermore, when one electronic component having one external shape to be attached to the attachment object is replaced with another electronic component having another external shape, only the electronic component attaching tool is replaced, and there is no necessity that the attachment object be modified.

Accordingly, it is possible to promptly cope with the change of the electronic component to be attached to the attachment object, and therefore, it is possible to certainly cope with the short life cycle of the electronic component. In addition, the serviceability ratio of the attachment object and the throughput by the attachment object can be improved, reducing a cost for the electronic component. Moreover, when the electronic component to be attached to the attachment object is changed, it is not necessary to modify the attachment object, reducing an equipment cost required for the change of the electronic component.

Further, the electronic component attaching tool can be removed from the attachment object without adversely affecting the position of the electronic component attached to the attachment object and without adversely affect the condition of the connection between the electronic component and the attachment object. Thereby, after the electronic component is aligned and attached to the attachment object by the electronic component attaching tool, it is not necessary to maintain the state in which the electronic component attaching tool is mounted on the attachment object. Therefore, when there are a plurality of attachment objects to which the electronic components are attached, one electronic component attaching tool enables the electronic components to be attached to a plurality of the attachment objects, respectively.

Furthermore, the electronic component attaching tool may include an opening for aligning the position of the electronic component to the attachment object. By dropping the electronic component free to the opening, the electronic component can be automatically aligned and attached to the attachment object, so that it is possible to easily align and attach the electronic component to the attachment object.

Moreover, the electronic component attaching tool may include a holding mechanism that holds the electronic component. While the holding mechanism holds the electronic component, the electronic component attaching tool may be mounted on the attachment object. Thereby, at the same time the electronic component attaching tool is mounted on the attachment object, the electronic component can be attached to the attachment object. Therefore, it is possible to improve the efficiency of aligning and attaching the electronic component to the attachment object.

Further, while the electronic component is held by the electronic component attaching tool, the electronic component may be optically tested by optical means via the opening of the electronic component attaching tool. When the electronic component is held by the electronic component attaching tool, the bottom part of the electronic component may be exposed via the opening. In this manner, it is possible to test the electronic component without removing the electronic component from the electronic component attaching tool. Therefore, it is possible to improve the efficiency of testing the electronic component.

Furthermore, the electronic component may be a chip size package.

The attachment object may be an open top type IC socket. By pushing the IC socket via the electronic component attaching tool, a contact pin of the IC socket may be connected to or released from a terminal of the electronic component. Therefore, the electronic component attaching tool can be used for pushing the IC socket.

The attachment object may be a tray, a tape, or an attachment substrate.

Furthermore, a region of the attachment object to which the electronic component is attached may be adhesive. Thereby, the electronic component is held at the aligned and attached position by the adhesive force, so that even when or after the electronic component attaching tool is removed from the attachment object, the electronic component is not moved from the aligned and attached position.

In addition, a cover may be attached for holding the electronic component in a state in which the electronic component is aligned and attached to the attachment object. In this manner, the electronic component can be held at the aligned and attached position by the cover, so that the electronic component is not moved from this aligned and attached position.

Other objects, features, and advantages of the present invention will become more apparent from the following detailed description when read in conjunction with the accompanying drawings.

BRIEF DESCRIPTION OF THE DRAWINGS

FIG. 1 is an illustration for a problem of a conventional method of aligning and attaching semiconductor devices to an attachment object;

FIG. 4 shows an electronic component attaching tool according to a first embodiment of the present invention;

FIGS. 5A and 5B are illustrations showing a method of aligning and attaching the electronic component to the attachment object by using the electronic component attaching tool shown in FIG. 4;

FIGS. 6C and 6D are illustrations showing the method of aligning and attaching the electronic component to the attachment object by using the electronic component attaching tool shown in FIG. 4;

FIGS. 22A and 22B show electronic component attaching tools according to a ninth embodiment of the present invention;

FIGS. 23A through 23C show an electronic component attaching tool according to a tenth embodiment of the present invention;

FIGS. 26A and 26B show a method of aligning and attaching the electronic component to the attachment object by using the electronic component attaching tool shown in FIGS. 24A and 24B;

FIGS. 27C and 27D show the method of aligning and attaching the electronic component to the attachment object by using the electronic component attaching tool shown in FIGS. 24A and 24B;

FIGS. 29A through 29D show a method of detecting a defect of the electronic component by using a camera as well as aligning and attaching the electronic component to the attachment object;

FIGS. 32A through 32C show a method of aligning and attaching the electronic component to the attachment object by using the electronic component attaching tool shown in FIG. 31;

FIG. 37 shows a sixteenth embodiment of the present invention;

FIG. 38 shows an example in which the electronic component attaching tool of the first embodiment of the present invention is applied to a tray;

FIG. 39 shows the tray of FIG. 38 to which the electronic components are attached;

FIG. 40A shows a tray having adhesive sheets to which the electronic components are attached by using the electronic component attaching tool of the first embodiment of the present invention;

FIG. 40B shows a method of aligning and attaching the electronic component to the tray shown in FIG. 40A by using the electronic component attaching tool of the first embodiment of the present invention;

FIGS. 41A and 41B show a method of fixing the electronic components attached to a tray by using an upper cover;

FIGS. 42A and 42B show a tray on which position alignment pins and position alignment holes are formed;

FIG. 44 shows a tray to which the sixteenth embodiment of the present invention is applied;

FIGS. 45A and 45B show a tape to which the electronic component attaching tool of the first embodiment of the present invention is applied;

FIGS. 47A and 47B show a method of aligning and attaching the electronic component to a tape having adhesive sheets, by using the electronic component attaching tool of the first embodiment;

FIGS. 48A and 48B show a method of fixing the electronic component attached to the tape of FIGS. 45A and 45B by using an upper cover;

FIGS. 49A and 49B show a tape on which position alignment pins and position alignment holes are formed;

FIGS. 50A and 50B show an example in which the electronic component attaching tool of the fourteenth embodiment of the present invention is applied to the tape;

FIG. 51 shows an example in which the sixteenth embodiment of the present invention is applied to the tape;

FIG. 52 shows an example in which the electronic component attaching tool of the first embodiment of the present invention is applied to an attachment substrate;

FIGS. 53A and 53B show an attachment substrate on which position alignment pins and position alignment holes are formed.

DETAILED DESCRIPTION OF THE PREFERRED EMBODIMENTS

Figure 2A:
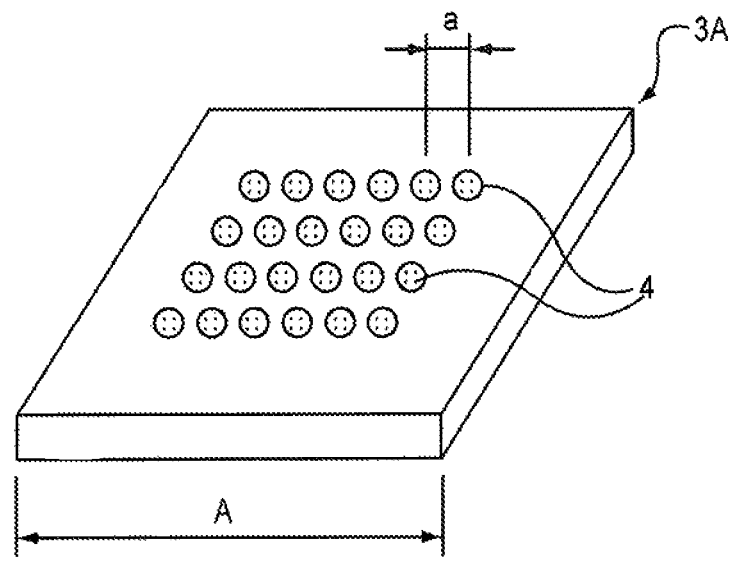
FIGS. 2A and 2B are illustrations for the problem of the conventional method of aligning and attaching semiconductor devices to an attachment object.
Figure 2B:
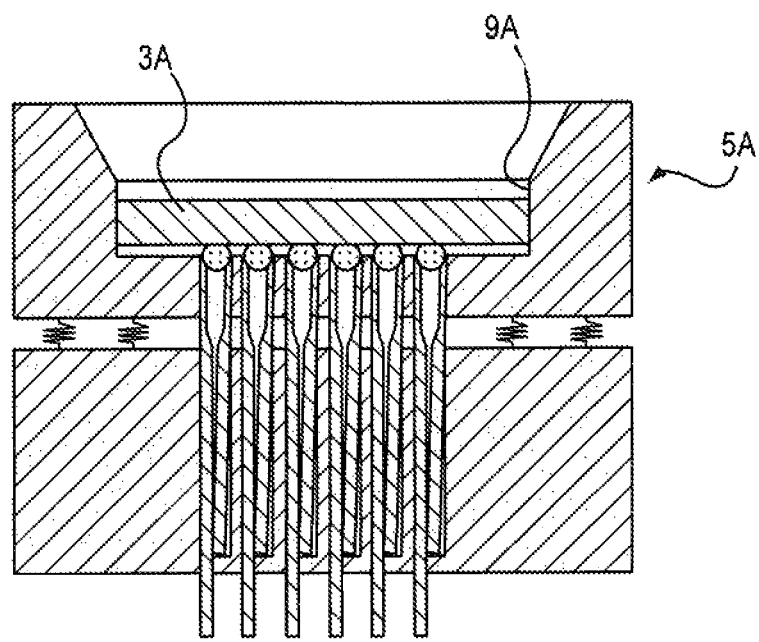
Figure 3A:
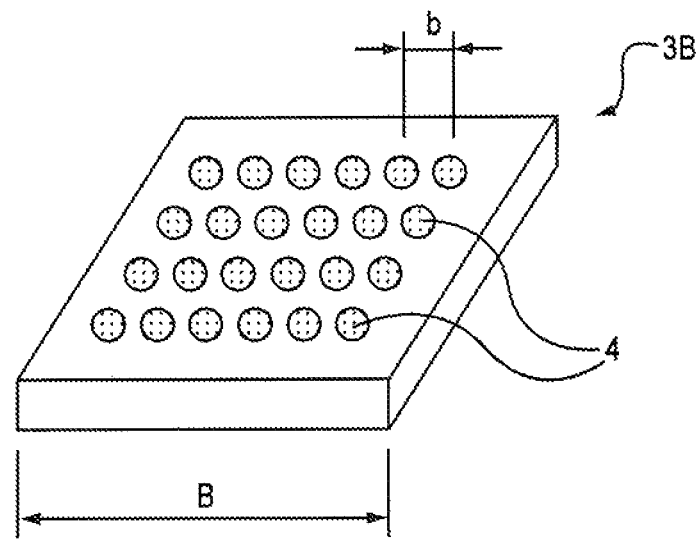
FIGS. 3A and 3B are illustrations for the problem of the conventional method of aligning and attaching semiconductor devices to an attachment object.
Figure 3B:
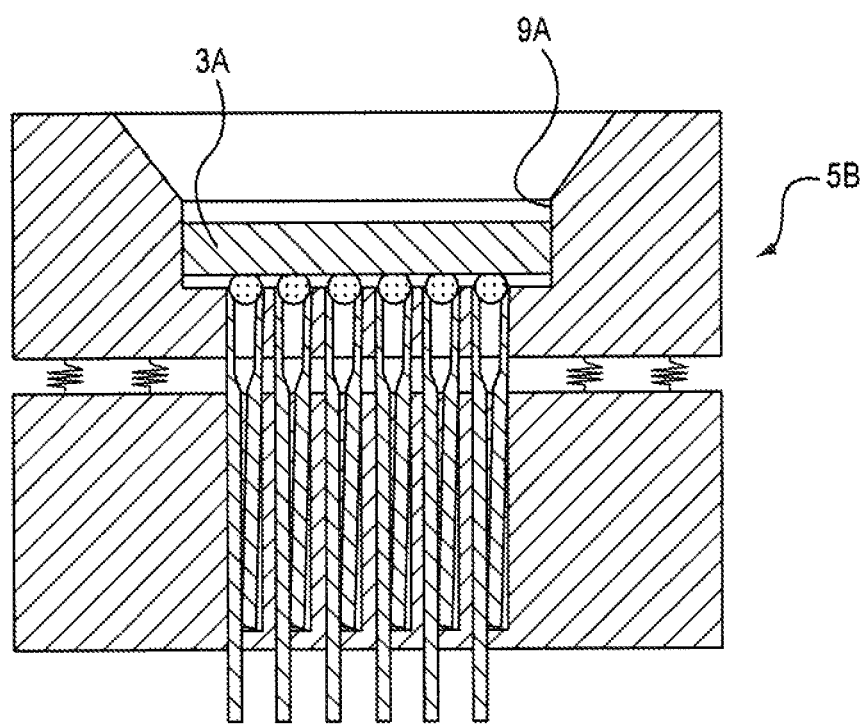

A description will now be given, with reference to the drawings, of embodiments of the present invention.

FIGS. 4 through 10 show electronic component attaching tools 20A and 20B according to a first embodiment of the present invention. The electronic component attaching tools 20A and 20B have functions of aligning the positions of the semiconductor devices 3A and 3B, respectively, to an IC socket 30 that is the attachment object at the time of mounting the semiconductor devices 3A and 3B on the IC socket 30. The semiconductor devices 3A and 3B are examples of electronic components.

In the following embodiments, the semiconductor device whose package form is a CSP type is used as an example of an electronic component. However, the application of the present invention is not limited to the semiconductor device, but may be applied to other electronic components such as a ceramic condenser.

Further, in the following embodiments, two types of the semiconductor devices 3A and 3B whose package sizes are different from each other. The semiconductor devices 3A and 3B are the same shown in FIGS. 1 through 3B. However, the present invention may be applied to an electronic component having three or more size types.

The electronic component attaching tool 20A for the semiconductor device 3A differs only in a second structure part or the second structure part size (that is described later) from the electronic component attaching tool 20B for the semiconductor device 3B. Accordingly, except for a necessity that the description be made by distinguishing the semiconductor device 3A from the semiconductor device 3B, only the electronic component attaching tool 20A suitable for the semiconductor device 3A will be described in the following.

First, a structure of the IC socket 30 that functions as the attachment object for attaching the electronic component attaching tool 20A thereto will be described. The IC socket 30 is an open top type IC socket that dos not have a lid.

This IC socket 30 includes a fixed part 31 and a movable part 32. The fixed part 31 is fixed on a test substrate 36 (refer to FIG. 8). The fixed part 31 is provided with a plurality of contact pins 33 that correspond to the bumps 4 formed on the semiconductor device 3A (and the semiconductor device 3B).

One end (at the side of the direction Z2 indicated by the arrow "Z2" of FIG. 4) of each contact pin 33 branches into two portions so as to form pin end portions 33a and 33b.

When the semiconductor device 3A or 3B is mounted on the IC socket 30, the bump 4 is sandwiched by a pair of the pin end portions 33a and 33b so that the bump 4 can be electrically and mechanically connected to the contact pin 33.

The movable part 32 is structured so as to move in the directions Z1 and Z2 indicated by the arrows "Z1" and "Z2" of FIG. 4 relative to the fixed part 31. Further, springs 34 are provided between the fixed part 31 and the movable part 32 such that the movable part 32 is pushed in the direction "Z2" relative to the fixed part 31 by the springs 34.

The pair of the pin end portions 33a and 33b of the contact pin 33 are structured so as to move or deform, accompanying the movement of the movable part 32. In other words, when the movable part 32 is pushed and moved in the lower direction "Z1", the pair of the pin end portions 33a and 33b are moved and separated from each other.

The semiconductor device 3A or 3B is attached to the IC socket 30 with the movable part 32 being pushed in the direction Z1. In the state in which the movable part 32 is pushed in the direction Z1, the distance between the pair of the pin end portions 33a and 33b is widened. Accordingly, the bump 4 of the semiconductor device 3A or 3B can be easily inserted between the pair of the pin end portions 33a and 33b (refer to FIG. 6D).

In the state in which the bump 4 is positioned between the pair of the pin end portions 33a and 33b, when the pushing force applied to the movable part 32 is released, the elastic restoring force of the springs 34 cause the movable part 32 to move in the direction Z2 (i.e., the upward direction). Accompanying the movement of the movable part 32 in the direction Z2, the pair of the pin end portions 33a and 33b are moved to be close to each other. In this manner, when the pushing force applied to the movable part 32 is released, the bump 4 is sandwiched by the pair of the pin end portions 33a and 33b so that the bump 4 can be electrically connected to the contact pin 33 and be mechanically fixed to the contact pin 33, that is, the semiconductor device 3A or 3B can be fixed on the IC socket 30.

Meanwhile, a depression part is formed at an upper center part of the movable part 32. The inner wall of the depression part is standard surface 35. This standard surface 35 (the inner wall) is formed substantially regardless of the external shape of the semiconductor devices 3A and 3B that are attached to the IC socket 30.

In other words, the standard surface 35 need not have the function of aligning the position of the semiconductor devices 3A and 3B. Accordingly, the formation size or area of the standard surface 35 is larger than the external sizes or areas of the semiconductor devices 3A and 3B. As described later, the standard surface 35 is formed with high accuracy because the standard surface 35 is used for aligning the position where the electronic component attaching tool 20A is attached with high accuracy.

Next, the electronic component attaching tools 20A and 20B will be described. When the electronic component attaching tools 20A and 20B are mounted on the IC socket 30, the electronic component attaching tools 20A and 20B function to align the semiconductor devices 3A and 3B to predetermined attachment positions on the IC socket 30. The predetermined attachment positions may be the positions where the bumps 4 are connected to the contact pins 33. The electronic component attaching tool 20A may be structured to be suitable for the semiconductor device 3A, and the electronic component attaching tool 20B may be structured to be suitable for the semiconductor device 3B.

The electronic component attaching tools 20A and 20B differ from each other in the shapes of vertical surfaces 23B and 25B that have the function of aligning the positions of the semiconductor devices 3A and 3B. Other structures of the electronic component attaching tools 20A and 20B are substantially the same. Accordingly, in the following, only the electronic component attaching tool 20A is described as an example, and the only different structure of the electronic component attaching tool 20B is described.

The electronic component attaching tool 20A includes a main body 21A, an engaging surface 22 (a first structure part) formed on the main body 21A, and a position alignment surface 23 (the above-mentioned second structure part) formed on the main body 21A. Thus, the electronic component attaching tool 20A has very simple structure, so that it is possible to manufacture the electronic component 20A at a low cost.

As one example, the materials for the main body 21A may include resin that has a low thermal expansion rate, high insulation characteristics, and a smooth surface (to be specific, the material for the main body 21A may include fluoroplastics). The shape of the main body 21A viewed from the upper side of the electronic component attaching tool 20A may be approximately the same as the shape of the IC socket 30 viewed from the upper side of the IC socket 30. An opening 26 is formed at the center part of the main body 21A of the electronic component attaching tool 20A. As described later, the semiconductor device 3A or 3B is inserted in the opening 26.

The engaging surface 22 that is the first structure part is formed at the outer surface of the main body 21A. In the state in which the electronic component attaching tool 20A is mounted on the IC socket 30, the engaging surface 22 engages with an engagement surface formed on the IC socket 30.

The position alignment surface 23 that is the second structure part is formed at an inner surface of the opening formed on the main body 21A. According to the first embodiment, the position alignment surface 23 includes an inclination surface 23A and the vertical surface 23B.

The inclination surface 23A guides the insertion of the semiconductor device 3A when the semiconductor device 3A is inserted into the opening 26 of the electronic component attaching tool 20A. The vertical surface 23B aligns the semiconductor device 3A to the predetermined attachment position on the IC socket 30. Accordingly, the shape of a part of the opening 26 that is defined by the vertical surface 23B may be equal to the external shape of the semiconductor device 3A, or may be slightly larger than the external shape of the semiconductor device 3A within the range in which the position alignment of the semiconductor device 3A can be performed, and the semiconductor device 3A can be smoothly inserted into the opening 26 of the electronic component attaching tool 20A.

In the above-described structure of the electronic component attaching tool 20A, the opening 26 has an entrance shape (upper side shape) viewed from the direction of inserting the semiconductor device into the opening 26, the entrance shape being larger than the external shape of the semiconductor device 3A. The opening 26 has an exit shape (lower side shape) whose size is approximately the same as the external size of the semiconductor device 3A. With this structure, at the entrance side of the electronic component attaching tool 20A, the semiconductor device 3A can be easily inserted into the opening 26, and at the exit side of the electronic component attaching tool 20A, the position alignment of the semiconductor device 3A can be firmly performed.

A brim part 24A that extends in a horizontal direction is formed at the entrance side of the electronic component attaching tool 20A from which the semiconductor device 3A is inserted. When the electronic component attaching tool 20A is mounted on the IC socket 30, the brim part 24A is positioned on the upper surface of the movable part 32. Accordingly, at the time of pushing the movable part 32, it is possible to push the movable part 32 via the brim part 24A (the electronic component attaching tool 20A).

On the other hand, also as for the electronic component attaching tool 20B for the semiconductor device 3B, the engaging surface 22 that is the first structure part is formed on the outer surface of the main body 21A of the electronic component attaching tool 20B. The structure of the engaging surface 22 of the electronic component attaching tool 20B is the same as the engaging surface 22 of the electronic component attaching tool 20A. When the electronic component attaching tool 20B is mounted on the IC socket 30, the engaging surface 22 of the electronic component attaching tool 20B engages with the engagement surface formed on the IC socket 30.

The electronic component attaching tool 20B also includes a position alignment surface 25. The position alignment surface 25 that is the second structure part includes an inclination surface 25A and a vertical surface 25B. The inclination surface 25A guides the insertion of the semiconductor device 3B into the electronic component attaching tool 20B. The vertical surface 25B aligns the semiconductor device 3B to a predetermined position on the IC socket 30. An opening 26 is also formed at the center part of the electronic component attaching tool 20B. Therefore, the size of a part of the opening 26 defined by the vertical surface 25B may be equal to the external size of the semiconductor device 3B, or may be slightly larger than the external size of the semiconductor device 3B within the range in which the position alignment of the semiconductor device 3B can be performed, and the semiconductor device 3B can be smoothly inserted into the electronic component attaching tool 20B.

Next, a method of attaching the semiconductor device 3A to the IC socket by using the electronic component attaching tool 20A will be described with reference to FIGS. 5A through 8.

As described above, the movable part 32 can be moved in the direction Z2 to the upper position, and be moved in the direction Z1 to the lower position. FIG. 5A shows the electronic component 20A that is about to be attached to the IC socket 30. In the state shown in FIG. 5A, the movable part 32 of the IC socket 30 is located at the upper position, and the distance between the pair of the pin end portions 33a and 33b is narrow.

FIG. 5B shows the electronic component attaching tool 20A mounted on the IC socket 30. When the electronic component attaching tool 20A is mounted on the IC socket, the electronic component attaching tool 20A is simply placed (or inserted) at the depression part formed on the upper side of the movable part 32. Accordingly, it is possible to easily mount the electronic component attaching tool 20A on the IC socket 30.

When the electronic component attaching tool 20A is mounted on the IC socket, the engaging surface 22 of the electronic component attaching tool 20A contacts with the standard surface 35 (or the engagement surface) of the IC socket 30 so that the position of the electronic component attaching tool 20A to the IC socket can be determined. Furthermore, when the position of the electronic component attaching tool 20A to the IC socket 30 is determined, the attachment position where the semiconductor device 3A can be attached to the IC socket 30 can be automatically determined by the vertical surface 23B of the electronic component attaching tool 20A. In this manner, it is possible to align the electronic component attaching tool 20A to the IC socket 30 with great ease and good operationality.

After the electronic component attaching tool 20A is mounted on the IC socket 30, the brim part 24A is pushed in the direction F of FIG. 6C to move the movable part 32 in the direction Z1. As described above, the pair of pin end portions 33a and 33b of the contact pin 33 are thereby moved in the direction of separating the pin end portions 33a and 33b from each other.

Then, while pushing the brim part 24A, the semiconductor device 3A is inserted into the opening 26 from the upper side of the electronic component attaching tool 20A. In the operation of inserting the semiconductor device 3A into the opening 26, holding of the semiconductor device 3A is released at the position above the opening 26. In this manner, by releasing the holding of the semiconductor device 3A, the semiconductor device 3A drops free toward and in the opening 26.

At this time, the semiconductor device 3A can be easily inserted into the opening 26 because the inclination surface 23A defines a larger opening part at the entrance position of the opening 26. Furthermore, since the inclination surface 23A is continuously connected to the vertical surface 23B, it is possible to smoothly advance the semiconductor device 3A into the opening 26 defined by the vertical surface 23B. In the first embodiment, a moving device for forcibly moving the semiconductor device 3A in the opening 26 of the electronic component attaching tool 20A is not provided, but even the free drop of the semiconductor device 3A enables the semiconductor device 3A to be accurately aligned and attached to the predetermined attachment position.

As described above, the semiconductor device 3A is guided to the attachment position by the electronic component attaching tool 20A, and FIG. 6D shows the semiconductor device 3A attached to the predetermined position. As shown in FIG. 6D, each bump 4 of the semiconductor device 3A is located between the pair of the pin end portions 33a and 33b of the contact pin 33.

When the semiconductor device 3A is attached to the predetermined attachment position of the IC socket 30, the pushing force applied on the brim part 24A is released. As a result, the movable part 32 is moved in the direction Z2 by the elastic restoring force of the springs 34. Accompanying this movement of the movable part 32 in the direction Z2, the distance between the pair of the pin end portions 33a and 33b becomes narrow, so that the pair of the pin end portions 33a and 33b sandwiches the bump 4. In this state, the contact pin 33 is electrically connected to the bump 4, and the semiconductor device 3A is fixed on the IC socket 30.

Figure 7E:
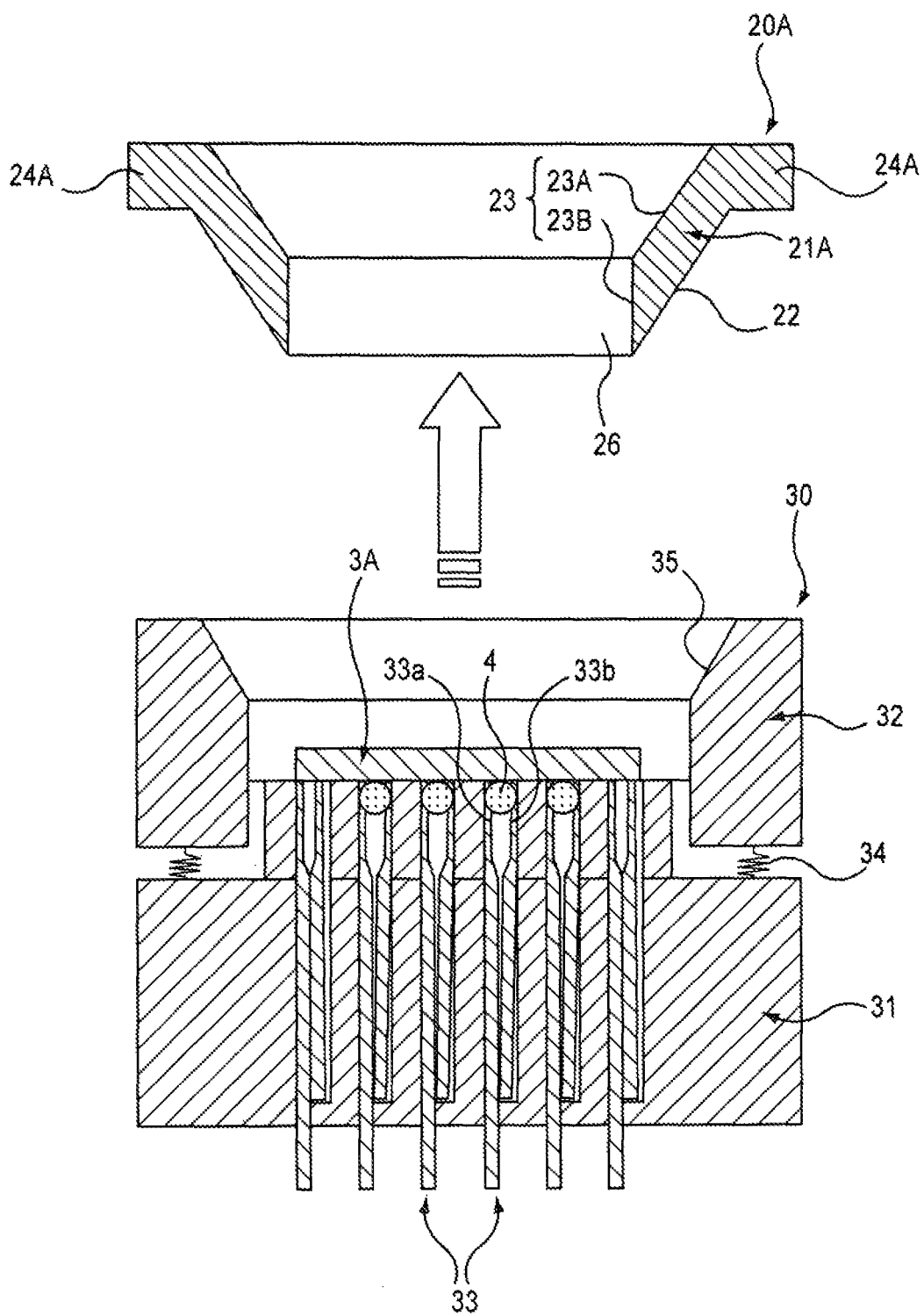
FIG. 7E is an illustration showing the method of aligning and attaching the electronic component to the attachment object by using the electronic component attaching tool shown in FIG. 4.

Next, the electronic component attaching tool 20A is removed from the IC socket 30 as shown in FIG. 7E. When the electronic component attaching tool 20A is removed from the IC socket 30, the semiconductor device 3A is fixed on the IC socket 30. Accordingly, the electronic component attaching tool 20A can be removed from the IC socket 30 without adversely affecting the fixed position of the semiconductor device 3A and the connected condition of the semiconductor device 3A to the IC socket 30. In other words, after the semiconductor device 3A is attached to the IC socket 30, the electronic component attaching tool 20A can be removed from the IC socket 30.

Figure 8:
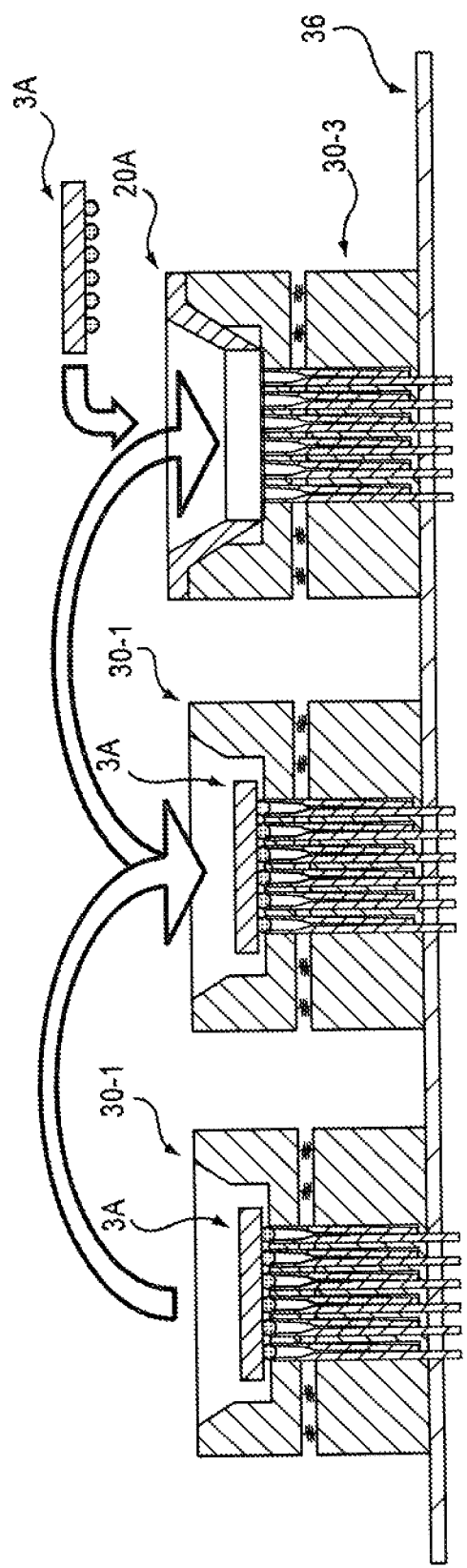
FIG. 8 is an illustration showing the method of aligning and attaching the electronic component to the attachment object by using the electronic component attaching tool shown in FIG. 4.

In this manner, as shown in FIG. 8, even in the case where a plurality of IC sockets (in this example, three IC sockets) that mount the semiconductor devices 3A thereon are provided on a test substrate 36, it is not necessary to prepare three electronic component attaching tools 20A. That is, one electronic component attaching tool 3A enables plural semiconductor devices 3A to be aligned and attached to the plural IC sockets 30-1 through 30-3, respectively.

Next, a method of attaching to the same IC socket 30 the semiconductor devices 3A and 3B whose sizes are different from each other will be described with reference to FIGS. 9A through 9D. FIGS. 9A through 9D show the method of attaching the semiconductor device 3A to the IC socket 30.

Figure 9A:
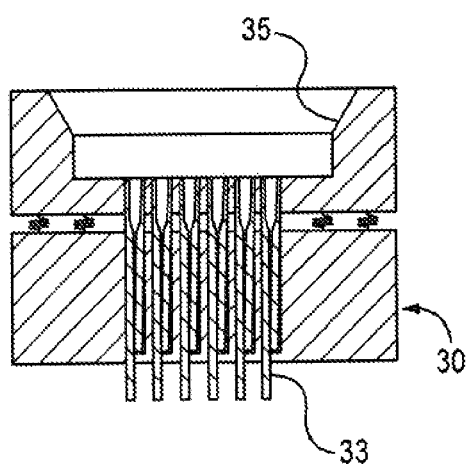
FIGS. 9A through 9D are illustrations showing the method of aligning and attaching the electronic component to the attachment object by using the electronic component attaching tool shown in FIG. 4.
Figure 9B:
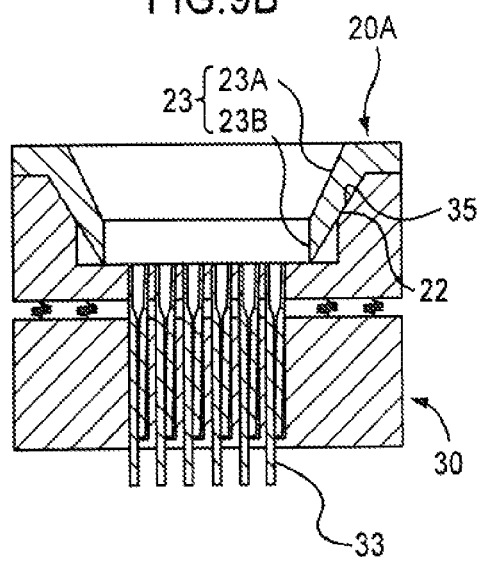
Figure 9C:
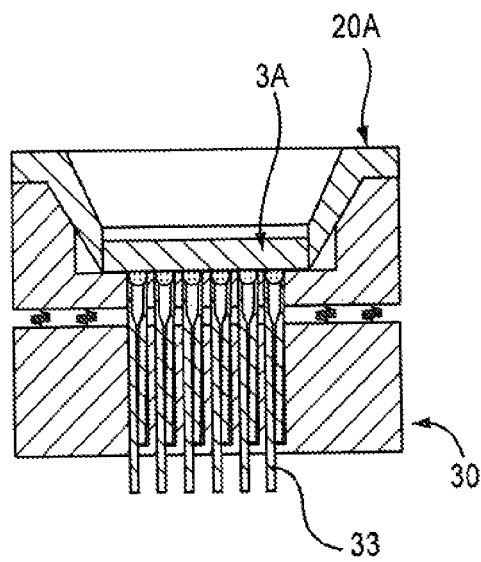
Figure 9D:
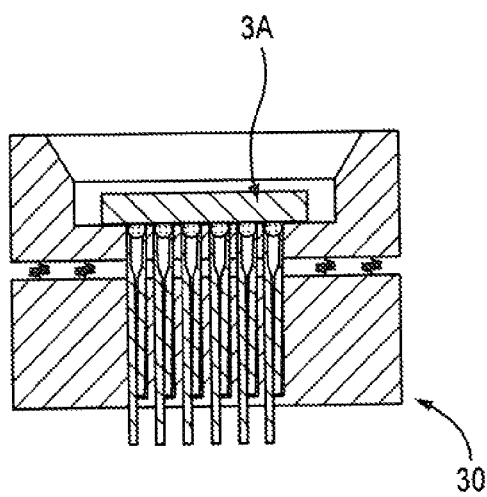

The procedure of this method of attaching the semiconductor device 3A to the IC socket 30 is basically the same as the procedure shown in FIGS. 5A through 7E. In this method, as shown in FIG. 9B, the electronic component attaching tool 20A is mounted on the IC socket 30 of FIG. 9A. Thereafter, as shown in FIG. 9C, the semiconductor device 3A is mounted at the predetermined attachment position of the IC socket 30 by using the electronic component attaching tool 20A. Then, the electronic component attaching tool 20A is removed from the IC socket 30 with the semiconductor device 3A being attached to the IC socket 30.

Figure 10E:
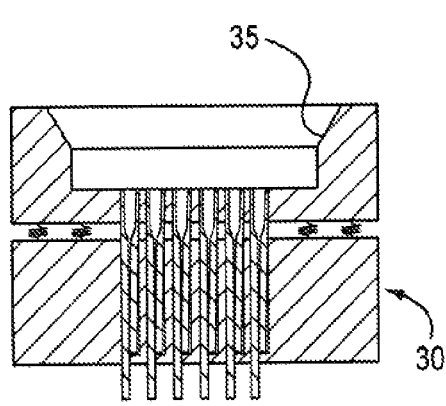
FIGS. 10E through 10H are illustrations showing the method of aligning and attaching the electronic component to the attachment object by using another electronic component attaching tool according to the first embodiment of the present invention.
Figure 10F:
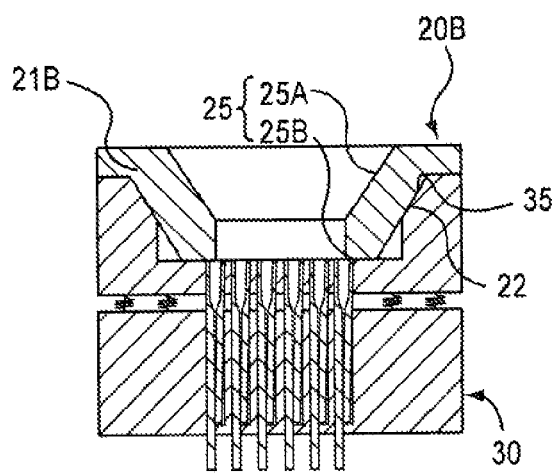

FIG. 10E shows the same IC socket 30 as the above IC socket 30 to which the semiconductor device 3A is attached. As shown in FIG. 10F, when the semiconductor device 3B is attached to the IC socket 30, the electronic component attaching tool 20B that is suitable for the semiconductor device 3B is mounted on the IC socket 30. At this time, the engaging surface 22 of the electronic component attaching tool 20B contact with the standard surface 35 of the IC socket 30.

As described above, the engaging surface 22 formed on the electronic component attaching tool 20B is basically the same as the engaging surface 22 formed on the electronic component attaching tool 20A. The engaging surface 22 of the electronic component, attaching tool 20B engage with the standard surface 35 so that the opening part defined by the vertical surface 25B can be aligned to the position corresponding to the predetermined attachment position where the semiconductor device 3B is attached to the IC socket 30.

Figure 10G:
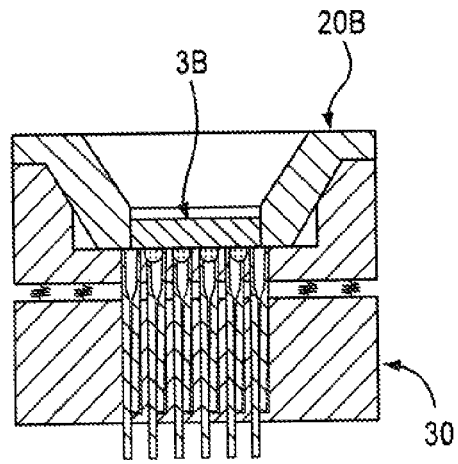
Figure 10H:
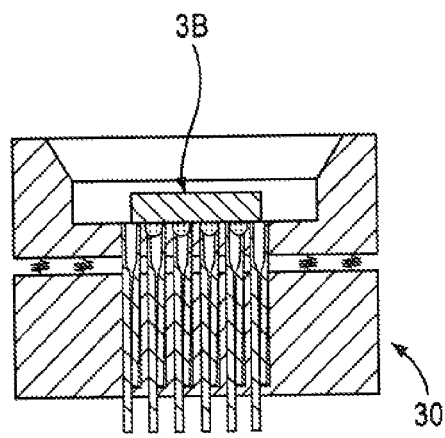

Accordingly, as shown in FIG. 10G, by inserting the semiconductor device 3B into the electronic component attaching tool 20B, the semiconductor device 3B is guided and aligned to the predetermined attachment position of the IC socket 30. Subsequently, when the semiconductor device 3B is electrically and mechanically connected to the IC socket 30, the electronic component attaching tool 20B is removed from the IC socket 30 as shown in FIG. 10H.

According to the first embodiment of the present invention, when the semiconductor devices 3A and 3B (whose sizes or external shapes are different from each other) are attached to the IC sockets, the IC sockets 30 that are suitable for the respective semiconductor devices 3A and 3B need not be prepared. In other words, by only selectively attaching the electronic component attaching tools 20A and 20B to the standard surface 35 (the standard part) formed on the IC socket 30, it is possible to align and attach to the IC sockets 30 the semiconductor devices 3A and 3B having the different external sizes.

Figure 11:
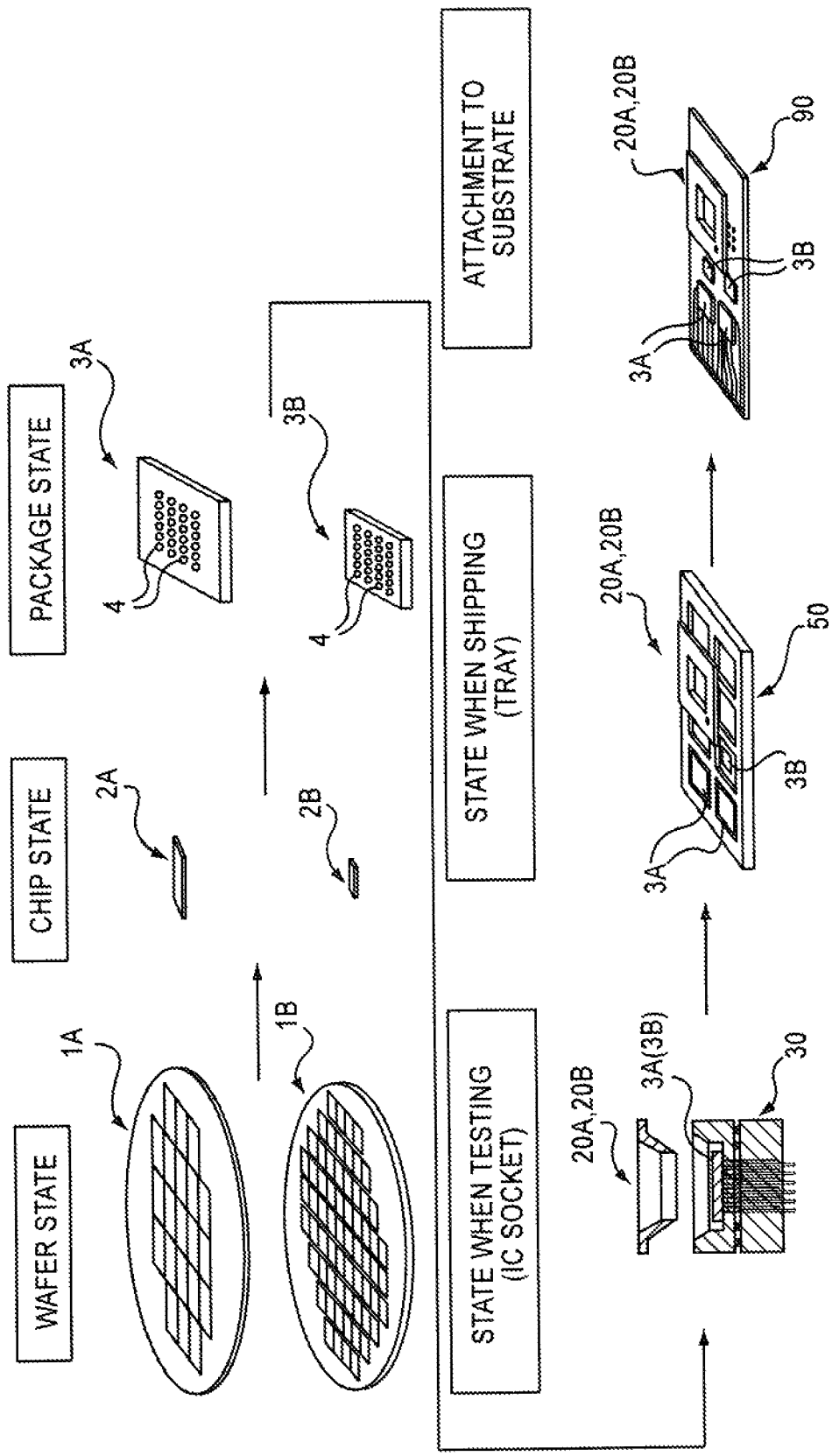
FIG. 11 is an illustration for an advantage achieved by the electronic component attaching tools and the position aligning method according to the first embodiment of the present invention.

Furthermore, when the electronic component to be attached to the IC socket 30 is changed from the semiconductor device 3A to the semiconductor device 3B, the electronic component attaching tool 20A is simply replaced with the electronic component attaching tool 20B, and the design or the like of the IC socket 30 need not be changed. In other words, as shown in FIG. 11, when the semiconductor devices 3A and 3B whose shapes or sizes are different from each other are attached to the IC socket 30, the tray 50, and the attachment substrate 90 that are the attachment objects, the electronic component attaching tools 20A and 20B are replaced with each other in accordance with the semiconductor devices 3A and 3B, and the modification need not be applied to the IC socket 30, the tray 50, and the attachment substrate 90.

Accordingly, when the shape or size of the semiconductor devices 3A and 3B (electronic components) to be attached to the attachment objects 30, 50, and 90 are changed, it is possible to promptly cope with this size change. Therefore, it is possible to firmly cope with the size change or the shape change even when the life cycle of the semiconductor devices 3A and 3B is short. Furthermore, it is possible to improve the serviceability ratio and the throughput by the attachment objects 30, 50, and 90, so that the electronic component attaching tools 20A and 20B of the first embodiment can contribute to the reduction in the manufacturing cost of the semiconductor devices 3A and 3B. In addition, when the size or the shape of the semiconductor devices 3A and 3B are changed, the modification need not be applied to the attachment objects 30, 50, and 90, so that equipment cost caused by the size change or the shape change of the semiconductor devices 3A and 3B can be reduced.

Next, a second embodiment of the present invention will be described.

Figure 12:
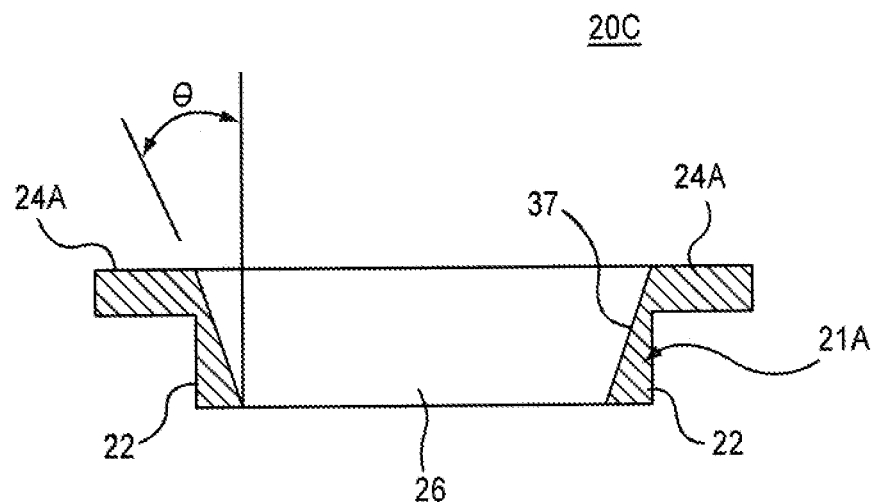
FIG. 12 shows an electronic component attaching tool according to a second embodiment of the present invention.

FIG. 12 shows an electronic component attaching tool 20C according to the second embodiment of the present invention. In the following, the same reference numbers are attached to the elements having the same structures as those shown in FIGS. 4 through 11, and the overlapping description of the same structures are omitted.

In the first embodiment, the position alignment surfaces 23 and 25 of the electronic component attaching tools 20A and 20B include the inclination surfaces 23A and 25A, and the vertical surfaces 23B and 25B, respectively. However, when the position alignment surfaces 23 and 25 are formed by the inclination surfaces 23A and 25A, and the vertical surfaces 23B and 25B, respectively, the level difference may be generated between the inclination surfaces 23A and 25A and the vertical surfaces 23B and 25B. Accordingly, the downsized semiconductor device may be caught by this level difference between the inclination surface and the vertical surface, so that there is a possibility that the semiconductor device is not appropriately attached to the IC socket 30.

With the view of the above, according to the second embodiment, there is provided an inclination surface that is formed on the inner surface of the opening and of which slope is continuously formed from the entrance position to the exit position for the electronic component, as shown in FIG. 12. With this structure, there is no level difference on the inclination surface 37 within the range from the entrance position to the exit position. Therefore, the downsized semiconductor device is not caught by the opening 26 when the semiconductor device is inserted into the opening 26. That is, it is possible to securely attach the semiconductor device to the predetermined attachment position of the attachment object (the IC socket 30 and so on).

Next, a third embodiment of the present invention will be described.

Figure 13:
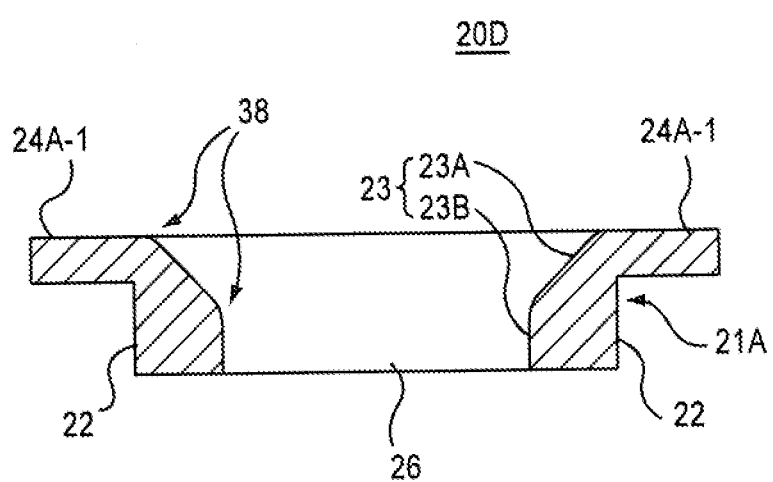
FIG. 13 shows an electronic component attaching tool according to a third embodiment of the present invention.

FIG. 13 shows an electronic component attaching tool 20D according to the third embodiment of the present invention. Similarly to the second embodiment, the electronic component attaching tool 20D also has a position alignment surface 23 that is continuously formed such that there is no level difference within the range from the entrance position to the exit position.

In the second embodiment, as shown in FIG. 12, the inclination surface 37 has the same inclination angle θ throughout the inclination surface 37. Meanwhile, according to the third embodiment, the inclination surface 37 is basically formed by the inclination surface 23A and the vertical surface 23B, and a curved part 38 is formed at the contact part between an upper surface of the electronic component attaching tool 20D and the inclination surface 23A, and at the contact part between the inclination surface 23A and the vertical surface 23B, as shown in FIG. 13.

With this structure, it is possible to provide the position alignment surface 23 that is continuously formed from the entrance position to the exit position of the opening 26 without the level difference. Accordingly, in the third embodiment, the downsized semiconductor device (the electronic component) is not caught by the opening 26 when the semiconductor device is inserted into the opening 26, and it is possible to firmly attach the semiconductor device to the predetermined attachment position of the attachment objects (the IC socket 30 or the like).

Next, fourth and fifth embodiments of the present invention will be described.

Figure 14:
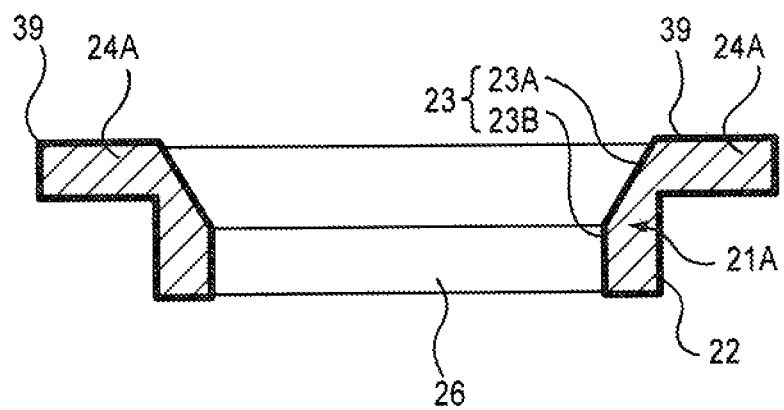
FIG. 14 shows an electronic component attaching tool according to a fourth embodiment of the present invention.
Figure 15:
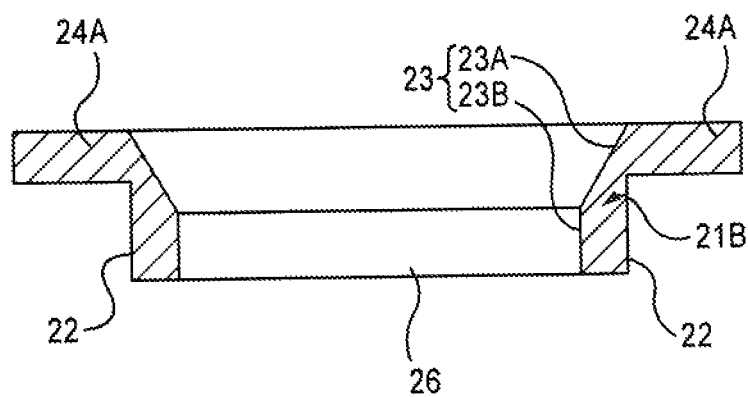
FIG. 15 shows an electronic component attaching tool according to a fifth embodiment of the present invention.

FIG. 14 shows an electronic component attaching tool 20E according to the fourth embodiment of the present invention. FIG. 15 shows an electronic component attaching tool 20F according to the fifth embodiment of the present invention.

The electronic component attaching tool 20E includes a coating film 39 having conductive properties that is formed on the surface of the main body 21A. On the other hand, the electronic component attaching tool 20F includes a main body 21B that is formed by a conductive material. A metal material having high conductive properties and high corrosion-proof properties is preferably used for the coating film 39. As for the main body 21B, a resin material may be made to contain conductive powders or conductive fibers so as to configure the main body 21B. Alternatively, the main body 21B may be formed by a conductive metal.

In these structures, even when static electricity is generated between the semiconductor device (the electronic component) and the electronic component attaching tool 20E or 20F at the time of attaching the semiconductor device to the attachment object, the generated static electricity flows out via the coating film 39 or the main body 21B. Accordingly, it is possible to prevent the semiconductor device from being damaged by the static electricity.

Next, a sixth embodiment of the present invention will be described.

FIG. 16 and FIGS. 17A through 17C show an electronic component attaching tool 20G according to the sixth embodiment of the present invention. In the electronic component attaching tool 20G, a groove part including grooves 40A is formed on the position alignment surface 23 that defines the opening 26. The section of the groove 40A has a rectangular shape in this example. The groove 40A is formed so as to extend in the vertical directions (the directions Z1 and Z2. The grooves 40A are continuously formed from the inclination surface 23A to the vertical surface 23B of the position alignment surface 23.

By forming the grooves 40A on the position alignment surface 23, even when dust or the like adheres to the semiconductor device, the dust adhering to the semiconductor device is made to enter the recession part, i.e., the grooves 40A of the groove part when the semiconductor device is inserted into the opening of the electronic component attaching tool 20G. Accordingly, it is possible to prevent the semiconductor device from being caught at the position alignment surface 23 by the dust that comes in between the semiconductor device and the position alignment surface.

With the electronic component attaching tool 20G, it is possible to firmly attach the semiconductor device to the IC socket 30 or the like (attachment object). Furthermore, since the dust is captured by the electronic component attaching tool 20G, it is also possible to prevent the dust from coming in between the terminal (bump) of the semiconductor device and the contact pin 33 of the IC socket 30, improving the electric connectivity. Furthermore, by forming the groove 40A on the position alignment surface 23, it is possible to decrease a contact area between the position alignment surface and the semiconductor device. In this structure, when the semiconductor device slides on the position alignment surface 23 toward the predetermined attachment position, the friction resistance generated between the semiconductor device and the position alignment surface is reduced. Accordingly, it is possible to prevent the semiconductor device from being caught by the electronic component attaching tool 20G, and to firmly align the semiconductor device to the predetermined attachment position of the IC socket 30.

Figure 16:
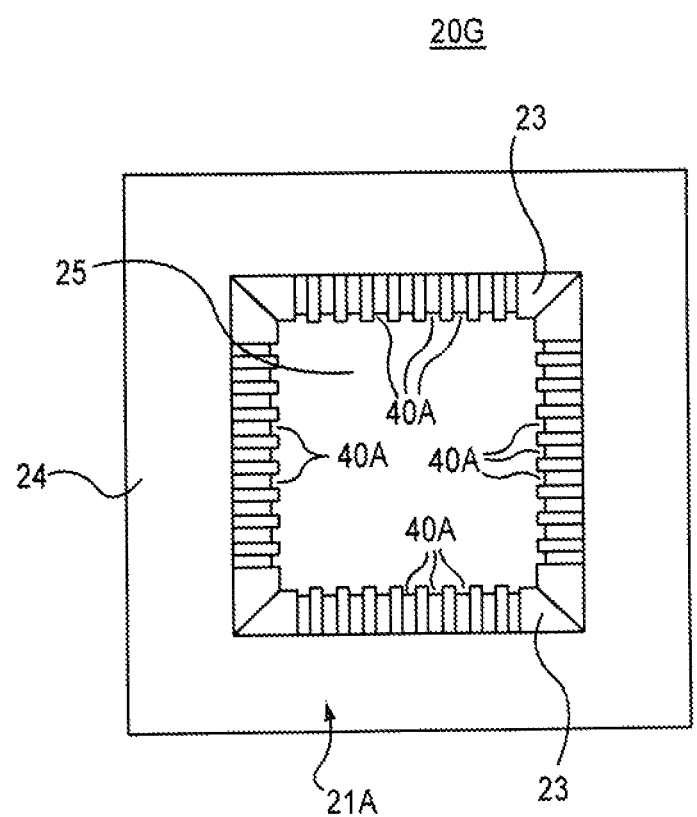
FIG. 16 shows an electronic component attaching tool according to a sixth embodiment of the present invention.
Figure 17A:
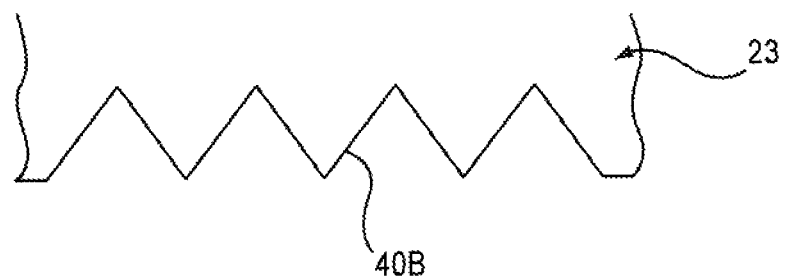
FIGS. 17A through 17C show examples of modifications of grooves according to the sixth embodiment of the present invention.
Figure 17B:
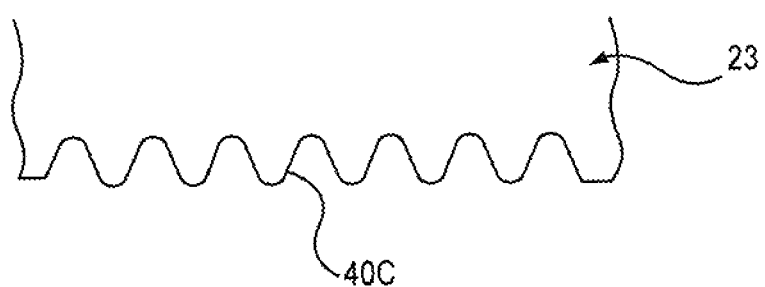
Figure 17C:
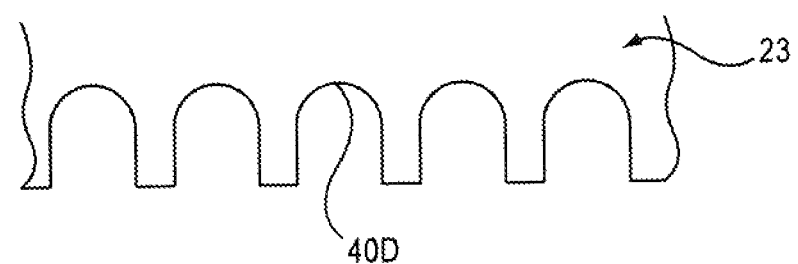

A sectional shape of the groove 40A formed on the position alignment surface 23 is not limited to the rectangular shown in FIG. 16, but may be various shapes shown in FIGS. 17A through 17C, for example. In FIG. 17A, a groove 40B having a triangular sectional shape is formed on the position alignment surface 23. In FIG. 17B, a groove 40C that is wave-shaped in section is formed on the position alignment surface 23. In FIG. 17C, a groove 40D that is U-shaped in section is formed on the position alignment surface 23.

Next, a seventh embodiment of the present invention will be described.

Figure 18:
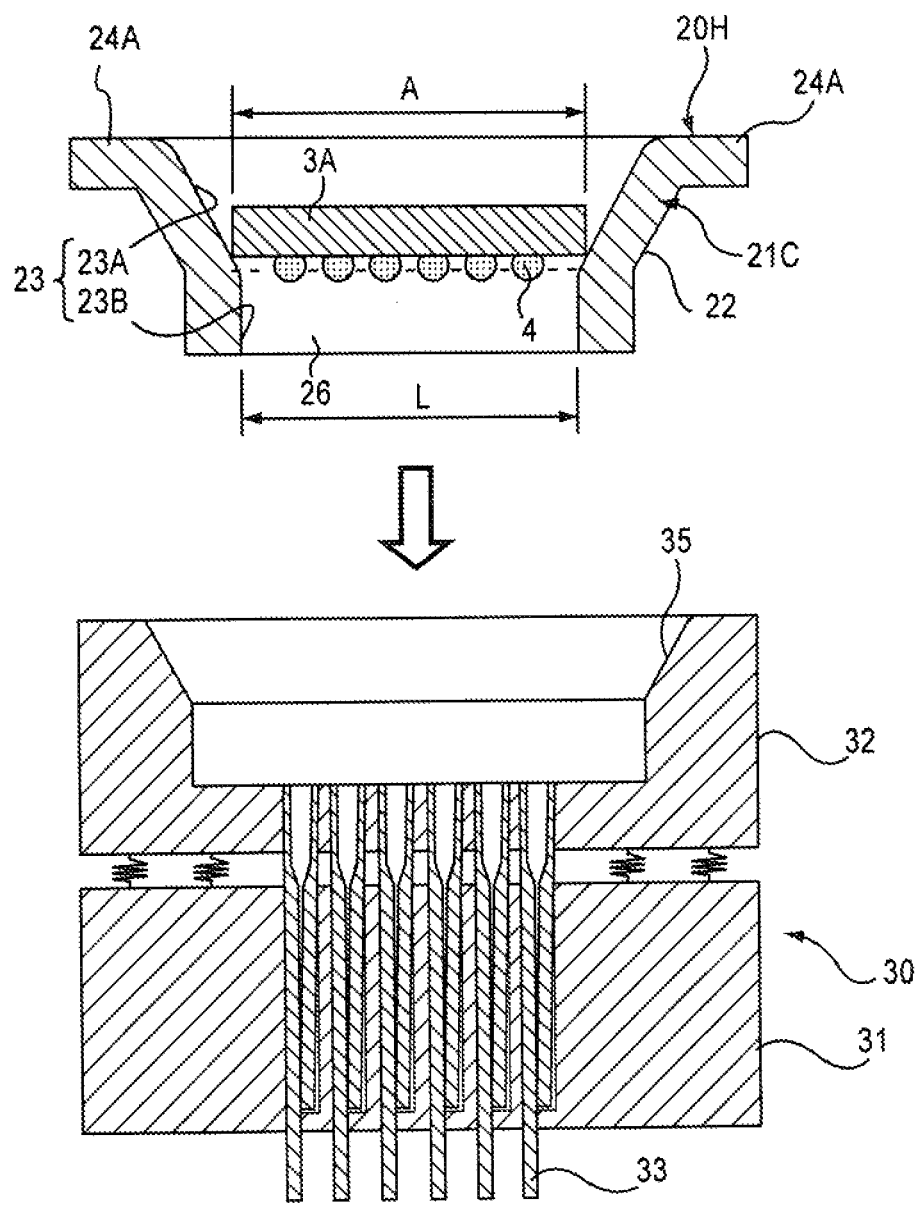
FIG. 18 shows an electronic component attaching tool according to a seventh embodiment of the present invention.
Figure 19:
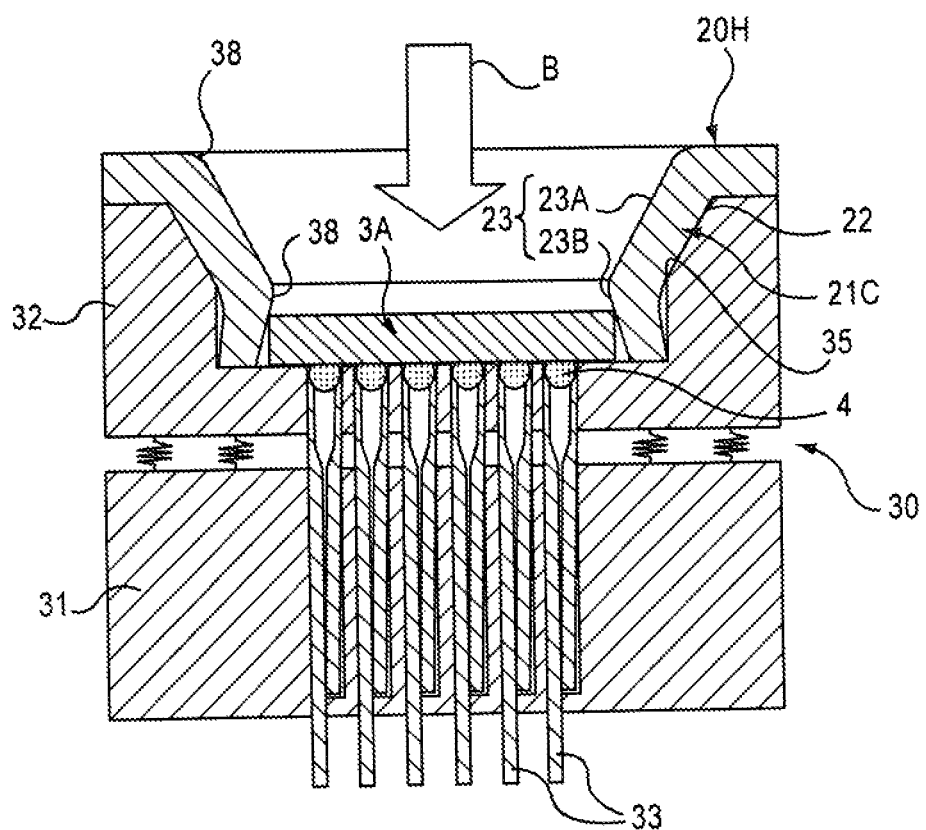
FIG. 19 shows a method of aligning and attaching the electronic component to the attachment object by using the electronic component attaching tool shown in FIG. 18.
Figure 20:
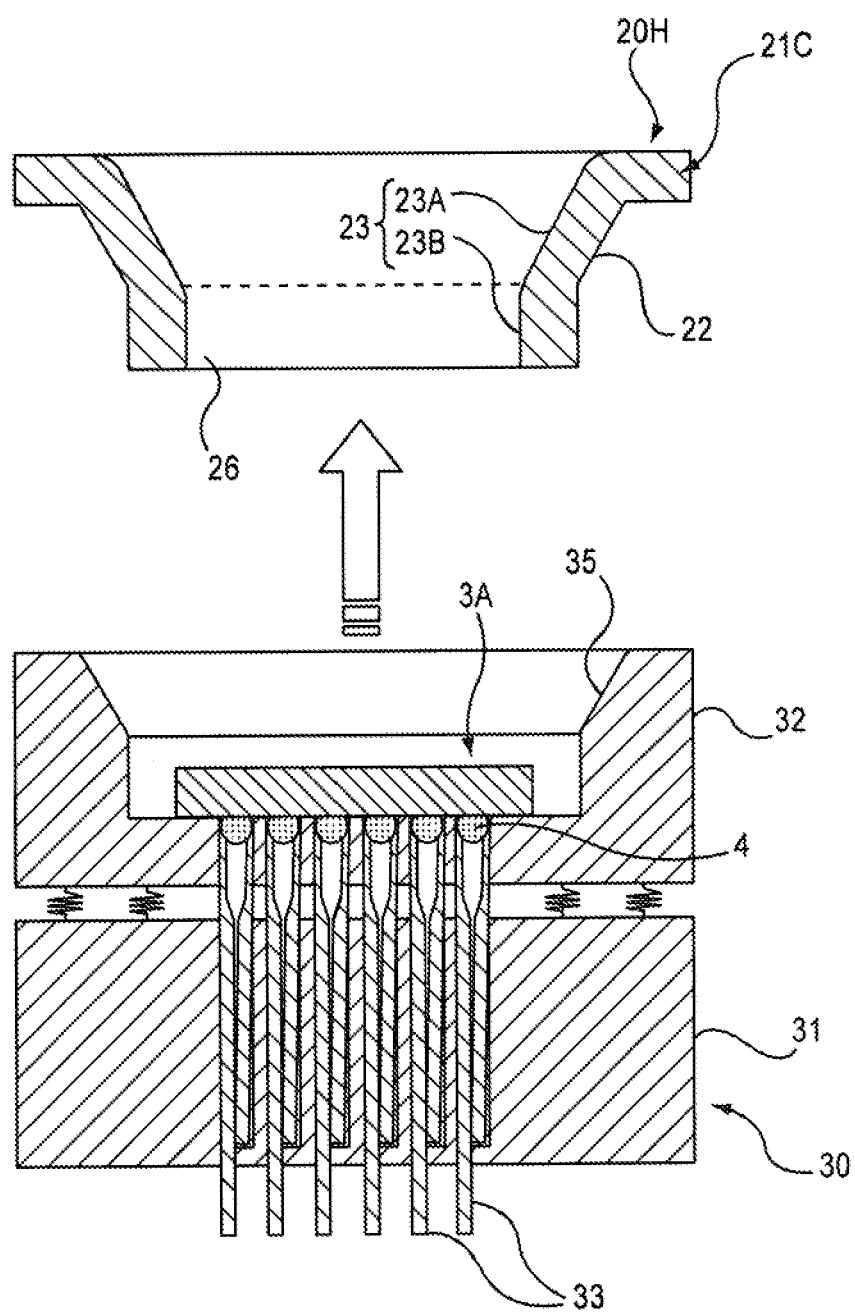
FIG. 20 shows the method of aligning and attaching the electronic component to the attachment object by using the electronic component attaching tool shown in FIG. 18.

FIGS. 18 through 20 are illustrations for an electronic component attaching tool 20H according to the seventh embodiment of the present invention. In the first embodiment through the sixth embodiment, the main bodies 21A and 21B of the electronic component attaching tools 20A through 20G may be formed by materials that are not easily deformed or are not flexible.

Meanwhile, according to the seventh embodiment, a main body 21C of the electronic component attaching tool 20H is made of an elastic material such as rubber. Furthermore, in the seventh embodiment, the size of the opening 26 at the entrance position where the semiconductor device 3A is inserted into the electronic component attaching tool 20H is larger than the external size of the semiconductor device 3A, similarly to the above embodiments. However, in the seventh embodiment, the size of the opening 26 at the exit position for the semiconductor device 3A is smaller than the external size of the semiconductor device 3A. In other words, in the example shown in FIG. 18, the length L of the side of the opening at the exit position is smaller than the length A of the side of the semiconductor device 3A (L<A).

With this structure, when the semiconductor device 3A is inserted into the opening 26 from the upper side of the opening 26, the semiconductor device 3A is engaged and (temporarily) held at the exit position of the opening 26 as shown in FIG. 18 because the size of the opening 26 at the exit position is smaller than the external size of the semiconductor device 3A. In this manner, it is possible to transport the electronic component attaching tool 20H with the semiconductor device 3A being engaged and held by the electronic component attaching tool 20H.

Accordingly, the semiconductor device 3A is engaged (temporarily held) by the electronic component attaching tool 20H in advance, and by keeping this state, the electronic component attaching tool 20H is then mounted on the IC socket 30 (the attachment object) so as to align the semiconductor device 3A. Therefore, at the same time the electronic component attaching tool 20H is mounted on the IC socket 30, the semiconductor device 3A can be attached to the IC socket 30. Accordingly, it is possible to improve the efficiency of aligning the semiconductor device 3A.

In order to attach to the IC socket 30 the semiconductor device 3A that is engaged and held by the electronic component attaching tool 20H, the semiconductor device 3A is pushed toward the IC socket 30 in the direction indicated by the arrow "B" of FIG. 19. The electronic component attaching tool 20H is thereby elastically deformed, so that the semiconductor device 3A held by the electronic component attaching tool 20H is released and attached to the IC socket 30, as shown in FIG. 19.

In the case where the electronic component attaching tool 20H is removed from the IC socket 30 after the semiconductor device 3A is attached to the IC socket 30, the electronic component attaching tool 20H is raised upward as shown in FIG. 20. At this time, the semiconductor device 3A has already been released from the electronic component attaching tool 20H in the downward direction relative to the electronic component attaching tool 20H, so that the semiconductor device 3A can be easily raised upward. The elastic coefficient of the electronic component attaching tool 20H is set in the range within which when the engaging surface 22 of the electronic component attaching tool 20H contacts with the standard surface 35 of the IC socket 30, the position alignment surface 23 enables the semiconductor device 3A to be aligned to the predetermined attachment position of the IC socket 30 with good accuracy.

Next, an eighth embodiment of the present invention will be described.

Figure 21:
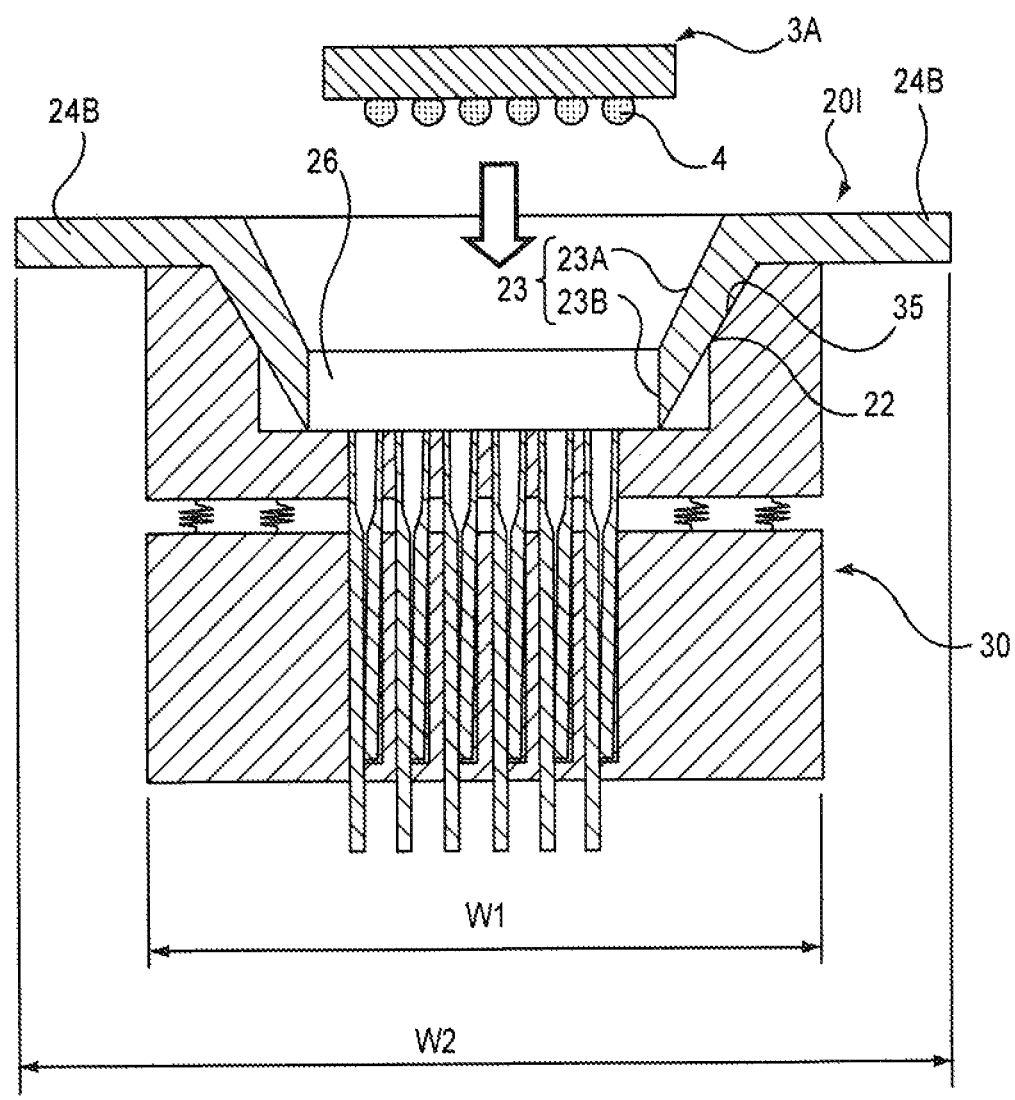
FIG. 21 shows an electronic component attaching tool according to an eighth embodiment of the present invention.

FIG. 21 shows an electronic component attaching tool 20I according to the eighth embodiment of the present invention. In the above-described embodiments, the brim part 24A formed on the electronic component attaching tools 20A through 20H has the shape in the plan view that is approximately the same as the shape in the plan view of the IC socket 30.

On the other hand, in the eighth embodiment, a brim part 24B extends in the side direction (the horizontal direction) to be longer such that the size of the brim part 24B in the plan view is larger than the size of the IC socket in the plan view. In other words, the length W2 of the size of the brim part 24B is larger than the length W1 of one side of the IC socket 30, as shown in FIG. 21 (W2>W1).

With this structure, when the open top type IC socket 30 is operated, the IC socket 30 can be easily operated (the movable part 32 can be easily pushed) because the area of the brim part 24B is wide. Particularly when a plurality of IC sockets 30-1 through 30-3 are arranged so as to be close to each other as shown in FIG. 8, the operability of pushing the small movable part 32 is low. However, by using the electronic component attaching tool 20I having the wide brim part 24B, it is possible to efficiently perform the operation of attaching the semiconductor device 3A to the IC socket even when a plurality of IC sockets 30-1 through 30-3 are close to each other in the arrangement.

Next, a ninth embodiment of the present invention will be described.

FIGS. 22A and 22B show electronic component attaching tools 20J and 20K, respectively according to the ninth embodiment of the present invention. In this embodiment, a position alignment mechanism for aligning the electronic component attaching tools 20J and 20K to the IC socket 30 (the attachment object) is provided.

Specifically, in the example of FIG. 22A, position alignment pins 41A are formed on the electronic component attaching tool 20J, and position alignment holes 42A into which the position alignment pins 41A are respectively inserted are formed on the IC socket 30. On the other hand, in the example of FIG. 22B, position alignment holes 42A are formed on the electronic component attaching tools 20K, and position alignment pins 41A that are inserted into the position alignment hoes 42A, respectively are formed on the IC socket 30.

According to the ninth embodiment, when the electronic component attaching tools 20J and 20K are mounted on the IC socket 30, not only the engaging surface 22 engages with the standard surface 35, but also the positions of the electronic component attaching tools 20J and 20K are aligned to the IC socket 30 by the engagement of the position alignment pins 41A and the position alignment holes 42A. Furthermore, the position alignment of the electronic component attaching tools 20J and 20K to the IC socket 30 can be performed by only inserting the position alignment pins 41A into the position alignment holes 42A. Accordingly, in this embodiment, it is possible to easily align the positions of the electronic component attaching tools 20J and 20K to the IC socket 30 with further high accuracy.

Next, a tenth embodiment of the present invention will be described.

FIGS. 23A through 23C show electronic component attaching tools 20L according to the tenth embodiment of the present invention. In this embodiment, a holding mechanism for holding the semiconductor device 3A is provided on the electronic component attaching tool 20L. The holding mechanisms of FIGS. 23A, 23B, and 23C include protrusion parts 43A, 43B, and 43C, respectively that are formed on the inner surface (the second structure part) of the opening 26 so as to protrude in the inward direction. Each of the protrusion part 43A through 43C is made of an elastic material such as rubber.

A protrusion part 43A shown in FIG. 23A is formed on the electronic component attaching tool 20L so as to engage with the bump 4A of the semiconductor device 3A when the semiconductor device 3A is mounted on the electronic component attaching tool 20L. A protrusion part 43B shown in FIG. 23B is formed on the electronic component attaching tool 20L so as to engage with the lower surface of the package main body of the semiconductor device 3A when the semiconductor device 3A is mounted on the electronic component attaching tool 20L. A protrusion part 43C shown in FIG. 23C is formed on the electronic component attaching tool 20L so as to engage with the outer circumferential surface of the package main body of the semiconductor device 3A when the semiconductor device 3A is mounted on the electronic component attaching tool 20L.

According to the tenth embodiment, by providing the protrusion part 43A, 43B, or 43C to the electronic component attaching tool 20L, it is possible to hold the semiconductor device 3A in the electronic component attaching tool 20L. Therefore, similarly to the electronic component attaching tool 20H of FIG. 18 in the seventh embodiment, the semiconductor device 3A can be held at the position alignment surface 23 of the electronic component attaching tool 20L in advance, and the electronic component attaching tool 20L that holds the semiconductor device 3A can be aligned and attached to the IC socket 30. In this manner, at the same time the electronic component attaching tool 20L is mounted on the IC socket 30, the semiconductor device 3A can be attached to the IC socket 30. Accordingly, it is possible to improve the efficiency of the position alignment operation.

Furthermore, in the tenth embodiment, the holding mechanism is structured so as to include the protrusion part 43A, 43B, or 43C that is provided on the position alignment surface 23 such that the protrusion parts 43A, 43B, or 43C can be elastically deformed. Accordingly, the holding mechanism can be realized by a simple structure. Therefore, the protrusion part 43A, 43B, or 43C is elastically deformed by pushing the semiconductor device 3A in the downward direction so that the semiconductor device 3A held by the protrusion part 43A, 43B, or 43C can be released from the protrusion part 43A, 43B, or 43C. Then, the semiconductor device 3A can get over the protrusion parts 43A, 43B, or 43C, and can be attached to the predetermined attachment position of the IC socket 30. Therefore, the simple operation enables the semiconductor device 3A to be released from the protrusion part 43A, 43B, or 43C and to be attached to the IC socket 30.

Next, an eleventh embodiment of the present invention will be described.

Figure 24A:
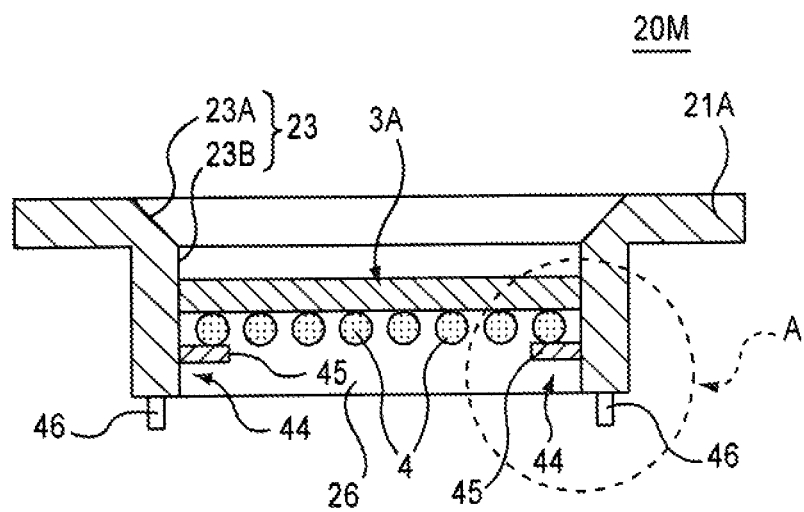
FIGS. 24A and 24B show an electronic component attaching tool and a holding mechanism provided on this electronic component attaching tool according to an eleventh embodiment of the present invention.

FIGS. 24A through 28E show an electronic component attaching tool 20M according to the eleventh embodiment of the present invention. A holding mechanism 44 in this embodiment is shown in FIGS. 24A and 24B. FIG. 24B is an enlarged sectional view of the part of the dashed circle indicated by the arrow A of FIG. 24A.

Figure 24B:
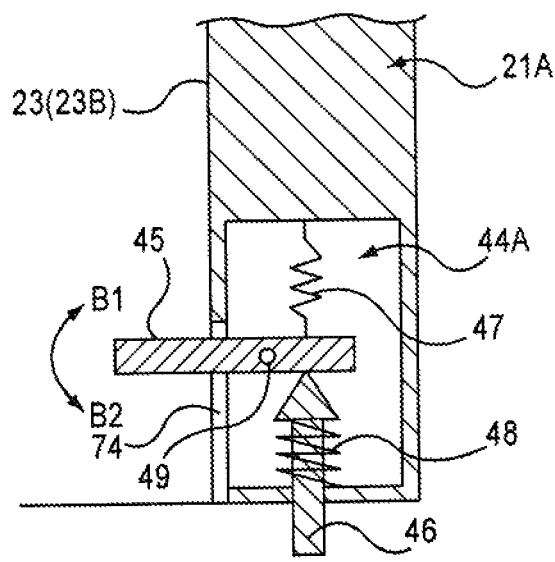

The holding mechanism 44 is provided at the lower part of the main body 21A of the electronic component attaching tool 20M. The holding mechanism 44 includes a holding pin 45 and an operational pin 46. As shown in FIG. 24B, the holding pin 45 can be rotated clockwise (as indicated by the arrow "B1") and counterclockwise (as indicated by the arrow "B2") with a supporting shaft 49 being the center of this rotation. The supporting shaft 49 is provided on the main body 21A. A first spring 47 is provided at the right side in FIG. 24B of the supporting shaft 49 for supporting the holding pin 45, and the first spring 47 gives a spring force that causes the holding pin 45 to rotate clockwise in the direction B1.

On the other hand, a predetermined lower part of the operational pin 46 protrudes from the bottom part of the main body 21A. An upper end part of the operational pin 46 engages with the right part in FIG. 24B of the holding pin 45 with respect to the supporting shaft 49. A second spring 48 shown in FIG. 24B gives a spring force that causes the operational pin 46 to move in the downward direction in FIG. 24B.

With this structure, in a normal state of the holding mechanism 44 where the operational pin 46 is not operated as shown in FIG. 24B, the lower part of the operational pin 46 protrudes from the bottom surface of the main body 21A. Furthermore, when the holding pin 45 rotates clockwise in the direction B1 and is directed horizontally (that is, the holding pin 45 protrudes toward the inside (i.e., the opening 26) of the main body 21A from a window part 74 (position alignment surface 23) formed on the main body 21A, the state of the holding mechanism 44 becomes the normal state.

In the normal state of the holding mechanism 44, when the semiconductor device 3A is inserted into the electronic component attaching tool 20M, the semiconductor device 3A engages with the holding pin 45 that protrudes from the position alignment surface 23, and is held in the electronic component attaching tool 20M. The semiconductor device 3A is thereby prevented from being detached from the electronic component attaching tool 20M.

Figure 25A:
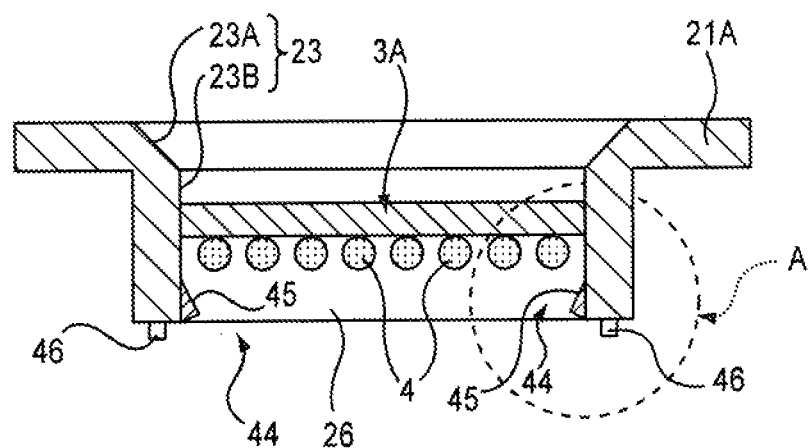
FIGS. 25A and 25B show an operation of the electronic component attaching tool and the holding mechanism shown in FIGS. 24A and 24B.
Figure 25B:
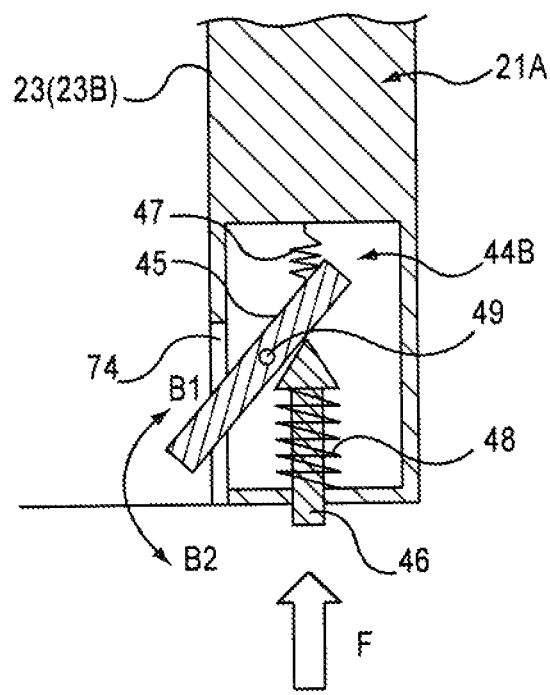

The working of the holding mechanism 44 when the operational pin 48 is moved in the upward direction from the normal state shown in FIGS. 24A and 24B will be described. As shown in FIG. 25B, when an upward force F is applied to the operational pin 46, the operational pin 46 is moved upward against the spring force of the second spring 48. When the operational pin 46 is moved upward, the holding pin 45 that engages with the operational pin 46 is driven to rotate counterclockwise in the direction B2 with the supporting shaft 49 being the center of the rotation. The holding pin 45 is thereby rotated in the direction B2 against the spring force of the first spring 47, and gets into the inside of the window part 74.

Thus, the holding pin 45 comes into the inside of the window part 74, that is, the holding pin 45 is withdrawn to the inner side of the position alignment surface 23 so that the semiconductor device 3A held by the holding pin 45 (the holding mechanism 44) can be released from the holding pin 45, and can be moved downward along the position alignment surface 23.

FIGS. 26A through 28E show a method of attaching the semiconductor device 3A to the IC socket 30 by using the electronic component attaching tool 20M that has the holding mechanism 44. FIG. 26A shows the electronic component attaching tool 20M before the electronic component attaching tool 20M is mounted on the IC socket 30. In the state shown in FIG. 26A, the movable part 32 of the IC socket 30 is located at the upper position (the position to which the movable part 32 is moved in the direction Z2) relative to the fixed part 31, and a width between the pair of the pin end portions 33a and 33b of the contact pin 33 is narrow.

Furthermore, in the state shown in FIG. 26A, the holding mechanism 44 takes the normal state, and the semiconductor device 3A is mounted on the electronic component attaching tool 20M in advance. Since the holding mechanism 44 takes the normal state, the semiconductor device 3A attached to the electronic component attaching tool 20M engages with the holding pin 45, so that the semiconductor device 3A is held by the electronic component attaching tool 20M.

FIG. 26B shows the electronic component attaching tool 20M mounted on the IC socket 30. The electronic component attaching tool 20M can be easily mounted on the IC socket 30 only by attaching or inserting the electronic component attaching tool 20M to the depression part formed at the upper part of the movable part 32. As described above, at this time, the semiconductor device 3A is mounted on the electronic component attaching tool 20M in advance, so that the attachment of the electronic component attaching tool 20M to the IC socket 30, and the attachment of the semiconductor device 3A to the IC socket can be performed simultaneously.

By attaching the electronic component attaching tool 20M to the IC socket 30, the standard surface 35 contacts with the engaging surface 22 so that the position of the electronic component attaching tool 20M can be aligned to the IC socket 30. Furthermore, in the state where the position of the electronic component attaching tool 20M is aligned to the IC socket 30, the position of the semiconductor device 3A can be also aligned to the IC socket 30. Thus, according to the eleventh embodiment, since the position alignment of the electronic component attaching tool 20M to the IC socket 30, and the position alignment of the semiconductor device 3A to the IC socket 30 can be performed simultaneously, it is possible to improve operability and efficiency of attaching the electronic component attaching tool 20M and the semiconductor device 3A to the IC socket 30. In the state shown in FIG. 26B, the operational pin 46 of the holding mechanism 44 has not been operated yet.

Subsequently, as shown in FIG. 27C, when the electronic component attaching tool 20M is mounted on the IC socket 30, the movable part 32 is moved in the direction Z1 by pushing the electronic component attaching tool 20M in the direction indicated by the arrows F. At the side of the fixed part 31, the pair of the pin end portions 33a and 33b are thereby moved in the direction of being separated from each other.

Furthermore, when the movable part 32 is moved in the direction Z1, an upper surface of a contact pin housing 51 contacts against the operational pin 46 provided at the holding mechanism 44 of the electronic component attaching tool 20M so that the operational pin 46 can be moved in the upward direction relative to the movable part 32. Thereby, the holding pin 45 is moved as in the above-described manner. That is, the holding pin 45 is rotated to the position where the holding pin 45 is withdrawn to the inside of the vertical surface 23B. As a result, the holding of the semiconductor device 3A by the holding mechanism 44 is released, and the semiconductor device 3A drops free toward the predetermined attachment position of the IC socket 30 with the semiconductor device 3A being guided by the vertical surface 23B. The timing the holding of the semiconductor device 3A by the electronic component attaching tool 20M is released can be changed by adjusting the timing the operational pin 46 is moved or by adjusting the state of the engagement between the operational pin 46 and the holding pin 45. Accordingly, it is possible to attach the semiconductor device 3A to the IC socket 30 at an arbitrary timing.

FIG. 27D shows the semiconductor device 3A attached to the predetermined attachment position of the IC socket 30. As shown in FIG. 27D, each of the bumps 4 of the semiconductor device 3A is located between the pair of the pin end portions 33a and 33b of the contact pin 33.

As described above, when the semiconductor device 3A is attached to the predetermined attachment position of the IC socket 30, the pushing force applied to the electronic component attaching tool 20M is released. Accordingly, the elastic restoring force of the spring 34 causes the movable part 32 to move in the direction Z2 so that the width between the pair of the pin end portions 33a and 33b can become narrow. As a result, the bump 4 is sandwiched by the pair of the pin end portions 33a and 33b. In this state, the bump 4 is electrically connected to the contact pin 33, and the semiconductor device 3A is fixed to the IC socket 30.

Figure 28E:
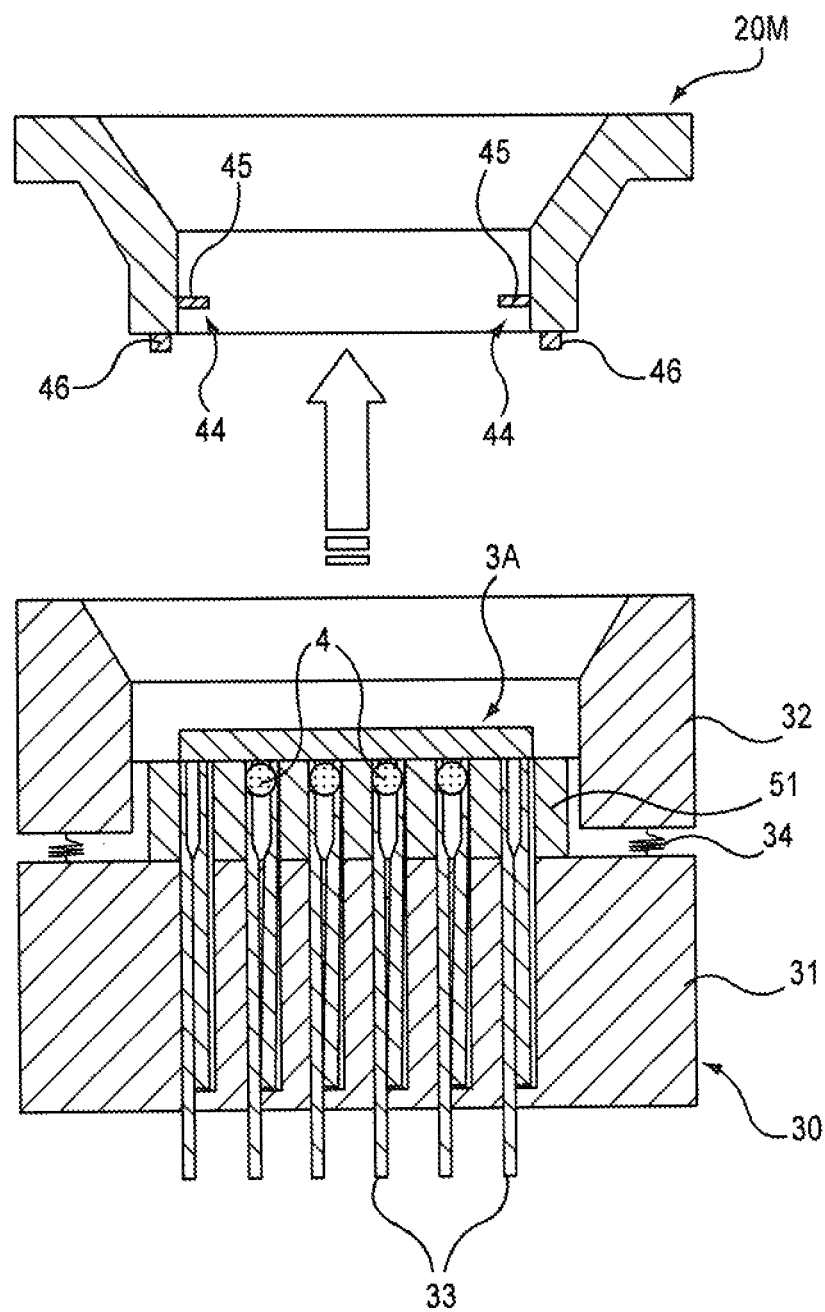
FIG. 28E shows the method of aligning and attaching the electronic component to the attachment object by using the electronic component attaching tool shown in FIGS. 24A and 24B.

Then, as described in FIG. 28E, the electronic component attaching tool 20M is removed from the IC socket 30. Also in this embodiment, at this time, it is possible to remove the electronic component attaching tool 20M from the IC socket 30 without adversely affecting the fixed position of the semiconductor device 3A on the IC socket 30, and the connected condition of the semiconductor device 3A and the IC socket 30. Furthermore, at this time, since the electronic component attaching tool 20M is separated from the IC socket, the holding pin 45 and the operational pin 46 of the holding mechanism 44 move to the original positions, so that the holding mechanism 44 takes the normal state again.

As shown in FIG. 26A, the semiconductor device 3A is attached to the electronic component attaching tool 20M in advance before the electronic component attaching tool 20M is mounted on the IC socket 30. However, the testing of the semiconductor device 3A may be performed before the semiconductor device 3A is attached to the IC socket 30. This testing method will be described with reference FIGS. 29A through 29D.

As shown in FIG. 29A, for example, the semiconductor device 3A is attached to the electronic component attaching tool 20M from a tray 50 so as to be held by the holding mechanism 44. At this time, since the electronic component attaching tool 20M has the opening 26 that penetrates the electronic component attaching tool 20M from the upper side to the lower side thereof, the bumps 4 of the semiconductor device 3A can be seen from the lower side of the electronic component attaching tool 20M in the state in which the semiconductor device 3A is held by the holding pin 45 (the holding mechanism 44).

For this reason, a testing device 52A shown in FIG. 29B is provided for optically testing or inspecting the semiconductor device 3A. The testing device 52A has a CCD camera 53 at the lower part of the testing device 52A. This CCD camera 53 can produce an image of an upper side thereof. An upper part of the testing device 52A is structured so as to mount the electronic component attaching tool 20M on the testing device 52A. Accordingly, by mounting the electronic component attaching tool 20M that holds the semiconductor device 3A on the testing device 52A, it is possible to test the bumps 4 of the semiconductor device 3A.

FIG. 29C shows one example of an image of the semiconductor device 3A produced by the CCD camera 53. The CCD camera 53 is connected to an image recognition processing device. Proper image data (referred to as standard image data) of the semiconductor device 3A having the bumps 4 is stored in the image recognition processing device. The image recognition processing device compares with the standard image data the image data of the tested semiconductor device 3A that is received from the CCD camera 53. In this manner, an abnormal state of the tested semiconductor device 3A is detected.

When there is a defect or damage (in the example shown in FIG. 29C, a loss of the bump 4) on the semiconductor device 3A, the image recognition processing device causes an alarm to ring, for example, in order to make notification about the defect or the damage of the semiconductor device 3A. Accordingly, it is possible to weed out the semiconductor device 3A having the defect or the damage that can be recognized from the appearance thereof, improving the efficiency of the testing.

Figure 30:
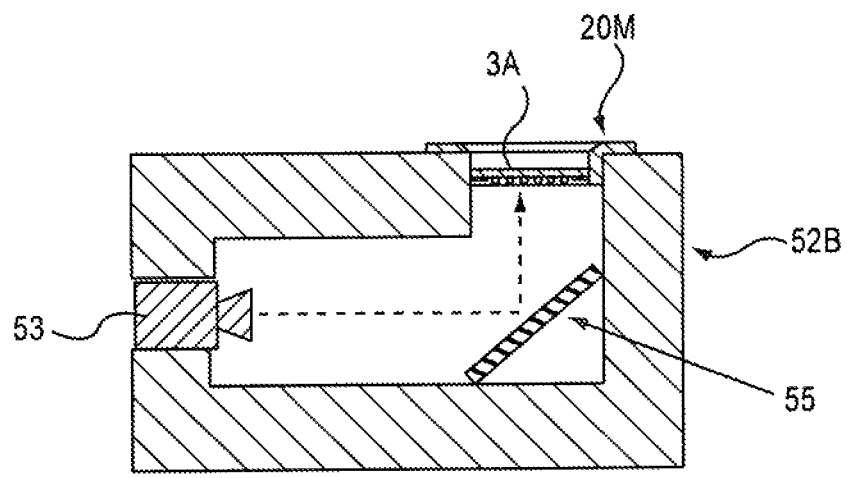
FIG. 30 shows a modification of a testing device that is used for the testing method shown in FIGS. 29A through 29C.

The testing device 52A shown in FIG. 29B is structured such that the CCD camera 53 and the semiconductor device 3A directly face each other. However, it is not always necessary that the CCD camera 53 and the semiconductor device 3A directly face each other, and the arrangement shown in FIG. 30 of the CCD camera 53 and the semiconductor device may be applied. As in an testing device 52B, by providing a mirror 55, it is possible to make the testing device 52B thinner.

Next, a twelfth embodiment of the present invention will be described.

Figure 31:
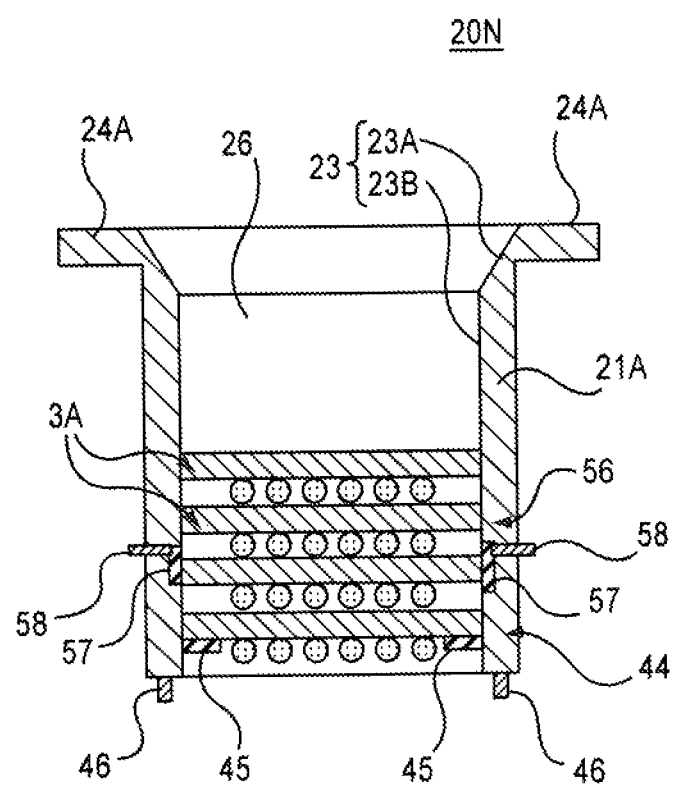
FIG. 31 shows an electronic component attaching tool according to a twelfth embodiment of the present invention.

FIGS. 31 through 32C show an electronic component attaching tool 20N according to the twelfth embodiment of the present invention. In this embodiment, a plurality of semiconductor devices 3A are arranged at the upper side of one another in the main body 21A of the electronic component attaching tool 20N. The electronic component attaching tool 20N having a plurality of the semiconductor devices 3A arranged at the upper side of one another can be mounted on the IC socket 30. Furthermore, in the twelfth embodiment, a first holding mechanism 44 having the substantially same structure as the holding mechanism 44 of the eleventh embodiment, and a second holding mechanism 56 that is different from the first holding mechanism 44 are provided at the electronic component attaching tool 20N.

In the twelfth embodiment, the length of the main body 21A of the electronic component attaching tool 20N is long in the upward and downward directions. Accordingly, as shown in FIG. 31, a plurality of the semiconductor devices 3A can be arranged at the inside of the position alignment surface 23 (the vertical surface 23B). The first holding mechanism 44 is formed at the lower part of the main body 21A. The first holding mechanism 44 holds the semiconductor device 3A that is located at the lowest level out of a plurality of the semiconductor devices 3A arranged in the position alignment surface 23. The structure of the first holding mechanism 44 is the same as that of the holding mechanism 44 of the eleventh embodiment, and a description of the structure of the first holding mechanism 44 is omitted.

The second holding mechanism 56 is provided at the main body 21A, and the arranged position of the second holding mechanism 56 is higher than the arranged position of the first holding mechanism 44. The second holding mechanism 56 includes a pressing contact part 57 (dropping prevention member) and a releasing lever 58 (a releasing member).

In a normal state where the releasing lever 58 is not operated, the pressing contact part 57 engages (or contacts) with and holds the semiconductor device 3A (referred to as the second semiconductor device 3A) whose level is the second lowest out of a plurality of the semiconductor devices 3A attached in the position alignment surface 23. To be specific, the pressing contact part 57 presses the outer circumferential part of the package of the second semiconductor device 3A so as to hold the second semiconductor device 3A in the electronic component attaching tool 20N.

On the other hand, the pressing contact part 57 is connected to the releasing lever 58, and by operating the releasing lever 58, the pressing contact part 57 is moved to release the pressing (engagement) of the second semiconductor device 3A by the pressing contact part 57. When the second semiconductor device 3A is released from the pressing (or the engagement) applied by the pressing contact part 57, the second semiconductor device 3A can move in the main body 21A of the electronic component attaching tool 20N.

A process of attaching the semiconductor device 3A to the IC socket by using the electronic component attaching tool 20N having the above-described structure will be described with reference to FIGS. 32A through 32C. FIG. 32A shows the state before the semiconductor device 3A is attached to the IC socket 30.

When the semiconductor device 3A located at the lowest level is attached to the IC socket 30 from the state shown in FIG. 32A by using the electronic component attaching tool 20N, the same process that is described above with reference to FIGS. 26A through 28D is performed on the electronic component attaching tool 20N.

FIG. 32B shows the state in which the semiconductor device located at the lowest level is attached to the IC socket 30. In this state shown in FIG. 32B, the second semiconductor device 3A is held by the second holding mechanism 56. Accordingly, even when the semiconductor device 3A located at the lowest level is attached to the IC socket 30, the second semiconductor device 3A keeps the original position in the electronic component attaching tool 20N.

Therefore, it is possible to prevent a plurality of the semiconductor devices 3A arranged in the electronic component attaching tool 20N from dropping out from the electronic component attaching tool 20N at the time the lowest semiconductor device 3A is attached to the IC socket 30 by using the electronic component attaching tool 20N. In the state shown in FIG. 32B, the electronic component attaching tool 20N is separated from the IC socket 30, so that the operational pin 46 is also separated from the IC socket 30, and the state of the holding pin 45 returns to the normal state in which the operational pin 45 protrudes in the opening 26.

Subsequently, in the state shown in FIG. 32B, the releasing lever 58 of the second holding mechanism 56 is operated. The second semiconductor device 3A is thereby released from the holding (the pressing) applied by the pressing contact part 57. As a result, the second semiconductor device 3A and a plurality of the semiconductor devices 3A arranged above the second semiconductor device 3A drop free.

At this time, since the state of the holding pin 45 of the first holding mechanism 44 returns to the normal state as described above, the second semiconductor device is held by the first holding mechanism 44, that is, the second semiconductor device 3A becomes the semiconductor device 3A located at the most lowest level. Furthermore, the semiconductor device 3A whose level is the third lowest in FIG. 32A is held by the second holding mechanism 56 to become the second semiconductor device 3A. Thereafter, the above-described process is repeated so that a plurality of the semiconductor devices 3A accommodated in the electronic component attaching tool 20N are attached to the IC sockets 30, respectively.

As described above, according to the electronic component attaching tool 20N of the twelfth embodiment, by adjusting the timing the semiconductor device to be located at the lowest level is held by the first holding mechanism 44, the timing the semiconductor device 3A at the lowest level is released from the holding applied by the first holding mechanism 44, the timing the semiconductor device 3A is held by the second holding mechanism 56, and the timing the second semiconductor device 3A is released from the holding applied by the second holding mechanism 56, it is possible to attach the semiconductor devices 3A to the IC sockets one by one when a plurality of the semiconductor devices 3A are arranged at the upper side of one another in the main body 21A. In this manner, it is possible to improve the efficiency of attaching the semiconductor devices 3A to the IC socket 30 compared with the eleventh embodiment in which one semiconductor device 3A is accommodated in the main body 21A.

In the twelfth embodiment, the second holding mechanism 56 holds only the second semiconductor device 3A. However, the holding target of the second holding mechanism 56 is not limited to the second semiconductor device 3A, and the second holding mechanism 56 may hold a plurality of the semiconductor devices 3A together including the second semiconductor device 3A that are arranged at the upper side of one another in the main body 21A.

Next, a thirteenth embodiment of the present invention will be described.

Figure 33:
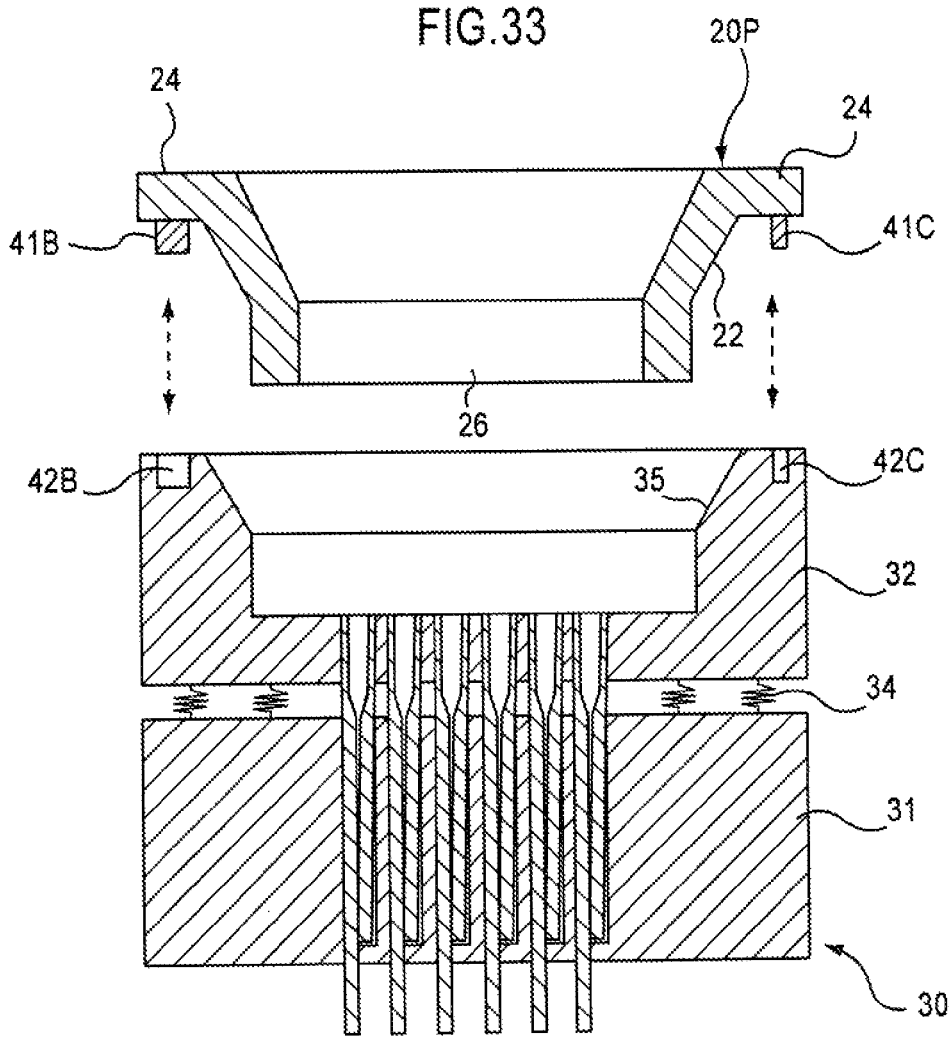
FIG. 33 shows an electronic component attaching tool according to a thirteenth embodiment of the present invention.

FIG. 33 shows an electronic component attaching tool 20P according to the thirteenth embodiment of the present invention. In the thirteenth embodiment, a plurality of position alignment pins 41B and 41C whose sizes are different from each other, and position alignment holes 42B and 42C to which the position alignment pins 41B and 41C are inserted constitute a position alignment mechanism for aligning the position of the electronic component attaching tool 20P to the IC socket 30.

In this embodiment, the position alignment pins 41B and 41C are provided at the electronic component attaching tool 20P, and diameters of the position alignment pins 41B are larger than diameters of the position alignment pins 41C. Accordingly, diameters of the position alignment holes 42B formed on the IC socket 30 are different from diameters of the position alignment holes 42C so as to correspond to the different sizes of the position alignment pins 41B and 41C.

With this simple structure, by only changing sizes or shapes of the position alignment pins 41B and 41C and the position alignment holes 42B and 42C, it is possible to securely align the electronic component attaching tool 20P and the IC socket 30 to each other in the accurate direction of the electronic component attaching tool 20P with respect to the IC socket 30. According to the thirteenth embodiment, the advantage can be obtained particularly when it is difficult to recognize the attachment direction of the semiconductor device 3A having a square shape in the plan view, for example.

Figure 34:
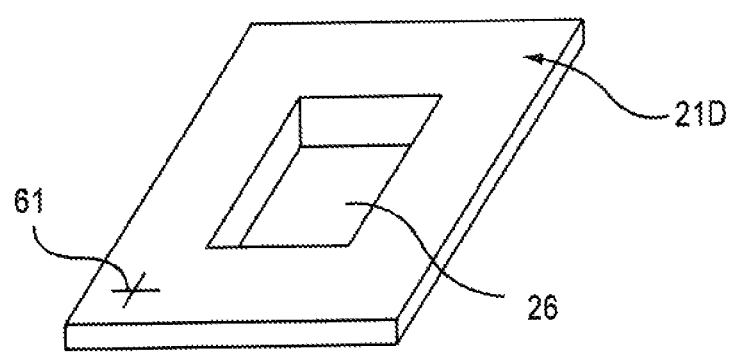
FIG. 34 shows an electronic component attaching tool having a recognition mark.

FIG. 34 shows an electronic component attaching tool 20Q that is a modification of the electronic component attaching tool 20P shown in FIG. 33. In this modification, a recognition mark (index mark) is formed on the upper surface of the main body 21A. Thus, with the simple structure, by forming the recognition mark 61 on the electronic component attaching tool 20Q, it is possible to prevent an error of the attachment of the semiconductor device 3A to the attachment object.

Next, a fourteenth embodiment of the present invention will be described.

Figure 35:
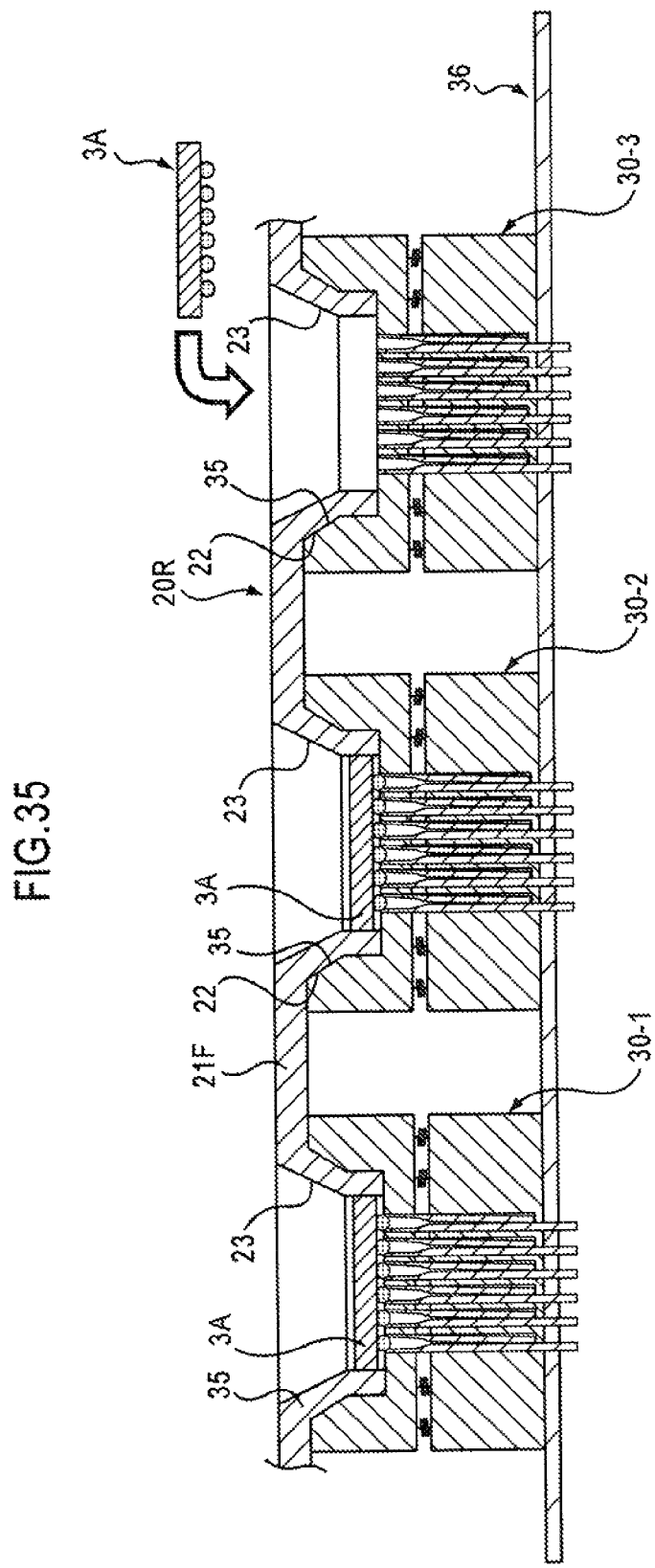
FIG. 35 shows an electronic component attaching tool according to a fourteenth embodiment of the present invention.

FIG. 35 shows an electronic component attaching tool 20R according to the fourteenth embodiment of the present invention. In the electronic component attaching tools 20A through 20N of the above-described embodiments, one position alignment surface 23 is formed on one main body 21A or 21B. Meanwhile, in the fourteenth embodiment, a plurality of position alignment surfaces 23 are formed on one main body 21F of the electronic component attaching tool 20R.

As shown in FIG. 35, the electronic component attaching tool 20R is effective particularly when a plurality of IC sockets 30-1 through 30-3 are provided on a test substrate 36 in advance. In other words, since a plurality of the IC sockets 30-1 through 30-3 are fixed on the test substrate 36, the positions of the standard surfaces 35 are already known, and are not changed.

Accordingly, the electronic component attaching tool 20R having a plurality of the position alignment surfaces 23 that correspond to the IC sockets 30-1 through 30-3, respectively can be formed. With this structure of the electronic component attaching tool 20R, it is possible to align the electronic component attaching tool 20R to a plurality of the IC sockets 30-1 through 30-3 at once.

In the electronic component attaching tools 20A through 20N of the above-described embodiments, when the electronic component attaching tools are attached to a plurality of the IC sockets, the separate alignment processes need to be performed to a plurality of the IC sockets 30-1 through 30-3, respectively. On the other hand, in the fourteenth embodiment, the electronic component attaching tool 20R can be aligned to a plurality of the IC sockets 30-1 through 30-3 at once, so that the attachment process of the electronic component attaching tool 20R to the IC sockets 30-1 through 30-3 can be easily performed.

Next, a fifteenth embodiment of the present invention will be described.

Figure 36A:
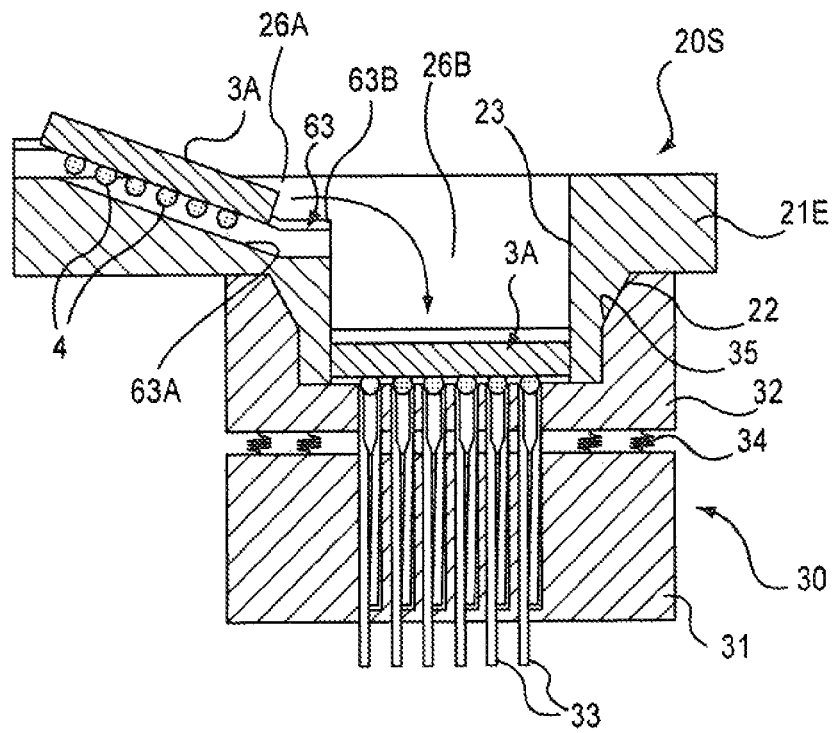
FIGS. 36A through 36C show an electronic component attaching tool according to a fifteenth embodiment of the present invention.
Figure 36B:
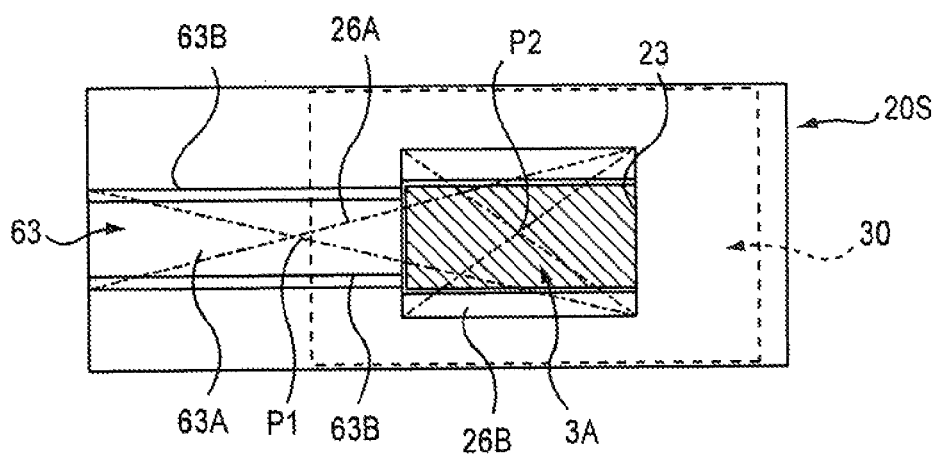
Figure 36C:
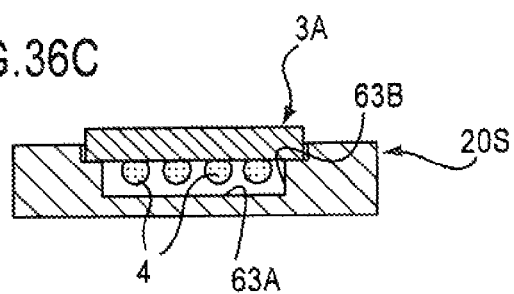

FIGS. 36A through 36C show an electronic component attaching tool 20S according to the fifteenth embodiment of the present invention. In the electronic component attaching tools 20A through 20R of the above-described embodiments, when the semiconductor device 3A is attached to the predetermined attachment position of the IC socket 30, the semiconductor device 3A is inserted into the opening 26 from directly above the opening 26. The opening at the entrance position from which the semiconductor device 3A is inserted into the opening 26 has the substantially same vertical center axis as that of the opening at the exit position (but, the area of the opening 26 at the entrance position is different from the area of the opening 26 at the exit position).

On the other hand, in the electronic component attaching tool 20S of the fifteenth embodiment, a sliding path 63 for sliding the semiconductor device 3A toward the position alignment surface 23 (the second structure part) is provided on a main body 21E of the electronic component attaching tool 20S. In this embodiment, the opening 26 includes an opening part 26A at the entrance position and an opening part 26B at the exit position. The sliding path 63 constitutes a part (the opening part 26A) of the opening 26, so that the vertical center axis P1 of the opening part 26A at the entrance position for the semiconductor device 3A is not aligned to and is separated from the vertical center axis P2 of the opening part 26B at the exit position for the semiconductor device 3A.

The sliding path 63 includes a sliding groove 63A and a guiding part 63B. This sliding path 63 is provided for guiding the semiconductor device 3A to the position alignment surface 23. The guiding groove 63A is structured such that the bumps 4 of the semiconductor device 3A do not contact with the electronic component attaching tool 20S while the semiconductor device 3A is sliding on the sliding path 63.

To be specific, as shown in FIG. 36C, when the semiconductor device 3A engages with the guiding part 63B, a space exists between the sliding groove 63A and the bumps 4. With this structure, the bumps 4 are prevented from being damaged when the semiconductor device 3A is sliding on the sliding path 63. Furthermore, when the semiconductor device 3A is sliding on the sliding path 63, the both ends of the package part of the semiconductor device 3A engages with the level difference part of the guiding part 63B. Accordingly, the semiconductor device 3A can slide on the sliding path 63 with the semiconductor device 3A being guided to the position alignment surface 23 by the sliding path 63.

According to the fifteenth embodiment, since the semiconductor device 3A slides on the sliding path 63 to advance to the position alignment surface 23, it is possible to prevent the semiconductor device 3A from being caught at a part of the electronic component attaching tool 20S before the semiconductor device 3A reaches the position alignment surface 23. In addition, after the semiconductor device 3A slides on the sliding path 63 and then contacts against the position alignment surface 23, the semiconductor device 3A moves to the lower side of the electronic component attaching tool 20S (the movement of the semiconductor device 3A is indicated by the arrow of FIG. 36A). Accordingly, it is possible to improve the accuracy in the position alignment. Therefore, it is possible to securely guide the semiconductor device 3A to the predetermined attachment position on the IC socket 30, and to improve the accuracy in the position alignment of the semiconductor device 3A.

As described above, in the electronic component attaching tool 20S of the fifteenth embodiment, the vertical center axis P1 of the opening part 26A at the entrance position is separated from the vertical center axis P2 of the opening part 26B at the exit position. Accordingly, the long path on which the semiconductor device 3A slides can be secured, so that the semiconductor device 3A can be firmly guided to the position alignment surface 23. In this manner, it is possible to securely align the position of the semiconductor device 3A to the predetermined attachment position of the IC socket 30.

Next, a sixteenth embodiment of the present invention will be described.

FIG. 37 shows the sixteenth embodiment of the present invention. In this embodiment, an attachment handling device 65 is used when the electronic component attaching tool is mounted on the IC socket 30. As one example, in FIG. 37, the electronic component attaching tool 20M of the eleventh embodiment that is described above with reference to FIGS. 24A and 24B is attached to the attachment handling device 65.

An upper end part of the attachment handling device 65 is connected to a rail 67. The attachment handling device 65 can be moved in the directions Z1 and Z2, the directions X1 and X2, and the directions orthogonal to both the directions Z1 and Z2 and the directions X1 and X2 by a driving mechanism (not shown). In other words, the attachment handling device 65 can move three-dimensionally relative to the testing substrate on which the IC socket is arranged.

The attachment handling device 65 includes an attachment/detachment mechanism 66 that attaches the electronic component attaching tool 20M to the attachment handling device 65. With the sixteenth embodiment, the electronic component attaching tool 20M is not limited to the use manner in which the semiconductor device 3A is attached to the IC socket by a manual operation, and the semiconductor device 3A can be automatically attached to the IC socket 3C by using the attachment handling device 65.

As described above, by applying the electronic component attaching tool 20M to the attachment handling device 65, the process of attaching the semiconductor device 3A to the IC socket 30 can be performed at a higher speed, further improving the efficiency in attaching the semiconductor device 3A to the IC socket 30. The electronic component attaching tool 20M is applied to the attachment handling device 65 as one example, but the application to the attachment handling device 65 is not limited to the electronic component attaching tool 20M, and the electronic component attaching tools having the structure different from that of the electronic component attaching tool 20M may be applied to the attachment handling device 65.

In the above-described embodiments, the IC socket 30 is used as the attachment object to which the electronic component attaching tools 20A through 20S are applied. However, the attachment object is not limited to the IC socket 30. In the following, other than the IC socket 30, a tray 50, a tape 80, and an attachment substrate 90, for example, are used as the attachment object to which the electronic component attaching tools 20A through 20S are applied.

FIGS. 38 through 44 show examples in which the electronic component attaching tools are applied to the tray 50. As shown in FIGS. 38 and 39, attachment depression parts 68 for attaching the semiconductor device 3A thereto are formed on the tray 50. For example, this tray 50 is used for accommodating the semiconductor device 3A when the semiconductor device 3A is transported between a plurality of semiconductor manufacturing apparatuses or when the completed semiconductor devices 3A are shipped.

FIG. 38 shows an example in which the electronic component attaching tool 20A of the first embodiment is used when the semiconductor device 3A is attached to an attachment depression part 68 of the tray 50. A standard surface 69 is formed on an inner wall of the attachment depression part 68 of the tray 50. This standard surface 69 corresponds to the standard surface 35 of the IC socket 30. The forming of the standard surface 69 does not substantially depend on the external shapes of the semiconductor devices 3A and 3B to be attached to the tray 50. The position of the electronic component attaching tool 20A is aligned to the tray 50 by making the engaging surface 22 contact with the standard surface 69. The semiconductor device 3A is attached to the position alignment surface 23 of the electronic component attaching tool 20A to attach the semiconductor device 3A to the predetermined attachment position of the tray 50. FIG. 39 show the tray 50 to which two semiconductor devices 3A are attached.

As shown in FIGS. 38 and 39, when the semiconductor device 3A is attached to the attachment depression part 68, a clearance required for attaching the electronic component attaching tool 20A exist around the semiconductor device 3A. Accuracy of this clearance to the standard surface 69 is high, so that this standard surface 69 can be the standard by which the semiconductor device 3A is removed from the tray 50.

In the tray shown in FIG. 40, an adhesive sheet 70 is provided on the bottom part of the attachment depression part 69. Thus, by providing the adhesive sheet 70 to the predetermined attachment position of the tray 50 at which the semiconductor device 3A is attached, it is possible to hold the semiconductor device 3A at the position to which the semiconductor device 3A is aligned by the electronic component attaching tool 20A. Therefore, even when the electronic component attaching tool 20A is removed from the tray 50, or even when the tray 50 is transported after the electronic component attaching tool 20A is removed from the tray 50, the semiconductor device 3A is not moved from this predetermined attachment position.

Furthermore, in the tray 50 shown in FIGS. 41A and 41B, an upper cover 71 can be put on the tray 50. As shown in FIG. 41B, the upper cover 71 includes a plurality of protrusion parts 72. When the upper cover 71 is put on the tray 50, the semiconductor device 3A attached to the attachment depression part 68 is pressed by the protrusion parts 72. With this structure, the semiconductor device 3A is held at the aligned attached position by the upper cover 71, so that it is possible to prevent the semiconductor device 3A from shifting from this aligned attached position.

The tray 50 shown in FIGS. 42A and 42B is suitable for the electronic component attaching tools 20J and 20K of the ninth embodiment shown in FIGS. 22A and 22B, and includes position alignment pins 41D and position alignment holes 42D. With this structure, it is possible to apply the electronic component attaching tools 20J and 20K to this tray 50. Accordingly, the electronic component attaching tools 20J and 20K can be attached to the tray 50 with good accuracy, and therefore, the position of the semiconductor device 3A can be aligned to the attachment position of the tray 50 with good accuracy.

Figure 43:
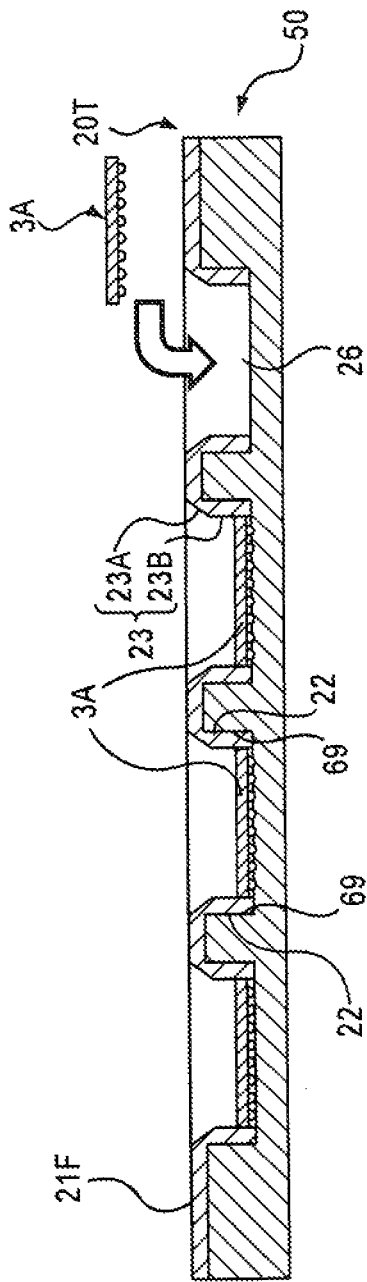
FIG. 43 shows a tray to which the electronic component attaching tool of the fourteenth embodiment of the present invention is applied.

An electronic component attaching tool 20T shown in FIG. 43 corresponds to the electronic component attaching tool 20R of the fourteenth embodiment shown in FIG. 35. A plurality of position alignment surfaces 23 are formed on one main body 21F of the electronic component attaching tool 20T.

Usually, a plurality of attachment depression parts 68 are formed on the tray 50. By using the electronic component attaching tool 20T, it is possible to attach position alignment surfaces 23 to a plurality of attachment depression parts 68 formed on the tray 50, at once. Thereby, it is possible to improve the efficiency of attaching the semiconductor devices 3A to the tray 50.

Further, as shown in FIG. 44, also when the tray 50 is used as the attachment object, the semiconductor device 3A can be automatically attached to the tray 50 by using the attachment handling device 65. Thereby, it is possible to further improve the efficiency of attaching the semiconductor devices 3A to the tray 50.

Figure 46:
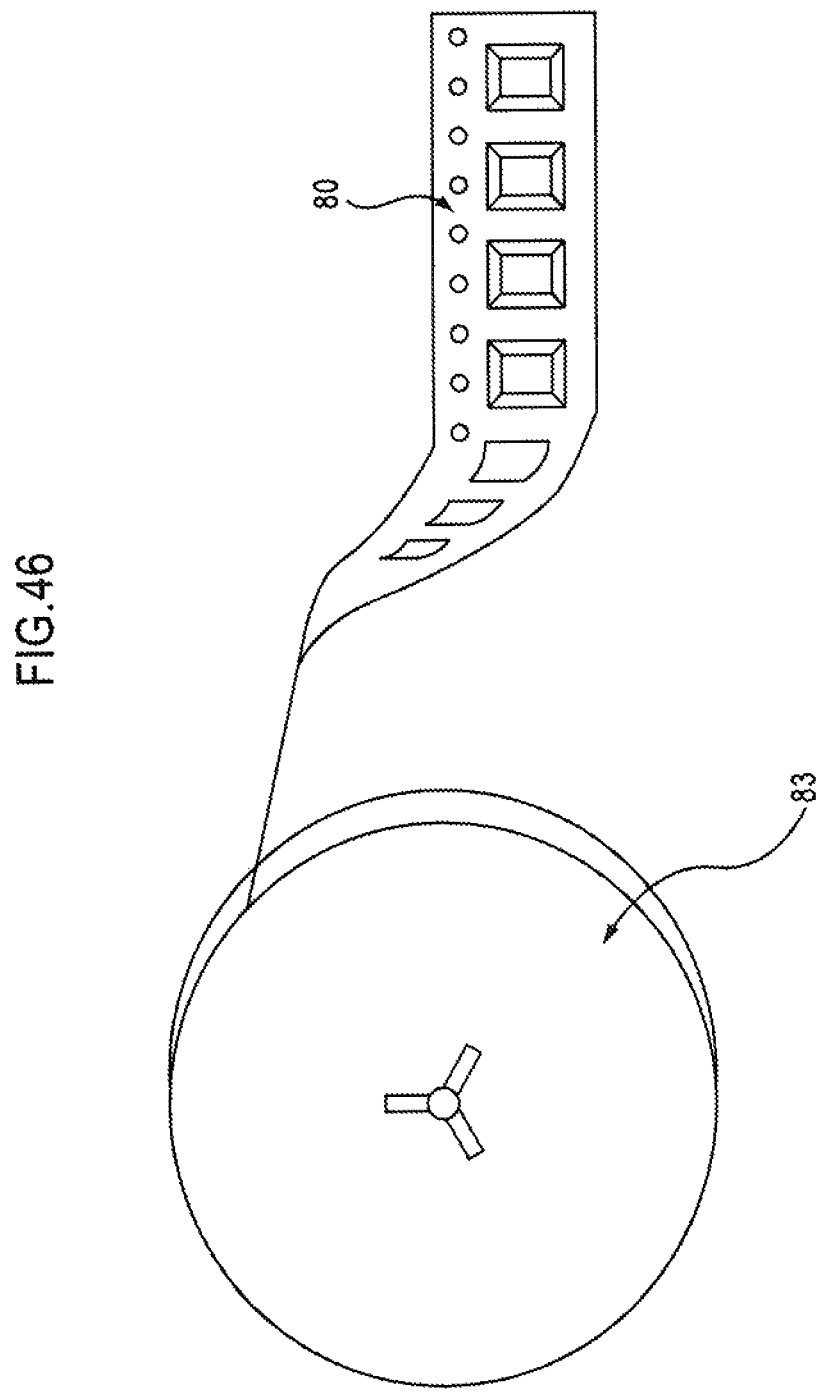
FIG. 46 shows the tape of FIGS. 45A and 45B.

FIGS. 45A through 51 show examples in which the electronic component attaching tool is applied to the tape 80. The tape 80 is used mainly at the time of the shipment of the semiconductor devices 3A. As shown in FIG. 46, the tape 80 is generally wound around a reel 83. As shown in FIGS. 45A and 45B, an attachment depression part 81 for attaching the semiconductor device 3A is formed on the tape 80.

In the example shown in FIGS. 45A and 45B, the semiconductor device 3A is attached to the attachment depression part 81 of the tape 80 by using the electronic component attaching tool 20A of the first embodiment. A standard surface 82 is formed on the inner wall of the attachment depression part 81 of the tape 80. Similarly to the standard surface 35 of the IC socket 30, the forming of the standard surface 82 does not substantially depend on the external shapes of the semiconductor devices 3A and 3B to be attached to the tape 80. By attaching the semiconductor device 3A to the position alignment surface 23 of the electronic component attaching tool 20A, the semiconductor device 3A is attached to the predetermined attachment position of the tape 80.

Also in the example of FIGS. 45A and 45B, a clearance required for attaching the electronic component attaching tool 20A to the attachment depression part 81 exists around the semiconductor device 3A attached to the attachment depression part 81. Accuracy of this clearance to the standard surface 82 is high. Accordingly, when the semiconductor device 3A is removed from the tape 80, the standard surface 82 becomes the standard position for removing the semiconductor device 3A.

In the tape 80 shown in FIGS. 47A and 47B, an adhesive sheet 70 is provided at the bottom of the attachment depression part 81. By providing the adhesive sheet 70 to the position of the tape 80 to which the semiconductor device 3A is aligned, it is possible to hold the semiconductor device 3A at the position where the semiconductor device 3A is aligned by the electronic component attaching tool 20A. Therefore, even when the electronic component attaching tool 20A is removed from the tape 80, or when the semiconductor device 3A is shipped after removing the electronic component attaching tool 20A from the tape 80, the semiconductor device 3A does not move from the aligned attached position on the tape 80.

Moreover, in the tape 80 shown in FIGS. 48A and 48B, an upper cover 84 is put on the tape 80. As shown in FIG. 48B, the upper cover 84 includes a plurality of protrusion parts 85. when the upper cover 84 is put on the tape 80, the protrusion parts 85 press the semiconductor device 3A attached to the attachment depression part 81. With this structure, the semiconductor device 3A can be held at the aligned attached position on the tape 80 by the upper cover 85, so that it is possible to prevent the semiconductor device 3A from moving from the aligned attached position on the tape 80.

The tape 80 shown in FIGS. 49A and 49B is suitable for the electronic component attaching tools 20J and 20K of the ninth embodiment of FIGS. 22A and 22B, and includes position alignment pins 41E and position alignment holes 42E. With this structure, the electronic component attaching tool 20J having the position alignment pins 41A, and the electronic component attaching tool 20K having the position alignment holes 42A can be applied to this tape 80. Accordingly, it is possible to mount the electronic component attaching tools 20J and 20K on the tape 80 with high accuracy, and therefore, the semiconductor device 3A can be attached to the predetermined attachment position on the tape 80 with high accuracy.

An electronic component attaching tool 20U shown in FIGS. 50A and 50B correspond to the fourteenth embodiment shown in FIG. 35. That is, a plurality of position alignment surfaces 23 are formed on one main body 21F of the electronic component attaching tool 20U. Usually, a plurality of attachment depression parts 81 are formed on the tape 80. Accordingly, by using the electronic component attaching tool 20U, it is possible to attach the position alignment surfaces 23 to a plurality of the attachment depression parts 81 formed on the tape 80, at once. Thereby, it is possible to improve the efficiency of attaching the semiconductor devices 3A to the tape 80.

Furthermore, as shown in FIG. 51, also when the tape 80 is used as the attachment object, the semiconductor device 3A can be automatically attached to the tape 80 by using the attachment handling device 65. Thereby, it is possible to further improve the efficiency of attaching the semiconductor device 3A to the tape 80.

Figure 54:
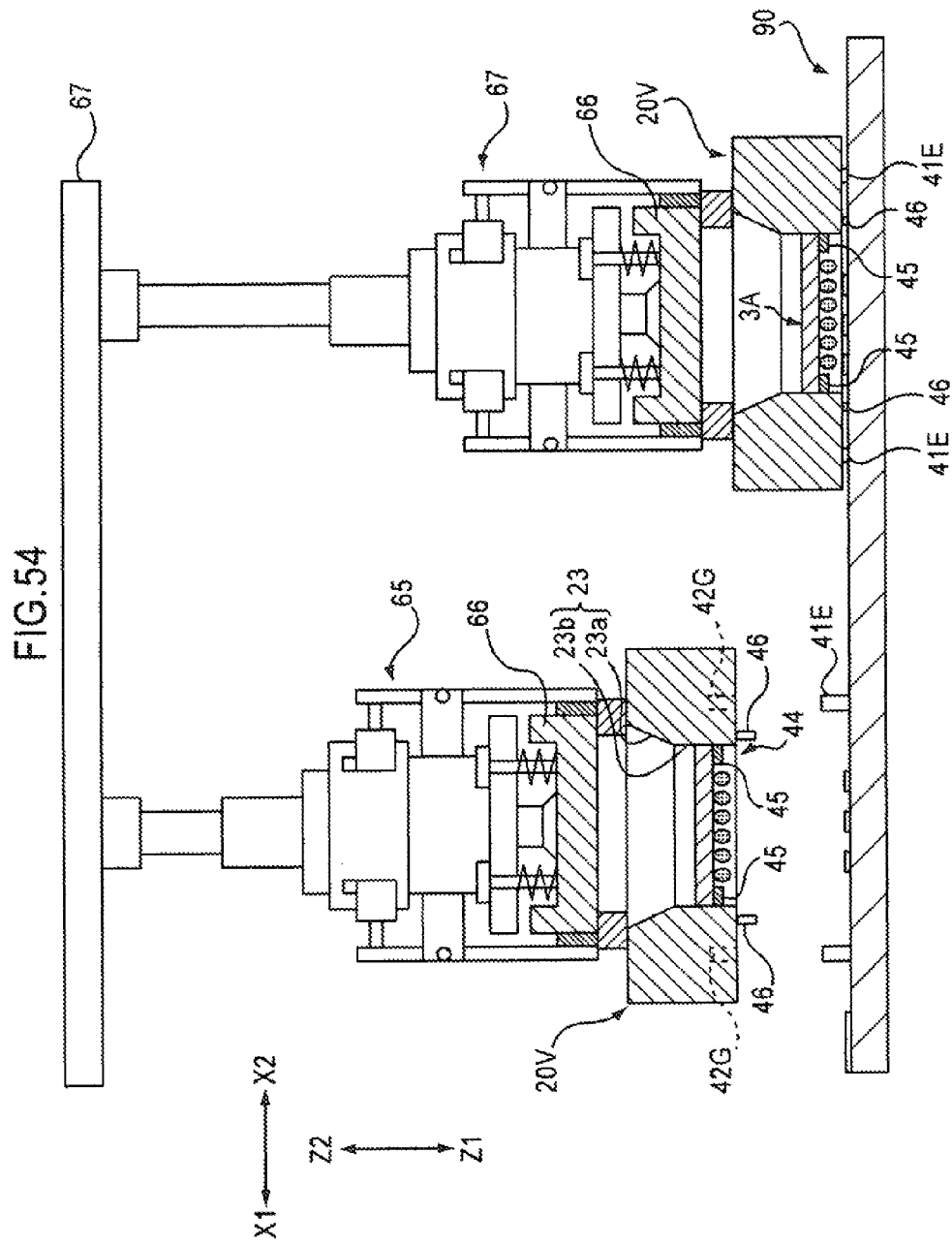
FIG. 54 shows an example in which the sixteenth embodiment of the present invention is applied to an attachment substrate.

FIGS. 52 through 54 show examples in which the electronic component attaching tool is applied to the attachment substrate 90. As shown in FIG. 52, terminals 91, wiring 92, lands 93, and the like are formed on the attachment substrate 90 in advance. When the semiconductor device 3A is attached to the attachment substrate, the lands 93 formed on the attachment substrate 90 are connected to the bumps 4 of the semiconductor device 3A. As described above, the semiconductor device 3A may be the downsized CSP, and the pitch of the bumps 4 may become narrow. In order to certainly connect the bumps 4 to the lands 93, it is necessary to align the position of the semiconductor device 3A to the attachment substrate 90 with high accuracy.

For this reason, as shown in FIG. 53, position alignment pins 41F and position alignment holes 42F are formed on the attachment substrate 90. Similarly to the forming of the standard surface 35 of the IC socket 30, the forming of the position alignment pins 41F and the position alignment holes 42F does not substantially depend on the external shapes of the semiconductor devices 3A and 3B.

By engaging the position alignment pins 41A and the position alignment holes 42A with the position alignment holes 42F and the position alignment pins 41F, the positions of the electronic component attaching tools 20J and 20K are aligned to the attachment substrate 90. Furthermore, the electronic component attaching tools 20J and 20K are used to attach the semiconductor devices 3A to the position alignment surfaces 23 so that the semiconductor devices 3A can be attached to the predetermined attachment positions of the attachment substrate 90. Thereby, it is possible to align the position of the semiconductor device 3A to the attachment substrate 90 with high accuracy.

Further, as shown in FIG. 54, also when the attachment substrate 90 is used as the attachment object, the semiconductor device 3A can be automatically attached to the attachment substrate 90 by using the attachment handling device 65. Thereby, it is possible to further improve the efficiency of attaching the semiconductor device 3A to the attachment substrate 90.

The present invention is not limited to these embodiments, but variations and modifications may be made without departing from the scope of the present invention.

This patent application is based on Japanese priority patent application No. 2002-273676 filed on Sep. 19, 2002, the entire contents of which are hereby incorporated by reference.

What is claimed is:

1. A tray in which an electronic component is attached to a first position of the tray, in combination with an electronic component attaching tool attached to the tray,
   the electronic component attaching tool adapted to attach the electronic component to a second position of an attachment object and comprising:
   a main body including an opening forming part;
   a first structure part this is formed on the main body; and
   a second structure part formed on an inner wall of the opening forming Part of the main body in accordance with an external shape of the electronic component,
   the tray comprising:
   an attachment depression part that includes an inner wall and to which the electronic component is attached, wherein forming of the inner wall of the attachment depression part does not substantially depend on the external shape of the electronic component; and a standard part formed in the inner wall of the attachment depression part and engaging with the first structure part of the electronic component attaching tool to align a position of the electronic component attaching tool to the standard part when a position of the electronic component is aligned to the first position of the tray using the electronic component attaching tool, the standard part having a shape which does not substantially depend on the external shape of the electronic component.

2. The tray according to claim 1, wherein the inner wall of the electronic component attaching tool includes an inclination surface which is formed so that an inner diameter increases as a position in the inclination surface is close to the second structure part, and the inclination surface guides attaching of the electronic component to the second position of the attachment object.

3. The tray according to claim 1, further comprising an adhesive sheet formed on a bottom part of the attachment depression part.

* * * * *